US00RE41468E

(19) United States
(12) Reissued Patent
Tanaka et al.

(10) Patent Number: US RE41,468 E
(45) Date of Reissued Patent: Aug. 3, 2010

(54) MULTI-STATE EEPROM HAVING WRITE-VERIFY CONTROL CIRCUIT

(75) Inventors: Tomoharu Tanaka, Yokohama (JP); Gertjan Hemink, Kawasaki (JP)

(73) Assignee: Kabushiki Kaisha Toshiba, Kawasaki-shi (JP)

(21) Appl. No.: 11/451,591

(22) Filed: Jun. 13, 2006

Related U.S. Patent Documents

Reissue of:
(64) Patent No.: 5,570,315
Issued: Oct. 29, 1996
Appl. No.: 08/308,534
Filed: Sep. 21, 1994

U.S. Applications:
(

(62) Division of application No. 09/134,897, filed on Aug. 17, 1998.

(30) Foreign Application Priority Data

Sep. 21, 1993 (JP) ..... 5-234767
Dec. 13, 1993 (JP) ..... 5-311732

(51) Int. Cl.
*G11C 16/04* (2006.01)

(52) U.S. Cl. ..... 365/185.22; 365/185.17; 365/185.03; 365/185.18; 365/185.21; 365/185.12

(58) Field of Classification Search ..... 365/185.03, 365/185.17, 185.22, 185.12, 185.18, 185.21
See application file for complete search history.

(56) References Cited

U.S. PATENT DOCUMENTS 4,279,024 A 7/1981 Schrenk
5,168,465 A 12/1992 Harari
5,172,338 A 12/1992 Mehrotra et al.
5,218,569 A 6/1993 Banks
5,321,699 A 6/1994 Endoh et al.
5,394,362 A 2/1995 Banks
5,398,203 A * 3/1995 Prickett, Jr. ..... 365/185.02
5,521,865 A 5/1996 Ohuchi et al.
5,652,719 A 7/1997 Tanaka et al.
5,781,478 A 7/1998 Takeuchi et al.
5,920,507 A 7/1999 Takeuchi et al.
5,978,308 A * 11/1999 Kato ..... 365/230.06
6,069,823 A 5/2000 Takeuchi et al.
6,147,911 A 11/2000 Takeuchi et al.

FOREIGN PATENT DOCUMENTS

| | | |
|---|---|---|
| DE | 42 32 025 | 4/1993 |
| JP | 58-86777 | 5/1983 |
| JP | 62-257699 | 11/1987 |
| JP | 1-23878 | 5/1989 |
| JP | 1-46949 | 10/1989 |
| JP | 2-232900 | 9/1990 |
| JP | 2-260298 | 10/1990 |
| JP | 3-59886 | 3/1991 |
| JP | 3-237692 | 10/1991 |
| JP | 3-286497 | 12/1991 |
| JP | 4-88671 | 3/1992 |
| JP | 4-119594 | 4/1992 |
| JP | 4-254994 | 9/1992 |
| JP | 4-507320 | 12/1992 |
| JP | 5-6681 | 1/1993 |
| JP | 5-144277 | 6/1993 |
| JP | 5-182476 | 7/1993 |
| JP | 5-60199 | 9/1993 |
| JP | 2007-184102 | 7/2007 |
| JP | 2007-184103 | 7/2007 |

OTHER PUBLICATIONS

F. Masuoka, Kabushiki–Kaisha Science Forum, pp. 186–190, "Flash Memory Technology Handbook" Aug. 15, 1993.

* cited by examiner

*Primary Examiner*—Andrew Q Tran
(74) *Attorney, Agent, or Firm*—Oblon, Spivak, McClelland, Maier & Neustadt, L.L.P.

(57) ABSTRACT

An EEPROM having a memory cell array in which electrically programmable memory cells are arranged in a matrix and each of the memory cells has three storage states, includes a plurality of data circuits for temporarily storing data for controlling write operation states of the plurality of memory cells, a write circuit for performing a write operation in accordance with the contents of the data circuits respectively corresponding to the memory cells, a write verify circuit for confirming states of the memory cells set upon the write operation, and a data updating circuit for updating the contents of the data circuits such that a rewrite operation is performed to only a memory cell, in which data is not sufficiently written, on the basis on the contents of the data circuits and the states of the memory cells set upon the write operation. A write operation, a write verify operation, and a data circuit content updating operation based on the contents of the data circuits are repeatedly performed until the memory cells are set in predetermined written states.

7 Claims, 30 Drawing Sheets

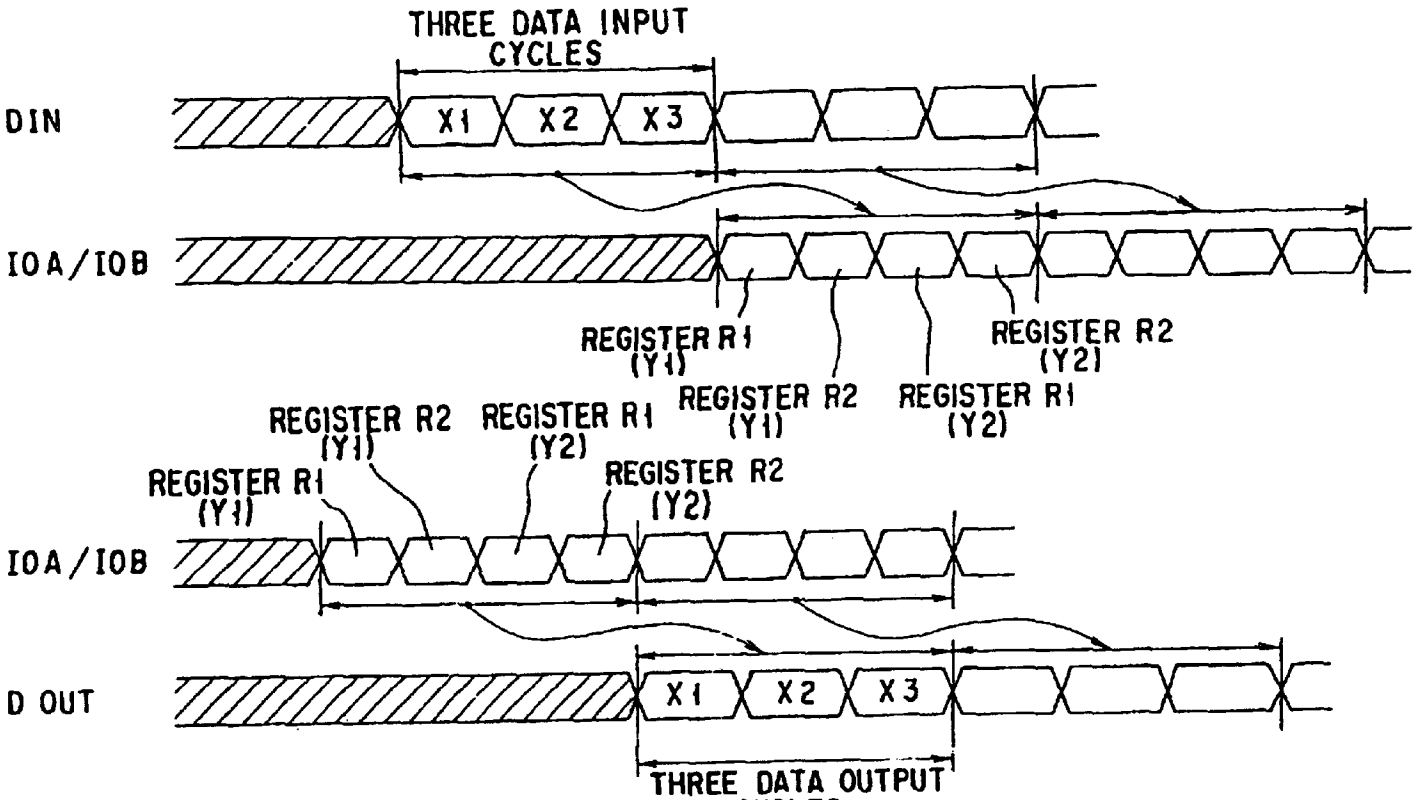
FIG. 7A
FIG. 7B
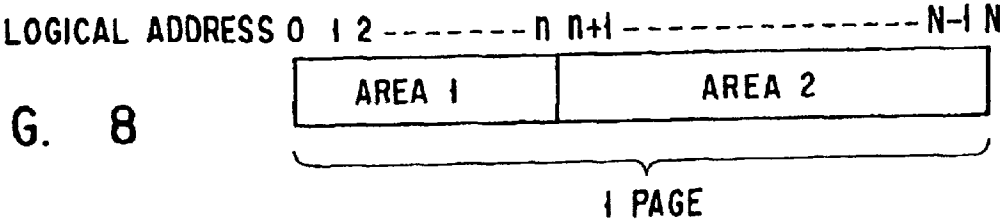
FIG. 8

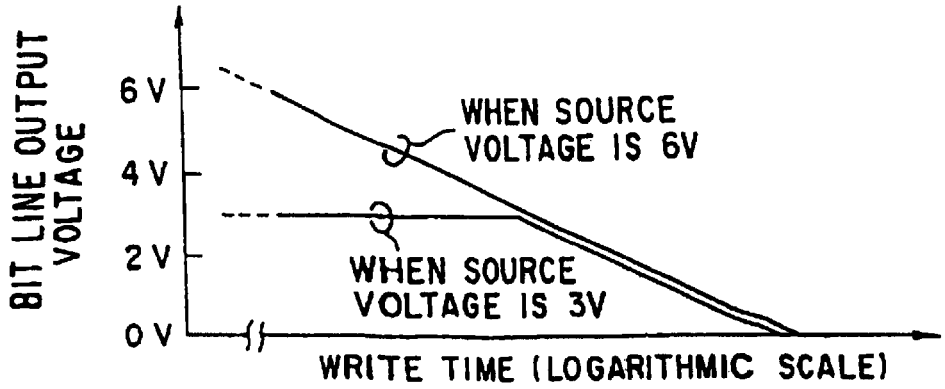
FIG. 23
*(AMENDED)*

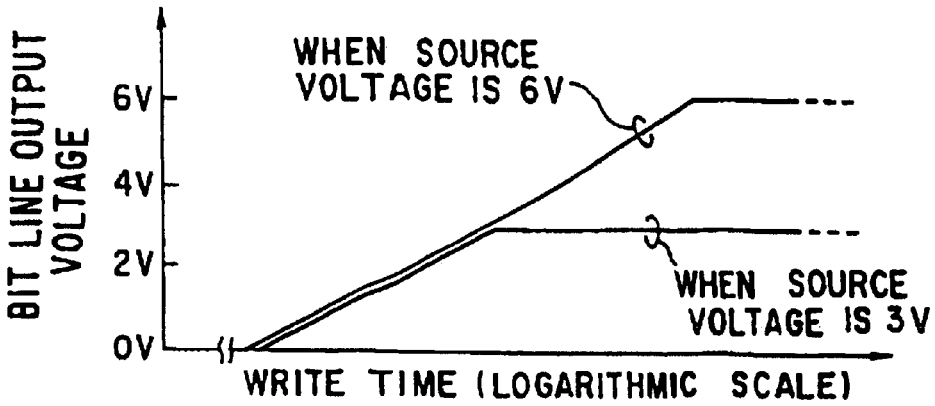
FIG. 29
*(AMENDED)*
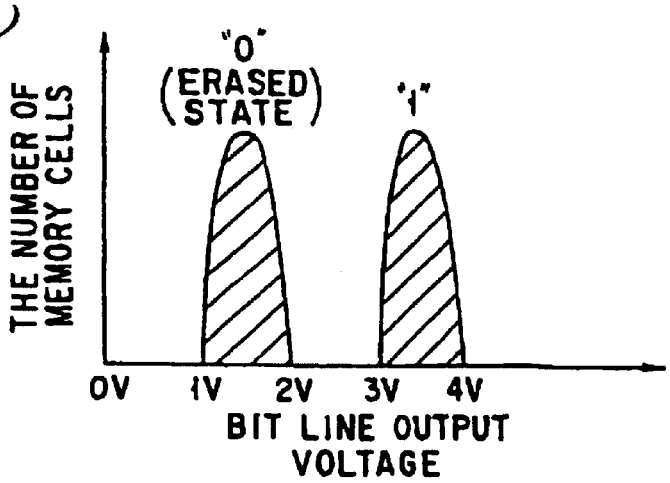
FIG. 30
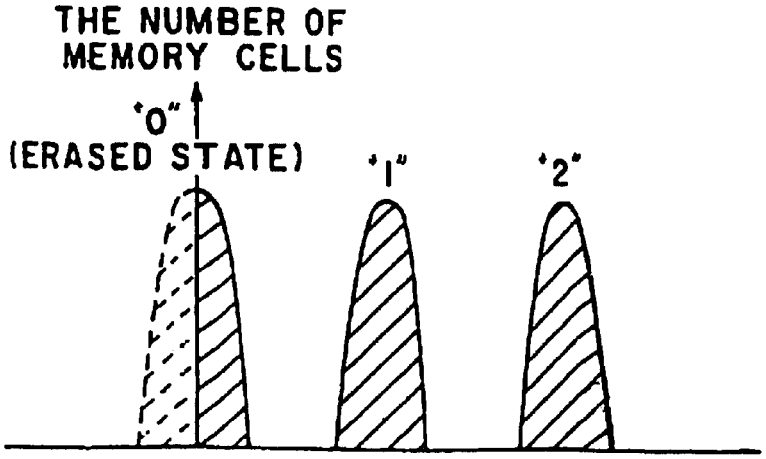

MULTI-STATE EEPROM HAVING WRITE-VERIFY CONTROL CIRCUIT

Matter enclosed in heavy brackets [ ] appears in the original patent but forms no part of this reissue specification; matter printed in italics indicates the additions made by reissue.

*Notice: More than one reissue application has been filed for the reissue of Pat. No. 5,570,315. The reissue applications that have been filed for the reissue of Pat. No. 5,570,315 include parent reissue application Ser. No. 09/134,897 filed on Aug. 17, 1998, and this reissue application Ser. No. 11/451,591 which is a division of this parent reissue application. In addition, reissue applications Ser. No. 11/451,584; Ser. No. 11/451,585; Ser. No. 11/451,586; Ser. No. 11/451,587; Ser. No. 11/451,588; Ser. No. 11/451,589; Ser. No. 11/451,590; Ser. No. 11/451,592; and Ser. No. 11/451,593 have been filed as additional division reissue applications of the above-noted parent reissue application so as to be consistent with the Restriction Requirement mailed in the above-noted parent reissue application on Apr. 20, 2006.*

BACKGROUND OF THE INVENTION

1. Field of the Invention

The present invention relates to an electrically programmable nonvolatile semiconductor memory device (EEPROM) and, more particularly, to an EEPROM for performing a multivalue storing operation for storing information of two or more bits in one memory cell.

2. Description of the Related Art

As one of EEPROMs, a NAND EEPROM which can be integrated at a high density is known. In this NAND EEPROM, a plurality of memory cells are connected in series with each other as one unit such that adjacent memory cells have a source and a drain in common, and these memory cells are connected to a bit line. A memory cell generally has an FETMOS structure in which a charge accumulation layer and a control gate are stacked. A memory cell array is integrated and formed in a p-type well formed in a p- or n-type substrate. The drain side of a NAND cell is connected to a bit line through a selection gate, and the source side is connected to a common source line through a selection gate. The control gates of memory cells are continuously arranged in a row direction to form a word line.

The operation of this NAND-cell EEPROM is as follows. A data write operation is sequentially performed from a memory cell at a position farthest from the bit line. A high voltage Vpp (=about 20 V) is applied to the control gate of a selected memory cell, an intermediate voltage Vppm (=about 10 V) is applied to the control gate and selection gate of a memory cell closer to the bit line than the selected memory cell, and a voltage of 0 V or an intermediate voltage Vm (=about 8 V) is applied to the bit line in accordance with data. When the voltage of 0 V is applied to the bit line, the potential of the bit line is transferred to the drain of the selected memory cell, and electrons are injected into the charge accumulation layer of the selected memory cell. In this case, the threshold voltage of the selected memory cell is positively shifted. This state is represented by, e.g., "1". When the voltage Vm is applied to the bit line, electrons are not effectively injected into the charge accumulation layer of the selected memory cell, and, therefore, the threshold voltage of the selected memory cell is kept negative without being changed. This state is an erased state, and is represented by "0". A data write operation is performed to memory cells which share a control gate at once.

A data erase operation is performed to all the memory cells in a NAND cell at once. More specifically, all the control gates are set to be 0 V, and the p-type well is set to be 20 V. At this time, the selection gate, the bit line, and the source line are set to be 20 V. In this manner, electrons are discharged from the charge accumulation layers of all the memory cells into the p-type well, and the threshold voltages of the memory cells are negatively shifted.

A data read operation is performed as follows. That is, the control gate of a selected memory cell is set to be 0 V, the control gates and selection gates of the remaining memory cells are set to be a power supply potential Vcc (e.g., 5 V), and it is detected whether a current flows in the selected memory cell. Due to restrictions of the read operation, a threshold voltage set upon a "1"-data write operation must be controlled to fall within a range of 0 V to Vcc. For this purpose, a write verify operation is performed to detect only a memory cell in which data "1" is not sufficiently written, and rewritten data is set such that a rewrite operation is performed to only the memory cell in which data "1" is not sufficiently written (bit-by-bit verify operation). The memory cell in which data "1" is not sufficiently written is detected by performing a read operation (verify read operation) such that a selected control gate is set to be, e.g., 0.5 V (verify voltage).

More specifically, when the threshold voltage of the memory cell has a margin with respect to 0 V and is not set to be 0.5 V or more, a current flows in the selected memory cell, and the selected memory cell is detected as a memory cell in which data "1" is not sufficiently written. Since a current flows in a memory cell set to be a "0"-data-written state, a circuit called a verify circuit for compensating the current flowing in the memory cell is arranged to prevent the memory cell from being erroneously recognized as a memory cell in which data "1" is not sufficiently written. This verify circuit executes a write verify operation at a high speed. When a data write operation is performed while a write operation and a write verify operation are repeated, a write time for each memory cell is made optimum, and the threshold voltage of each memory cell set upon a "1"-data write operation is controlled to fall within a range of 0 V to Vcc.

In this NAND-cell EEPROM, in order to realize a multivalue storing operation, for example, it is considered that states set upon a write operation are set to be three states represented by "0", "1", and "2". A "0"-data-written state is defined as a state wherein the threshold voltage is negative, a "1"-data-written state is defined as a state wherein the threshold voltage ranges from 0 V to ½ Vcc, and a "2"-data-written state is defined as a state wherein the threshold voltage ranges from ½ Vcc to Vcc. In a conventional verify circuit, a memory cell set to be a "0"-data written state can be prevented from being erroneously recognized as a memory cell in which data "1" or "2" is not sufficiently written.

However, the conventional verify circuit is not designed for a multivalue storing operation. For this reason, assuming that a memory cell set to be a data "2"-written state has a threshold voltage equal to or higher than a verify voltage for detecting whether data "1" is not sufficiently written and equal to or lower than ½ Vcc, when it is to be detected whether data "1" is not sufficiently written, no current flows in the memory cell, and the memory cell is erroneously recognized as a memory cell in which data "2" is sufficiently written.

In addition, in order to prevent erroneous recognition of a memory cell in which data is not sufficiently written and to perform a multivalue write verify operation, a verify write operation is performed to set a memory cell, in which data "1" is sufficiently written, in a "2"-data-written state, by detecting whether the memory cell is a memory cell in which data "2" is not sufficiently written. However, in this case, a memory cell set to be a "2"-data-written state is set in a "1"-data-written state at first and is then set in a "2"-data-written state. For this reason, a longer time is required for the write operation, and the write operation cannot be performed at a high speed.

As described above, when a conventional NAND-cell EEPROM is used for performing a multivalue storing operation, and a bit-by-bit verify operation is performed by a conventional verify circuit, an erroneous verify operation is disadvantageously performed.

SUMMARY OF THE INVENTION

It is an object of the present invention to provide an EEPROM capable of storing multivalue information and performing a write verify operation at high speed without causing an erroneous verify operation.

According to a first aspect of the present invention, there is provided a nonvolatile semiconductor memory device capable of storing multivalue data, characterized by comprising a memory cell array in which memory cells which can be electrically programmed and each of which has at least three storage states are arranged in a matrix, a plurality of write data circuits for temporarily storing data for controlling write operation states of the plurality of memory cells in the memory cell array, write means for simultaneously performing a write operation to the plurality of memory cells in accordance with contents of the data circuits respectively corresponding to the plurality of memory cells, verify means for simultaneously checking states of the plurality of memory cells set upon the write operation, and means for updating the contents of the write data circuits such that a rewrite operation is performed to only a memory cell, in which data is not sufficiently written, on the basis of the contents of the data circuits and the states of the memory cells set upon the write operation, wherein the write operation based on the contents of the data circuits, a write verify operation, and an operation for updating the contents of the write data circuits are repeatedly performed until the plurality of memory cells are set in predetermined written states, thereby electrically performing a data write operation.

According to a second aspect of the present invention, there is provided a nonvolatile semiconductor memory device having a memory cell array constituted by a plurality of memory cells which are arranged in a matrix and each of which can be electrically programmed, each of the memory cells having arbitrary data "i" ($i=0, 1, \ldots, n-1$; $n \geqq 3$) as at least three storage states, and a storage state corresponding to data "0" being an erasure state, characterized by comprising a plurality of data circuits each serving as a sense amplifier and having a function of storing sensed information as data for controlling a write operation state of a corresponding memory cell, write means for simultaneously performing a write operation to the plurality of memory cells in accordance with contents of the data circuits respectively corresponding to the plurality of memory cells, ith ($i=1, 2, \ldots, n-1$) write verify means for simultaneously checking whether the storage state of each of the plurality of memory cells set upon the write operation becomes a storage state of data "i", ith ($i=1, \ldots, n-1$) data circuit content simultaneous updating means for simultaneously updating the contents of data circuits corresponding to a memory cell in which data "i" is to be stored, such that a rewrite operation is performed to only a memory cell, in which data is not sufficiently written, on the basis of the contents of the data circuits and the storage states of the memory cells after the write operation, and data circuit content updating means for performing a storage checking operation performed by the ith write verify means and a simultaneous updating operation performed by the ith data circuit content simultaneous updating means, from data "1" to data "n−1"n−1 times so as to update the contents of all the plurality of data circuits, wherein the ith data circuit content simultaneous updating means, of bit line potentials at which the storage states of the memory cells set upon a write operation are output by the ith write verify means, a bit line potential corresponding to a memory cell in which data "i" ($i \geqq 1$) is to be stored is sensed/stored as rewrite data, and for bit lines corresponding to memory cells in which data except for data "i" are to be stored the bit line potential at which the state of the memory cell set upon the write operation is output is corrected in accordance with the contents of the data circuits so as to sense/store to hold the contents of data circuit, holding the data storage states of the data circuits until the bit line potentials are corrected, operating the data circuits as sense amplifiers while the corrected bit line potentials are held, and simultaneously updating the contents of the data circuit corresponding to the memory cell in which data "i" is to be stored, and a write operation and a data circuit content updating operation based on the contents of the data circuits are repeatedly performed until the memory cells are set in predetermined written states, thereby electrically performing a data write operation.

Preferred embodiments of the present invention will be described below.

(1) The data circuits control write operation states of the memory cells in accordance with data stored in the data circuits in a write operation to perform control such that the states of the memory cells are changed into predetermined written states or the states of the memory cells are held in states set prior to the write operation.

(2) For a data circuit corresponding to a memory cell to be set in an "i"-data-written state, an ith data circuit content simultaneous updating means changes data of the data circuit into data for controlling the state of the memory cell to hold the state of the memory cell in a state set prior to the write operation when memory cells corresponding to a data circuit in which data for changing a memory cell into an "i"-data-written state is stored reach an "i"-data-written state, sets data for controlling the state of the memory cell to change the state of the memory cell into the "i"-data-written state in the data circuit when the memory cell corresponding to the data circuit in which data for changing a memory cell into an "i"-data-written state is stored does not reach the "i"-data-written state, and sets data for controlling the state of the memory cell to hold the state of the memory cell set prior to the write operation when the data circuit stores data for controlling the state of the memory cell to hold the state of the memory cell in the state set prior to the write operation, and the ith data circuit content simultaneous updating means does not change contents of the data circuits corresponding to the memory cells in which data except for data "i" are to be stored.

(3) Each of the memory cells is constituted by stacking and forming a charge accumulation layer and a control gate on a semiconductor layer and stores arbitrary data "i" ($i=0, 1, \ldots, n-1$; $n \geqq 3$) as at least three storage states and as multivalue data using magnitudes of threshold voltages, and the ith write verify means applies a predetermined ith verify potential to the control gate to verify whether a threshold voltage of a memory cell set to be the "i"-data-written state is a desired threshold voltage.

(4) A storage state corresponding to data "0" is an erased state, a difference between the threshold voltage corresponding to the data "n−1" state and the threshold voltage corresponding to a data "0" state is a maximum, and threshold voltages corresponding to data "1", "2", . . . , "i", . . . , "n−2" states range from the threshold voltage corresponding to the data "0" state to the threshold voltage corresponding to the data "n−1" state, and the threshold voltages corresponding to the data "1", "2", . . . , "i", . . . , "n−2" states are ordered from the threshold voltage corresponding to the data "0" state. The nonvolatile semiconductor memory device comprises a first bit line potential setting circuit for, of a plurality of bit line potentials at which states of memory cells set upon a write operation are output by the ith write verify means, when the data circuits sense a bit line potential corresponding to a data circuit whose contents are data for controlling the states of the memory cells to hold the states of the memory cells in states set prior to the write operation, setting the bit line potential to be a first correction bit line potential which becomes data for controlling the states of the memory cells to hold states of the memory cells in states set prior to the write operation, and a jth bit line potential setting circuit for, of bit line potentials corresponding to memory cells set to be data "j"-written states ($i+1 \leqq j$) among bit line potentials at which states of the memory cells set upon a write operation are output by the ith ($1 \leqq i \leqq n-2$) write verify means, when a data circuit senses only a bit line potential corresponding to a data circuit whose contents are data for controlling states of memory cells to set the states of the memory cells in data "j"-written states, setting the bit line potential in a second correction bit line potential which becomes data for controlling the states of the memory cells to change the states of the memory cells into the data "j"-written states, wherein, to update the contents of the data circuits, a bit line potential at which states of the memory cells set upon a write operation are output by an ith write verify operation is corrected by the first, (i+1)th, (i+2)th, . . . , (n−1)th bit line potential setting circuits.

(5) Each of the data circuits is constituted by a first data storage unit for storing information indicating whether a state of a memory cell is held in a state set prior to a write operation and a second data storage unit for, when the information of the first data storage unit is not information for controlling the state of the memory cell to hold the state of the memory cell in a state set prior to the write operation, storing information indicating a written state "i" (i=1, 2, . . . , n−1) to be stored in the memory cell, the first data storage unit having a function of sensing/storing bit line potentials which are corrected by the first, (i+1)th, (i+2)th, . . . , (n−1)th bit line potential setting circuits in accordance with the contents of the data circuits to perform the data circuit content updating operation and at which the storage states of the memory cells set upon the write operation are output by the ith write verify operation.

(6) The nonvolatile semiconductor memory device comprises a write prevention bit line voltage output circuit for, when the information of the first data storage unit is information for controlling the state of the memory cells to hold the state of the memory cells in states set prior to a write operation, outputting a write prevention bit line voltage to a bit line in the write operation, and an ith (i=1, 2, . . . , n−1) bit line voltage output circuit for, when the information of the first data storage unit is not information for controlling the states of the memory cells to hold the states of the memory cells in the states set prior to the write operation, outputting a bit line voltage in an ith write operation in accordance with information indicating a written state "i" to be stored in a memory cell of the second data storage unit.

(7) The first bit line potential setting circuit and the write prevention bit line voltage output circuit are common first bit line voltage control circuits. The input voltage of each of the common first bit line voltage control circuits has an input voltage whose output is to be a write prevention bit line voltage in a write operation and a first correction bit line potential in a data circuit content updating operation. The jth (j=2, 3, . . . , n−1) bit line potential setting circuit and the jth write bit line voltage output circuit are common jth bit line voltage control circuits. Each of the common jth bit line voltage control circuits has an input whose output is to be a jth write bit line voltage in the write operation and a second correction bit line potential in a data circuit content updating operation.

(8) Each of the memory cells is constituted by stacking and forming a charge accumulation layer and a control gate on a semiconductor layer, and the memory cells are connected in series with each other as units each constituted by a plurality of memory cells to form NAND-cell structures.

(9) Each of the memory cells is constituted by stacking and forming a charge accumulation layer and a control gate on a semiconductor layer, thereby forming a NOR-cell structure.

A multivalue (n-value) storage type EEPROM according to the first and second aspects of the present invention is constituted such that a verify read operation is performed through n−1 basic operation cycles. An erased state is represented by data "0", and multivalue levels are represented by "0", "1", . . . , "i", . . . , "n−1" in an order from a small threshold voltage. In this case, an ith cycle is constituted to verify whether an "i"-data write operation is sufficiently performed. For this reason, the EEPROM comprises a verify potential generation circuit for applying a predetermined verify voltage at an level in the ith cycle such that a current flows in a memory cell having a selected control gate when an "i"-data write operation is sufficiently performed, and a sense amplifier for detecting a bit line voltage to determine whether a write operation is sufficiently performed. In the ith cycle, the bit line of a memory cell in which data "0", . . . , "i−1" are written has a first verify circuit such that the current of the memory cell is compensated for when it is detected that the data are sufficiently written in the memory cell and the current of the memory cell is not compensated for when it is detected that the data are not sufficiently written in the memory cell. In the ith cycle, for the bit line of a memory cell in which data "i+1", . . . , "n−1" are written, the current of the memory cell is compensated for by the first verify circuit when it is detected that the data are sufficiently written in the memory cell in advance and a second verify circuit for setting a bit line voltage is installed such that the current of the memory cell flows when it is detected that the data are not sufficiently written in the memory cell.

The EEPROM comprises a first data storage unit for storing data indicating whether data is sufficiently written and a second data storage unit for storing whether a multivalue level to be written is any one of data "1", . . . , "n−1". The first data storage unit also has the function of a sense amplifier for detecting whether data is sufficiently written. In addition, the EEPROM is characterized by comprising a bit line write voltage output circuit for outputting a bit line voltage in a write operation in accordance with a desired written state such that, when there is memory cell which does not reach a predetermined written state, a rewrite operation is performed to only this memory cell.

According to the present invention, after a multivalue data write operation is performed, it is detected whether the written states of memory cells reach their desired multivalue level states. When there is a memory cell which does not reach its desired multivalue level state, a bit line voltage in a write operation is output in accordance with a desired written state such that a rewrite operation is performed to only this memory cell. The write operation and the verify read operation are repeated, and a data write operation is ended when all the memory cells reach their desired written states, respectively.

As described above, according to the present invention, a time for performing one write cycle is shortened, and a write operation is repeated many times within a short time while the degree of progress of a written state is checked, so that the range of the threshold voltage distribution of a memory cell in which a data write operation is finally ended can be narrowed at a high speed.

According to a third aspect of the present invention, a bit line potential in a read operation is controlled to exhibit the threshold voltage of a memory cell. A common source line is set to be 6 V, a voltage of 2 V is applied to a selected control gate, and the potential of the common source line is transferred to the bit line. When the bit line potential reaches a certain value, a current flowing in the memory cell is stopped, and the bit line potential is given as a value obtained by subtracting the threshold voltage of the memory cell from the control gate voltage of 2 V. When the bit line potential is 3 V, the threshold voltage of the memory cell is −1 V. A non-selected control gate and a selection gate are set to be 6 V such that the bit line potential is not determined by the potential of the non-selected memory cell or a selection transistor.

An erased state is represented by data "0", multivalue levels are represented by "0", "1", . . . , "i", . . . , "n−1" in an order from a small threshold voltage. In this case, since a verify read operation simultaneously verifies whether all data "i" are sufficiently written, a reference potential used when a bit line voltage is sensed is set in accordance with the written data. In addition, as in "0"-data write operation, a verify circuit is arranged such that the current of the memory cell is compensated for when it is detected that the data are sufficiently written in the memory cell and the current of the memory cell is not compensated for when it is detected that the data are not sufficiently written in the memory cell. A first data storage unit for storing data indicating whether data is sufficiently written and a second data storage unit for storing whether a multivalue level to be written is any one of data "1", . . . , "n−1" are arranged. The first data storage unit also serves as a sense amplifier for detecting whether data is sufficiently written. In addition, a multivalue (n-value) storage type NAND-cell EEPROm according to a nonvolatile semiconductor memory device is characterized by comprising a bit line write voltage output circuit for outputting a bit line voltage in a write operation in accordance with a desired written state such that, when there is memory cell which does not reach a predetermined written state, a rewrite operation is performed to only this memory cell.

More specifically, a nonvolatile semiconductor memory device according to the third aspect of the present invention includes, as a basic arrangement, a nonvolatile semiconductor memory device comprising a memory cell array in which the memory cells, each of which is constituted by stacking a charge accumulation layer and a control gate on a semiconductor layer and can be electrically programmed to store at least three data as multivalue data of threshold voltages of the memory cell, are arranged in a matrix, threshold voltage detection means for charging a bit line connected to the memory cells so that charging is made through the memory cells and outputting the multivalue data of the memory cell as multivalue level potentials to the bit line, and a sense amplifier for sensing potentials of the bit line charged by the threshold voltage detection means, and the nonvolatile semiconductor memory device is characterized by the following embodiments.

(1) The nonvolatile semiconductor memory device is characterized in that the memory cells are connected in series with each other as units each constituted by memory cells to form a plurality of NAND-cell structures each having one terminal connected to the bit line through a first selection gate and the other terminal connected to a source line through a second selection gate, the threshold voltage detection means transfers a source line voltage to the bit line through a corresponding NAND cell to charge the bit line, and non-selected control gate voltages and first and second selection gate voltages are controlled such that voltage transfer capabilities of non-selected memory cells and first and second selection transistors are sufficiently increased to determine a bit line voltage at a threshold voltage of a selected memory cell.

(2) The nonvolatile semiconductor memory device comprises the plurality of data circuits each functioning as the sense amplifier and having a function of storing sensed information as data for controlling write operation states of the memory cells, the write means for performing a write operation in accordance with contents of the data circuits respectively corresponding to the plurality of memory cells in the memory cell array, the write verify means which uses the threshold voltage detection means to check whether states of the plurality of memory cells set upon the write operation are storage states of desired data, and the data circuit content simultaneous updating means for simultaneously updating the contents of the data circuits such that a rewrite operation is performed to only a memory cell, in which data is not sufficiently written, on the basis of the contents of the data circuits and the states of the memory cells after a write operation, wherein the data circuit content simultaneous updating means corrects a bit line potential at which the storage states of the memory cells set upon the write operation are output in accordance with the contents of the data circuits to sense/store the bit line potential as rewrite data, holds the data storage states of the data circuits until the bit line potential is corrected, operates the data circuits as sense amplifiers while the corrected bit line potential is held, and simultaneously updates the contents of the data circuits, and a write operation and a data circuit content simultaneous updating operation based on the contents of the data circuits are repeatedly performed until the memory cells are set in predetermined written states, thereby electrically performing a write operation.

(3) The data circuits control write operation states of the memory cells in accordance with data stored in the data circuits in a write operation to perform control such that the states of the memory cells are changed into predetermined written states or the states of the memory cells are held in states set prior to the write operation, and the data circuit content simultaneous updating means changes data of the data circuits into data for holding the states of the memory cells in states set prior to the write operation when a memory cell corresponding to a data circuit in which data for controlling the memory cells to change the memory cells to have predetermined written states is stored reaches a predetermined written state, sets data for controlling the memory cells to change the memory cells to have predetermined written states in the data circuits when the memory cell corresponding to the data circuit in which data for controlling the memory cells to change the memory cells to have predetermined written states is stored does not reach the predetermined written state, and sets data for controlling the states of the memory cells to hold the states of the memory cells in the states set prior to the write operation in the data circuits, when data for controlling the states of the memory cells to hold the states of the memory cells in the states set prior to the write operation is stored in the data circuits.

(4) The nonvolatile semiconductor memory device comprises a bit line potential setting circuit for, of bit line potentials at which states of the memory cells set upon the write operation are output by the threshold voltage detection means, when only a bit line potential corresponding to the data circuits whose contents are data for controlling the states of the memory cells to hold the states of the memory cells in the states set prior to the write operation is sensed by the data circuits, setting a correction bit line potential at which data for controlling the states of the memory cells to hold the states of the memory cells in the states set prior to the write operation is obtained, and wherein, to perform the data circuit content simultaneous updating operation, a bit line potential at which the states of the memory cells set upon the write operation are output with the threshold voltage detection means is corrected by the bit line potential setting circuit in accordance with the contents of the data circuits.

(5) For the nonvolatile semiconductor memory device in which one of the memory cells has at least three storage data "i" (i=0, 1, . . . , n−1) to perform a multivalue storing operation, a storage state corresponding to data "0" being an erased state, each of the data circuits is constituted by a first data storage unit for storing information indicating whether a state of a memory cell is held in a state set prior to a write operation and a second data storage unit for, when the information of the first data storage unit is not information for controlling the state of the memory cell such that the state of the memory cell is held in a state set prior to the write operation, storing information indicating a written state "i" (i=1, 2, . . . , n−1) to be stored in the memory cell, and the first data storage unit having a function of sensing/storing bit line potentials which are corrected by the bit line potential setting circuits in accordance with the contents of the data circuits to perform the data circuit content updating operation and at which the storage states of the memory cells set upon the write operation are output with the threshold voltage detection means.

(6) The first data storage unit has a function of comparing a reference voltage with a bit line voltage to sense a bit line potential and a function of sensing/storing a bit line potential which is corrected by the bit line potential setting circuit in accordance with the contents of the data circuits using a reference voltage corresponding to the contents of the data circuits and at which states of the memory cells set upon the write operation are output by the threshold voltage detection means.

(7) The nonvolatile semiconductor memory device comprises a write prevention bit line voltage output circuit for outputting a write prevention bit line voltage to a bit line in a write operation when the information of the first data storage unit is information for controlling the states of the memory cells to hold the states of the memory cells in states before the write operation, and an ith write bit line voltage output circuit for outputting a bit line voltage in an ith write operation in accordance with information of the second data storage unit indicating data "i" (i=1, 2, . . . , n−1) to be stored in the memory cell when the information of the first data storage unit is not information for controlling the states of the memory cells to hold the states of the memory cells in states set prior to the write operation.

(8) The nonvolatile semiconductor memory device comprises data inverting means for inverting data of the first data storage unit for activating the bit line potential setting circuit before the activation of bit line potential setting circuit, when the data of the first data storage unit for activating the bit line potential setting circuit has been inverted to the data of the first data storage unit for activating the write prevention bit line voltage output circuit.

In the third aspect of the present invention, after a multivalue data write operation is performed, it is simultaneously detected whether the written states of the memory cells reach their multivalue level states, respectively. When there is a memory cell which does not reach its desired multivalue level, a bit line voltage in a write operation is output in accordance with a desired written stat such that a rewrite operation is performed only to this memory cell. The write operation and a verify read operation are repeated, and a data write operation is ended when it is confirmed that all the memory cells reach their desired written states, respectively.

As described above, according to the present invention, a time for performing one write cycle is shortened, and a write operation is repeated many times within a short time while the degree of progress of a written state is checked, so that the range of the threshold voltage distribution of a memory cell in which a data write operation is finally ended can be narrowed at a high speed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 7A and 7B are timing charts showing data input/output operations in the first and second embodiments;

FIG. 8 is a view showing the concept of a page serving as a write/read unit in the first and second embodiments;

FIG. 23 is a graph showing the relationship between a bit line output voltage in a read operation and a write time in the third embodiment;

FIG. 29 is a graph showing the relationship between the bit line output voltage in a read operation and a write time in the fourth embodiment;

FIG. 30 is a graph showing the relationship between data and a bit line output voltage in a read operation when a binary storing operation is performed to one memory cell in the fourth embodiment;

DETAILED DESCRIPTION OF THE PREFERRED EMBODIMENTS

Embodiments of the present invention will be described below with reference to the accompanying drawings.

Figure 1:
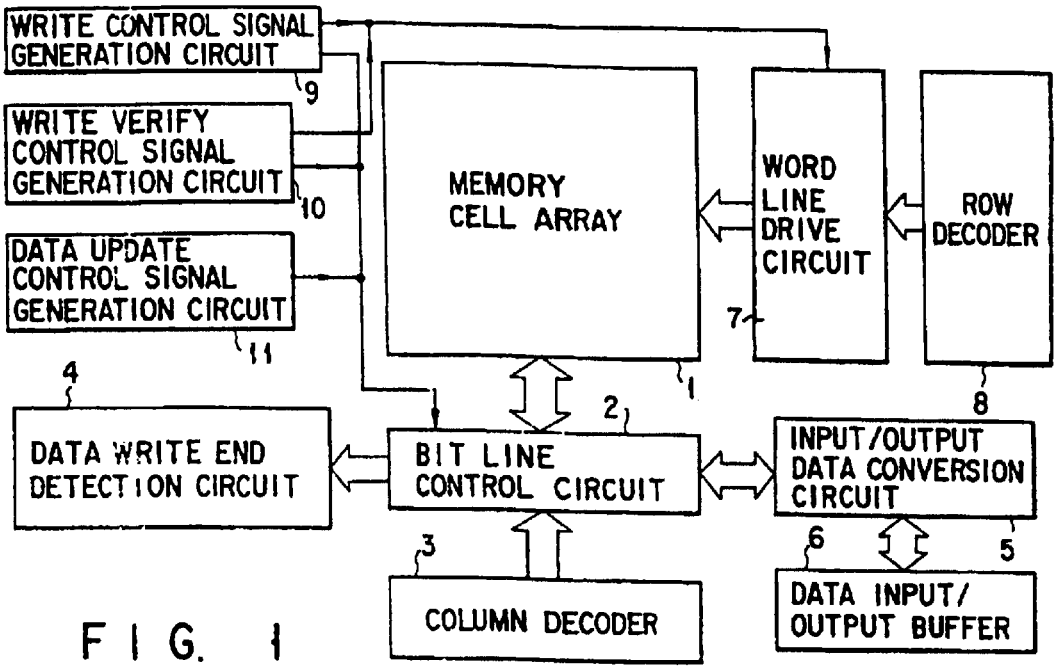
FIG. 1 is a block diagram showing the schematic arrangement of an EEPROM according to the first and second embodiments of the present invention.

FIG. 1 is a block diagram showing the schematic arrangement of a NAND-cell EEPROM according to the first embodiment of the present invention.

A bit line control circuit 2 for controlling a bit line in a read/write operation and a word line drive circuit 7 for controlling a word line potential are arranged for a memory cell array 1. The bit line control circuit 2 and the word line drive circuit 7 are selected by a column decoder 3 and a row decoder 8, respectively. The bit line control circuit 2 receives and outputs read/write data from/to an input/output data conversion circuit 5 through a data input/output line (IO line). The input/output data conversion circuit 5 converts readout multivalue information of a memory cell into binary information to externally output the multivalue information, and converts the binary information of externally input write data into the multivalue information of a memory cell. The input/output data conversion circuit 5 is connected to a data input/output buffer 6 for controlling a data input/output operation with an external circuit. A data write end detection circuit 4 detects whether a data write operation is ended. A write control signal generation circuit 9 supplies a write control signal to the bit line control circuit 2 and the word line drive circuit 7. A write verify control signal generation circuit 10 supplies a write verify control signal to the bit line control circuit 2 and the word line drive circuit 7. A data update control signal generation circuit 11 supplies a data update control signal to the bit line control circuit 2.

Figure 2:
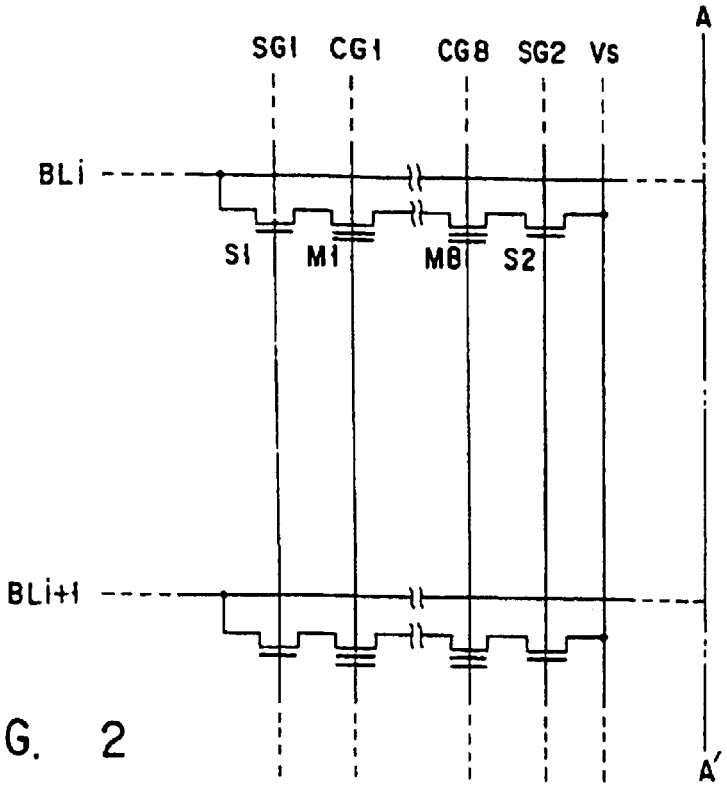
FIG. 2 is a circuit diagram showing the detailed arrangement of a memory cell array in the first embodiment.
Figure 3:
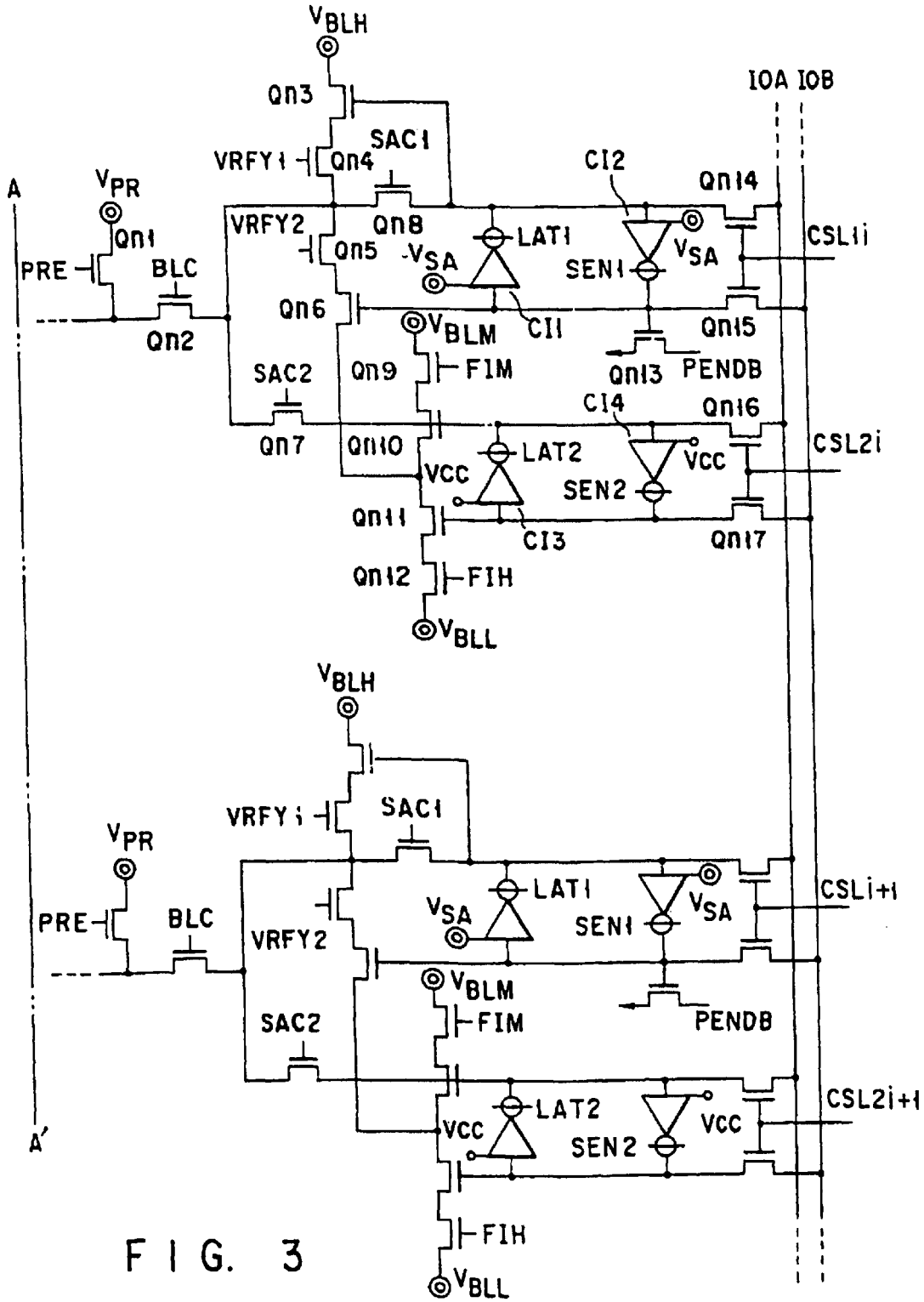
FIG. 3 is a circuit diagram showing the detailed arrangement of a bit line control circuit in the first embodiment.

FIGS. 2 and 3 show the detailed arrangements of the memory cell array 1 and the bit line control circuit 2. Memory cells M1 to M8 and selection transistors S1 and S2 constitute a NAND cell. One terminal of the NAND cell is connected to a bit line BL, and the other terminal is connected to a common source line Vs. Selection gate SG1 and SG2 and control gates CG1 to CG8 are shared by a plurality of NAND cells, and memory cells which share one control gate constitute a page. Each memory cell stores data at a threshold voltage Vt thereof. The memory cell stores data "0" indicating that the threshold voltage Vt is lower than 0 V, stores data "1" indicating that the threshold voltage Vt is greater than 0 V and lower than 1.5 V, and stores data "2" indicating that the threshold voltage Vt is greater than 1.5 V and lower than a power supply voltage. One memory cell can have three states, and nine combinations can be obtained by two memory cells. Of these nine combinations, eight combinations are used, and data of three bits are stored in the two memory cells. In this embodiment, data of three bits are stored in a pair of adjacent memory cells which share a control gate. In addition, the memory cell array 1 is formed on a dedicated p-type well.

In the bit line control circuit in FIG. 3, clocked synchronous inverters CI1 and CI2 and clocked synchronous inverters CI3 and CI4 constitute flip-flops, respectively, and these flip-flops latch write/read data. The flip-flops are also operated as sense amplifiers. The flip-flop constituted by the clocked synchronous inverters CI1 and CI2 latches write data information indicating whether data "0" or data "1" or "2" is to be written, and latches read data information indicating whether a memory cell stores the information of data "0" or the information of data "1" or "2". The flip-flop constituted by the clocked synchronous inverters CI3 and CI4 latches write data information indicating whether data "1" or "2" is to be written, and latches read data information indicating whether a memory cell stores the information of data "2" or the information of data "0" or "1".

Figure 19A:
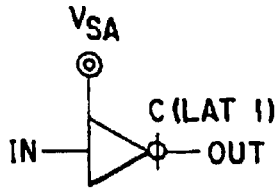
FIGS. 19A and 19B are circuit diagrams showing the detailed arrangement of an inverter portion shown in FIG. 3.
Figure 19B:
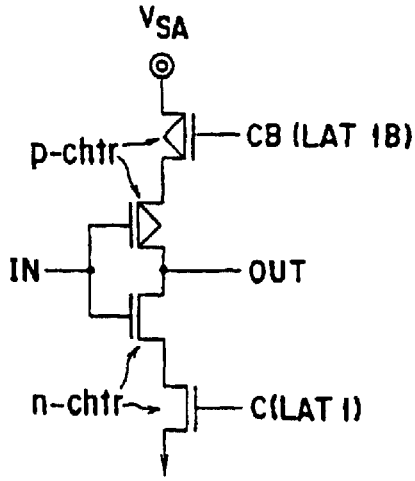

Of n-channel MOS transistors, an n-channel MOS transistor Qn1 transfers a voltage VPR to a bit line when a precharge signal PRE goes to "H" level. When a bit line connection signal BLC goes to "H" level, an n-channel MOS transistor Qn2 connects the bit line to a main bit line control circuit. N-channel MOS transistors Qn3 to Qn6 and Qn9 to Qn12 selectively transfer voltages VBLH, VBLM, and VBLL to the bit line in accordance with the data latched in the above flip-flops. When signals SAC2 and SAC1 go to "H" level, n-channel MOS transistors Qn7 and Qn8 respectively connect the flip-flops to the bit line. An n-channel MOS transistor Qn13 is arranged to detect whether all the data of one page latched in the flip-flops are identical to each other. When column selection signals CSL1 and CSL2 go to "H" level, n-channel MOS transistors Qn14 and Qn15 selectively connect a corresponding one of the flip-flops to data input/output line IOA or IOB, and n-channel MOS transistors Qn16 and Qn17 selectively connect a corresponding one of the flip-flops to the data input/output line IOA or Although an inverter portion is roughly shown in FIG. 3 as shown in FIG. 19(a), the inverter portion has the circuit arrangement shown in FIG. 19(b).

Figure 4:
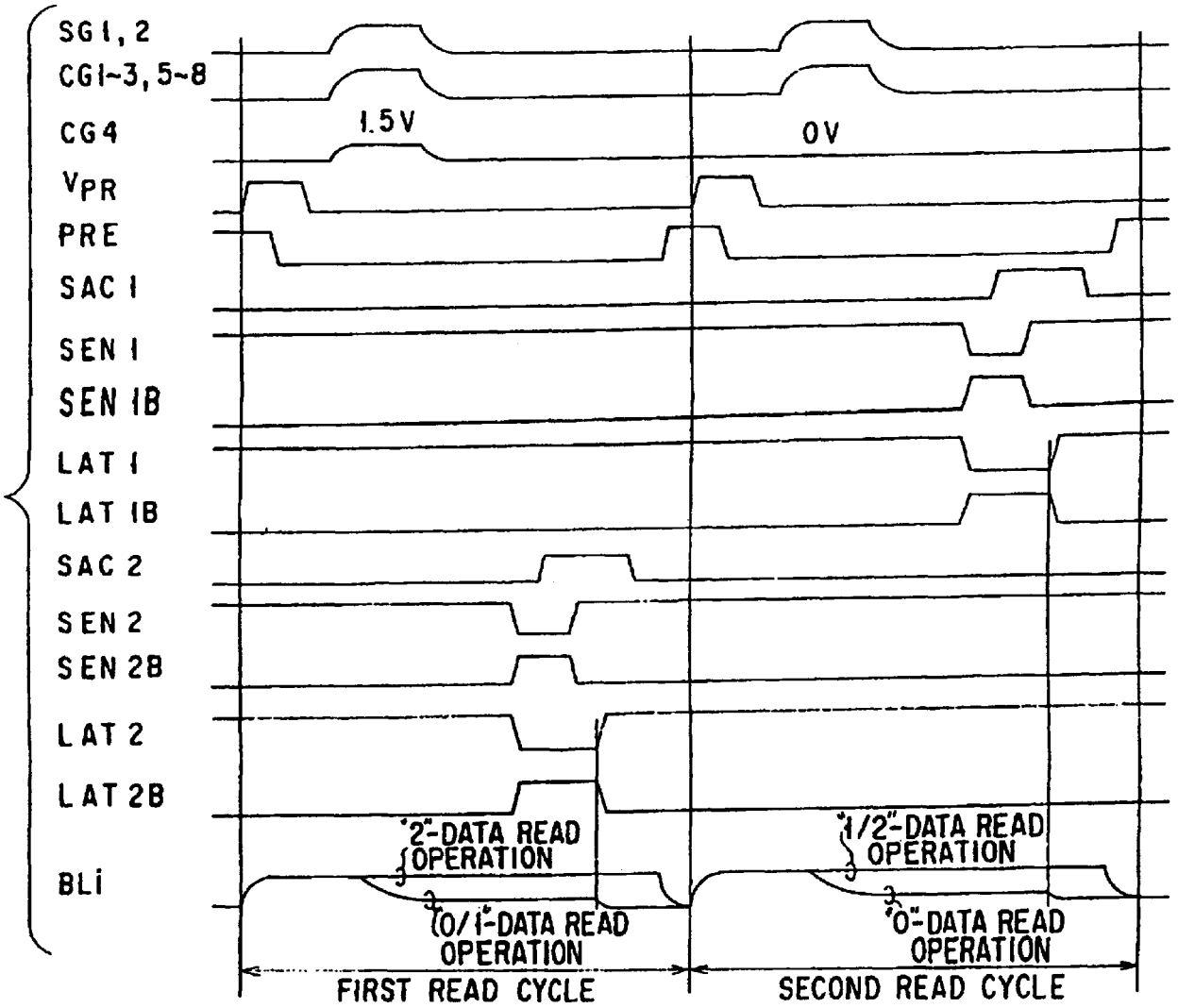
FIG. 4 is a timing chart showing a read operation in the first embodiment.
Figure 5:
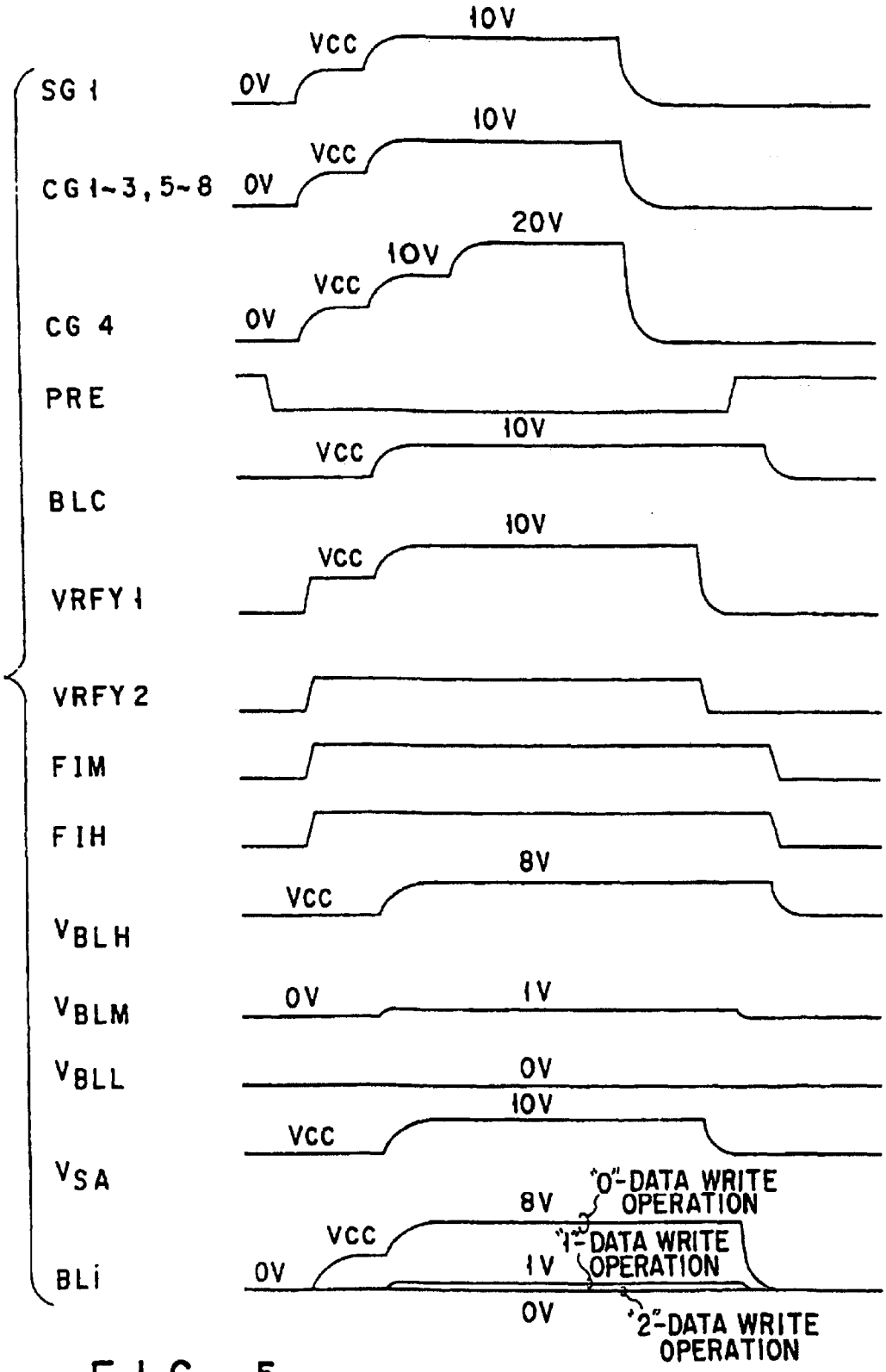
FIG. 5 is a timing chart showing a write operation in the first embodiment.
Figure 6:
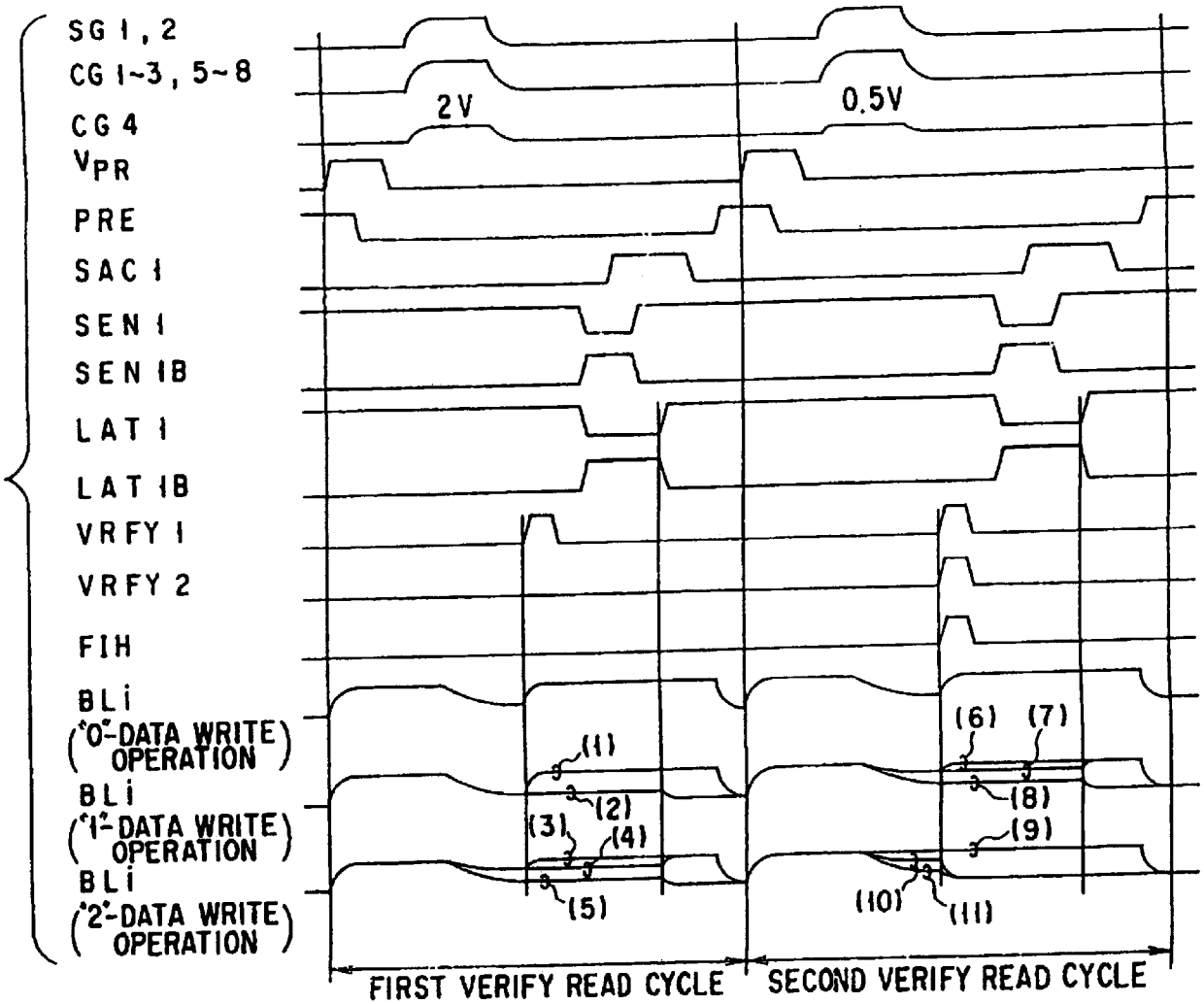
FIG. 6 is a timing chart showing a verify read operation in the first embodiment.

The operation of the EEPROM arranged as described above will be described below with reference to FIGS. 4 to 6. FIG. 4 shows read operation timings, FIG. 5 shows write operation timings, and FIG. 6 shows verify read operation timings. Each of FIGS. 4, 5, and 6 shows a case wherein the control gate CG4 is selected.

A read operation is executed by two basic cycles. In the first read cycle, the voltage VPR becomes a power supply voltage Vcc to precharge the bit line, and the precharge signal PRE goes to "L" level to cause the bit line to float. Subsequently, the selection gates SG1 and SG2 and the control gates CG1 to CG3 and CG5 to CG8 are set to be the power supply voltage Vcc. At the same time, the control gate CG4 is set to be 1.5 V. Only when the threshold voltage of a selected memory cell is set to be 1.5 V or more, i.e., data "2" is written in this memory cell, the bit line is kept at "H" level.

Thereafter, sense activation signals SEN2 and SEN2B go to "L" level and "H" level, respectively, and latch activation signals LAT2 and LAT2B go to "L" level and "H" level, respectively, thereby resetting the flip-flop constituted by the clocked synchronous inverters CI3 and CI4. The signal SAC2 goes to "H" level to connect the flip-flop constituted by the clocked synchronous inverters CI3 and CI4 to the bit line. After the sense activation signals SEN2 and SEN2B go to "H" level and "L" level, respectively, to sense a bit line potential, the latch activation signals LAT2 and LAT2B go to "H" level and "L" level, respectively, and the information of data "2" or data "1" is latched in the flip-flop constituted by the clocked synchronous inverters CI3 and CI4.

In the second read cycle, unlike the first read cycle, the voltage of the selection control gate CG4 is not set to be 1.5 V but is set to be 0 V, and signals SEN1, SEN1B, LAT1, LAT1B, and SAC1 are output in place of the signals SEN2, SEN2B, LAT2, LAT2B, and SAC2. Therefore, in the second read cycle, the information of data "0" or data "1" or "2" is latched in the flip-flop constituted by the clocked synchronous inverters CI1 and CI2.

Data written in the memory cells are read out by the two read cycles described above.

The data of the memory cells are erased prior to a data write operation, and the threshold voltage Vt of each of the memory cells is set to be less than 0 V. The p-type well, the common source line Vs and, the selection gates SG1 and SG2 are set to be 20 V, and the control gates CG1 to CG8 are set to be 0 V, thereby performing an erase operation.

In the write operation, the precharge signal PRE goes to "L" level to cause the bit line to float. The selection gate SG1 and the control gates CG1 to CG8 are set to be Vcc. The selection gate SG2 is set to be 0 V during the write operation. At the same time, signals VRFY1, VRFY2, FIM, and FIH are set to be Vcc. In a "0"-data write operation, since the flip-flop constituted by the clocked synchronous inverters CI1 and CI2 latches data such that an output from the clocked synchronous inverter CI1 is set at "H" level, the bit line is charged by the voltage Vcc. In the "1"- or "2"-data write operation, the bit line is set to be 0 V.

Subsequently, the selection gate SG1, the control gates CG1 to CGS, the signals BLC and VRFY1, and a voltage VSA are set to be 10 V, the voltage VBLH is set to be 8 V, and the voltage VBLM is set to be 1 V. In the "1"-data write operation, since the flip-flop constituted by the clocked synchronous inverters CI3 and CI4 latches data such that an output from the clocked synchronous inverter CI3 goes to "H" level, a voltage of 1 V is applied to the bit line BL. In a "2"-data write operation, the bit line is set to be 0 V. In a "0"-data write operation, the bit line is set to be 8 V. Thereafter, the selected control gate CG4 is set to be 20 V.

In a "1"- or "2"-data write operation, electrons are injected into the charge accumulation layers of the memory cells by the potential difference between the bit line BL and the control gate CG4. In the "1"-data write operation, amounts of charges to be injected into the charge accumulation layers of the memory cells must be smaller than those in the "2"-data write operation. For this reason, the bit line BL is set to be 1 V to relax the potential difference between the bit line BL and the control gate CG4 to 19 V. However, even when the potential difference is not relaxed, the same effect as described above can be obtained by adjusting a write time. In a "0"-data write operation, the threshold voltages of the memory cells are not effectively changed by a bit line voltage of 8 V.

Upon completion of the write operation, the selection gate SG1 and the control gates CG1 to CG8 are set to be 0 V, and then the voltage of the bit line BL set to be 8 V in the "0"-data write operation is reset to 0 V with a time lag. This is because, when the order of the setting operations is reversed, a "2"- or "1"-data-written state is temporarily set, and erroneous data is written in the "0"-data write operation.

After the write operation, verify read operation is performed to check the written state of the memory cell and perform an additional write operation to only a memory cell in which data is not sufficiently written. During the verify read operation, the voltages VBLH, VBLL, and FIM are set to be Vcc, 0 V, and 0 V, respectively.

The verify read operation is executed by two basic cycles. Each of the basic cycles is almost identical to the second read cycle except that the voltage of the selected control gate CG4 and signals VRFY1, VRFY2, and FIH are output (only the signal VRFY1 is output in the first verify read cycle). The signals VRFY1, VRFY2 , and FIH are output before the signals SEN1, SEN1B, LAT1, and LAT1B go to "L" level, "H" level, "L" level and "H" level, respectively, after the selection gates SG1 and SG2 and the control gates CG1 to CG8 are reset to 0 V. In other words, the signals VRFY1, VRFY2, and FIH are output before the flip-flop constituted by the clocked synchronous inverters CI1 and CI2 is reset after the potential of the bit line is determined by the threshold voltages of the memory cells. The potential of the selected control gate CG4 is set to be 2 V (first cycle) and 0.5 V (second cycle) in the verify read operation which are higher than 1.5 V (first cycle) and 0 V (second cycle) in the read operation to assure a threshold voltage margin of 0.5 V.

In this case, data (data 1) latched in the flip-flop constituted by the clocked synchronous inverters CI1 and CI2, data (data 2) latched in the flip-flop constituted by the clocked synchronous inverters CI3 and CI4, and the voltage of the bit line BL determined by the threshold voltage of a selected memory cell will be described below. The data 1 controls a "0"-data write operation or a "1"- or "2"-data write operation. The n-channel MOS transistor Qn3 is set in an "ON" state when the "0"-data write operation is performed, and the n-channel MOS transistor Qn6 is set in an "ON" state when "1"- or "2"-data write operation is performed. The data 2 controls a "1"-data write operation or a "2"-data write operation. The n-channel MOS transistor Qn10 is set in an "ON" state when the "1"-data write operation is performed, and the n-channel MOS transistor Qn11 is set in an "ON" state when the "2"-data write operation is performed.

In the first verify read cycle in the "0"-data write operation (initial write data is data "0"), the data of the memory cell is data "0". For this reason, when the control gate CG4 is set to be 2 V, the memory cell causes a bit line potential to go to "L" level. Thereafter, when signal VRFY1 goes to "H" level, the potential of the bit line BL goes to "H" level.

In the first verify read cycle in the "1"-data write operation (initial write data is data "1"), since the data of the memory cell is to be "1", the threshold voltage of the memory cell is less than 1.5 V. When the control gate CG4 is set to be 2 V, the memory cell causes the bit line potential to go to "L" level. In this case, even when the initial write data is data "1", when data "1" is sufficiently written in the selected memory cell by the previously performed verify read cycles, the data 1 is set to be data "0". In this case, when the signal VRFY1 goes to "H" level later, the potential of the bit line BL goes to "H" level ((1) in FIG. 6). In cases except for the above case, the potential of the bit line BL goes to "L" level ((2) in FIG. 6).

In the first verify read cycle in the "2"-data write operation (initial write data is data "2"), when the data of the selected memory cell is not data (data "2" is not sufficiently written), and the control gate CG4 is set to be 2 V, the memory cell causes the bit line potential to go to "L" level ((5) in FIG. 6). When data "2" is sufficiently written in the selected memory cell, even when the control gate CG4 is set to be 2 V, the bit line potential is kept at "H" level ((3) and (4) in FIG. 6). (3) in FIG. 6 indicates a case wherein data "2" is sufficiently written in the memory cell in advance, and the data 1 is converted into data for controlling the "0"-data write operation by the previously performed verify read cycles. In this case, when the signal VRFY1 goes to "H" level, the bit line BL is charged by the voltage VBLH again.

In the second verify read cycle in the "0"-data write operation (initial write data is data "0"), the data of the memory cell is data "0". For this reason, when the control gate CG4 is set to be 0.5 V, the memory cell causes the bit line potential to go to "L". Thereafter, when the signal VRFY1 goes to "H" level, the potential of the bit line BL goes to "H" level.

In the second verify read cycle in the "1"-data write operation (initial write data is data "1"), the data of the selected memory cell is not data "1" (data "1" is not sufficiently written), and the control gate CG4 is set to be 0.5 V, the memory cell causes the bit line potential to go to "L" level ((8) in FIG. 6). When data "1" is sufficiently written in the selected memory cell, even when the control gate CG4 is set to be 0.5 V, the bit line potential is kept at "H" level ((6) and (7) in FIG. 6). (6) in FIG. 6 indicates a case wherein data "1" is sufficiently written in the memory cell in advance by previous verify read cycles, and the data 1 is converted into data for controlling the "0"-data write operation. In this case, when the signal VRFY1 goes to "H" level, the bit line BL is charged by the voltage VBLH again.

In the second verify read cycle in the data "2" read operation (initial write data is data "2"), the data of the memory cell is to be data "2". For this reason, assuming that the threshold voltage of the memory cell is 0.5 V or more, even when data "2" is sufficiently written or is not sufficiently written in the memory cell, and the control gate CG4 is set to be 0.5 V, the bit line potential is kept at "H" level ((9) and (10) in FIG. 6). When data "2" is not sufficiently written in the memory cell, and the threshold voltage of the memory cell is 0.5 V or less, the bit line potential goes to "L" level ((11) in FIG. 6).

Thereafter, when the signals VRFY1, VRFY2, and FIH go to "H" level, data "2" is sufficiently written, and the data 1 is converted into data for controlling a "0"-data write operation, the potential of the bit line BL goes to "H" level ((9) in FIG. 6). In other cases except for the above case, the potential of the bit line BL goes to "L" level ((10) and (11) in FIG. 6).

With the above verify read operation, rewrite data are set as shown in the following table (Table 1) on the basis of the write data and the written states of the memory cells.

TABLE 1

| | | | | | | | | |
|---|---|---|---|---|---|---|---|---|
| Write Data | 0 | 0 | 0 | 1 | 1 | 2 | 2 | 2 |
| Cell Data | 0 | 1 | 2 | 0 | 1 | 0 | 1 | 2 |

TABLE 1-continued

| | | | | | | | | |
|---|---|---|---|---|---|---|---|---|
| Rewrite Data | 0 | 0 | 0 | 1 | 0 | 2 | 2 | 0 |

As is apparent from Table 1, data "1" is rewritten in only a memory cell in which data "1" is not sufficiently written, and data "2" is rewritten in only a memory cell in which "2" is not sufficiently written. In addition, when data are sufficiently written in all the memory cells, the n-channel MOS transistors Qn13 of all the columns are set in an "OFF" state, and data write operation end information is output by a signal PENDB.

FIGS. 7A and 7B show data input/output operation timings. FIG. 7A shows a data input timing, and FIG. 7B shows a data output timing. After three external data input cycles are performed, data to be input to the bit line control circuit 2 is generated and output from the input/output data conversion circuit 5. External data ($X_1$, $X_2$, $X_3$) of three bits are converted into data ($Y_1$, $Y_2$) for two memory cells. In the bit line control circuit 2, the converted data are set in a register R1 constituted by the clocked synchronous inverters CI1 and CI2 and a register R2 constituted by the clocked synchronous inverters CI3 and CI4. This setting is performed through the data input/output lines IOA and IOB. Readout data latched in the registers R1 and R2 are transferred to the input/output data conversion circuit 5 through the data input/output lines IOA and IOB, converted, and then output. Column selection signals CSL1i and CSL2i are set to be the same signal, and the data input/output lines IOA and IOB are divided into two systems such that two registers of the same column can be easily accessed at once. Therefore, an access time can be effectively shortened.

The following table (Table 2) shows the relationships between external data ($X_1$, $X_2$, $X_3$) of three bits, two data ($Y_1$, $Y_2$) of the memory cells, and the data of the registers R1 and R2 respectively corresponding to the data $Y_1$ and $Y_2$ in a data input operation.

TABLE 2

| Input Data | | | Cell Data | | IOA Line Data: Cell $Y_1$ Register R1 | IOA Line Data: Cell $Y_1$ Register R2 | IOA Line Data: Cell Y2 Register R1 | IOA Line Data: Cell Y2 Register R2 |
|---|---|---|---|---|---|---|---|---|
| $X_1$ | $X_2$ | $X_3$ | $Y_1$ | $Y_2$ | | | | |
| 0 | 0 | 0 | 0 | 0 | H | — | H | — |
| 0 | 0 | 1 | 0 | 2 | H | — | L | L |
| 0 | 1 | 0 | 0 | 1 | H | — | L | H |
| 0 | 1 | 1 | 1 | 2 | L | H | L | L |
| 1 | 0 | 0 | 1 | 0 | L | H | H | — |
| 1 | 0 | 1 | 1 | 1 | L | H | L | H |
| 1 | 1 | 0 | 2 | 0 | L | L | H | — |
| 1 | 1 | 1 | 2 | 1 | L | L | L | H |
| Pointer write instruction | | | 2 | 2 | L | L | L | L |

Each register data is expressed by the voltage level of the input/output line IOA in a data transfer operation. Since the data input/output line IOB is obtained by inverting the data input/output line IOA, the data input/output line IOB is not illustrated. The following table (Table 3) shows the relationships of Table 2 in a data output operation.

TABLE 3

| IOA Line Data: Cell $Y_1$ Register R1 | IOA Line Data: Cell $Y_1$ Register R2 | IOA Line Data: Cell Y2 Register R1 | IOA Line Data: Cell Y2 Register R2 | Cell Data $Y_1$ | Cell Data $Y_2$ | Output Data $X_1$ | Output Data $X_2$ | Output Data $X_3$ |
|---|---|---|---|---|---|---|---|---|
| L | L | L | L | 0 | 0 | 0 | 0 | 0 |
| L | L | H | H | 0 | 2 | 0 | 0 | 1 |
| L | L | H | L | 0 | 1 | 0 | 1 | 0 |
| H | L | H | H | 1 | 2 | 0 | 1 | 1 |
| H | L | L | L | 1 | 0 | 1 | 0 | 0 |
| H | L | H | L | 1 | 1 | 1 | 0 | 1 |
| H | H | L | L | 2 | 0 | 1 | 1 | 0 |
| H | H | H | L | 2 | 1 | 1 | 1 | 1 |
| H | H | H | H | 2 | 2 | Pointer flag output | | |

In this embodiment, the level of the data input/output line IOA in an input operation and the level of the data input/output line IOA in an output operation are inverted with respect to the same data.

Of nine combinations of the two data ($Y_1$, $Y_2$) of the memory cells, one combination is an extra combination. For this reason, this extra combination can be used as file management information such as pointer information. In this case, the pointer information corresponds to cell data ($Y_1$, $Y_2$)=(2,2).

FIG. 8 shows the concept of a page serving as a data write unit when viewed from a microprocessor or the like for controlling an EEPROM. In this case, one page is defined by N bytes, and addresses (logical addresses) when viewed from a microprocessor or the like are represented. For example, when write data is input into only an area 1 (logical addresses 0 to n), and n=3m+2 (m=0, 1, 2, . . . ) is satisfied, data ($X_1$, $X_2$, $X_3$) are always completed. For this reason, no problem is posed. Since only data $X_1$ is input when n=3m, data $X_2$=0 and $X_3$=0 are generated inside the EEPROM, so the data ($X_1$, $X_2$, $X_3$) are input to the input/output data conversion circuit 5. When n=3m+1, data $X_3$=0 is generated inside the EEPROM. When the address n is equal to the address N, the same effect as described above can be obtained.

After a data write operation is performed in the area 1 (all write data in an area 2 are "0"), when a data write operation is additionally performed in an area 2, the data in the area 1 are read out, and the write data in the area 2 is added to the readout data and input them. Alternatively, the data in the area 1 are read out. When the start address of the area 2 is n+1=3m, all the data in the area 1 may be set to be data "0"; when the start address is n+1=3m+2, data at addresses n−1 and n may be added as data $X_1$ and $X_2$ to data $X_3$ at address n+1, and all data at addresses up to address n−2 in the area 1 may be set to be data "0"; and when the start address is n+1=3m+1, data at address n may be added as data $X_1$ to data $X_2$ and $X_3$ at addresses n+1 and n+2, and all data at addresses up to address n−1 may be set to be data "0". These operations can be easily, automatically performed inside the EEPROM. The combinations between the data ($X_1$, $X_2$, $X_3$) and data ($Y_1$, $Y_2$) are formed as shown in Tables 2 and 3 such that the additional data write operation can be performed. The relationships between the data ($X_1$, $X_2$, $X_3$) and the data ($Y_1$, $Y_2$) shown in Tables 2 and 3 are only examples, and the relationships between the data ($X_1$, $X_2$, $X_3$) and the data ($Y_1$, $Y_2$) are not limited to the relationships shown in Table 2 and 3. In addition, even when the number of areas is three or more, additional data can be written in the same manner as described above.

Figure 9A:
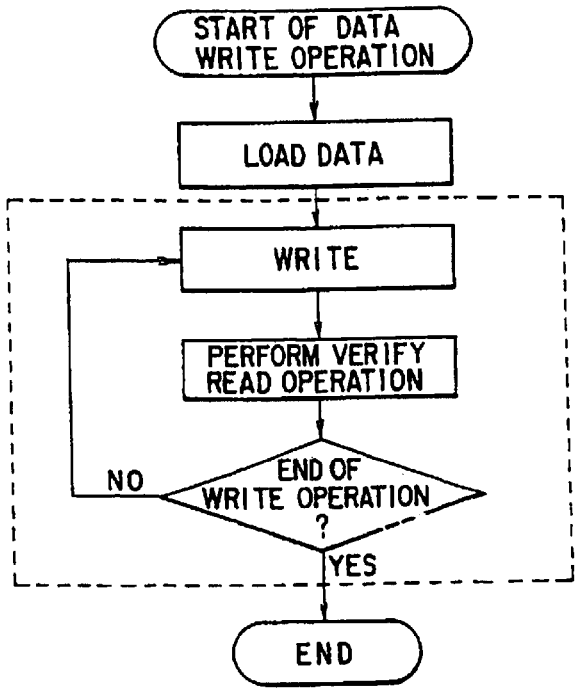
FIGS. 9A and 9B are flow charts showing a data write algorithm and an additional data write algorithm in the first and second embodiments, respectively.

FIG. 9A shows a data write algorithm. After a data loading operation is performed, a write operation, a verify read operation, and a write end detecting operation are repeatedly performed. The operations enclosed by a dotted line are automatically performed in the EEPROM.

Figure 9B:
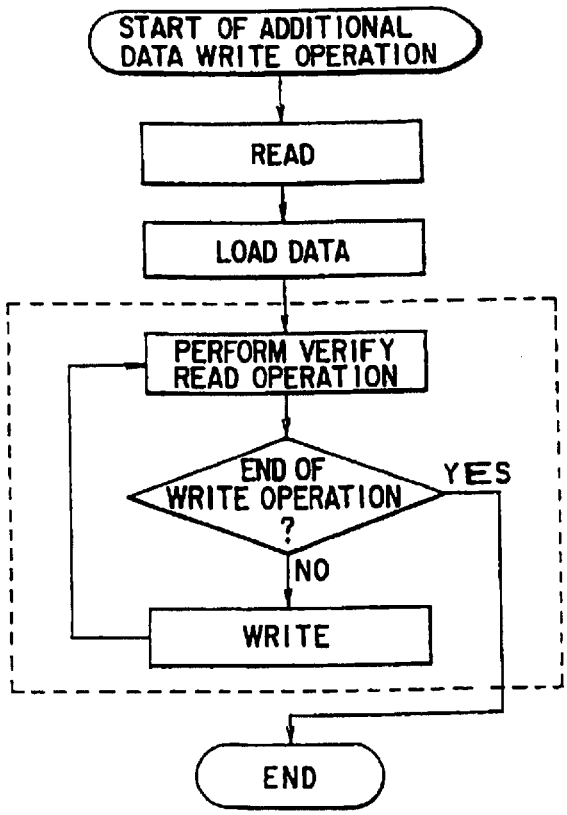

FIG. 9B shows an additional data write algorithm. After a read operation and a data loading operation are performed, a verify read operation, a write end detecting operation, and a write operation are repeatedly performed. The operations enclosed by a dotted line are automatically performed in the EEPROM. The verify read operation is performed after the data loading operation is performed because data is prevented from being written in a memory cell in which data "1" or "2" is written in advance. If the verify read operation is not performed after the data loading operation is performed, an excessive write operation may be performed.

Figure 10:
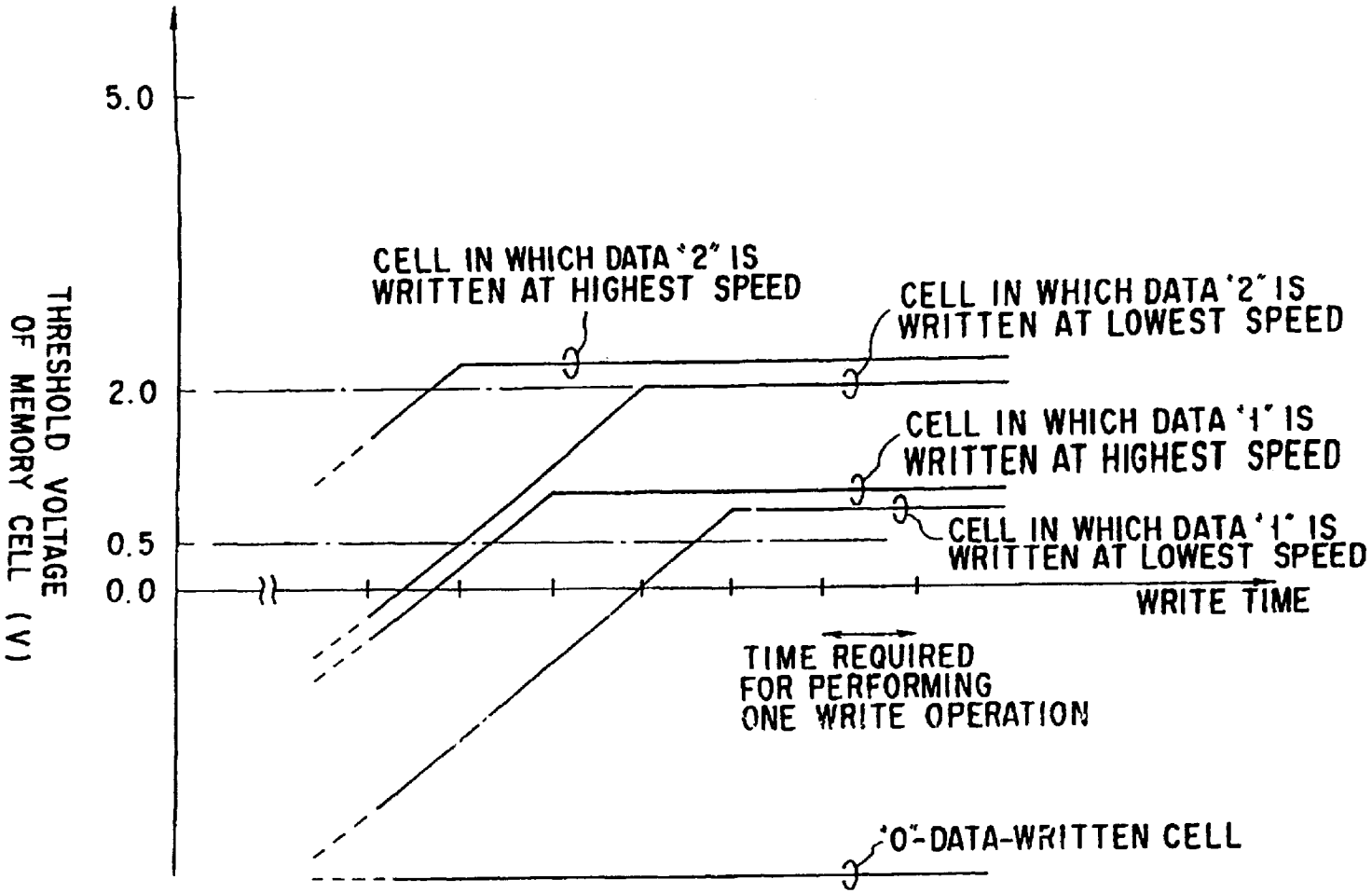
FIG. 10 is a graph showing the write characteristics of the memory cell in the first embodiment.

FIG. 10 shows write characteristics with respect to the threshold voltage of a memory cell in the EEPROM described above. A write operation in a memory cell in which data "1" is to be written and a write operation in a memory cell in which data "2" is to be written are performed at once, and write periods of time are independently set for these memory cells.

The following table (Table 4) shows the potentials at several positions of the memory cell array in an erase operation, a write operation, and a verify read operation.

TABLE 4

| | Erase | Write Operation | | | Read Operation | | Verify Read Operation | |
|---|---|---|---|---|---|---|---|---|
| | Operation | "0" | "1" | "2" | First Cycle | Second Cycle | First Cycle | Second Cycle |
| BL | 20 V | 8 V | 1 V | 0 V | "H" only when data "2" is read | "L" only when data "0" is read | See FIG. 6 | |
| SG1 | 20 V | | 10 V | | 5 V | | 5 V | |
| CG1 | 0 V | | 10 V | | 5 V | | 5 V | |
| CG2 | 0 V | | 10 V | | 5 V | | 5 V | |
| CG3 | 0 V | | 10 V | | 5 V | | 5 V | |
| CG4 | 0 V | | 20 V | | 1.5 V | 0 V | 2 V | 0.5 V |
| CG5 | 0 V | | 10 V | | 5 V | | 5 V | |
| CG6 | 0 V | | 10 V | | 5 V | | 5 V | |
| CG7 | 0 V | | 10 V | | 5 V | | 5 V | |
| CG8 | 0 V | | 10 V | | 5 V | | 5 V | |
| SG2 | 20 V | | 0 V | | 5 V | | 5 V | |
| Vs | 20 V | | 0 V | | 0 V | | 0 V | |
| P well | 20 V | | 0 V | | 0 V | | 0 V | |

Figure 11:
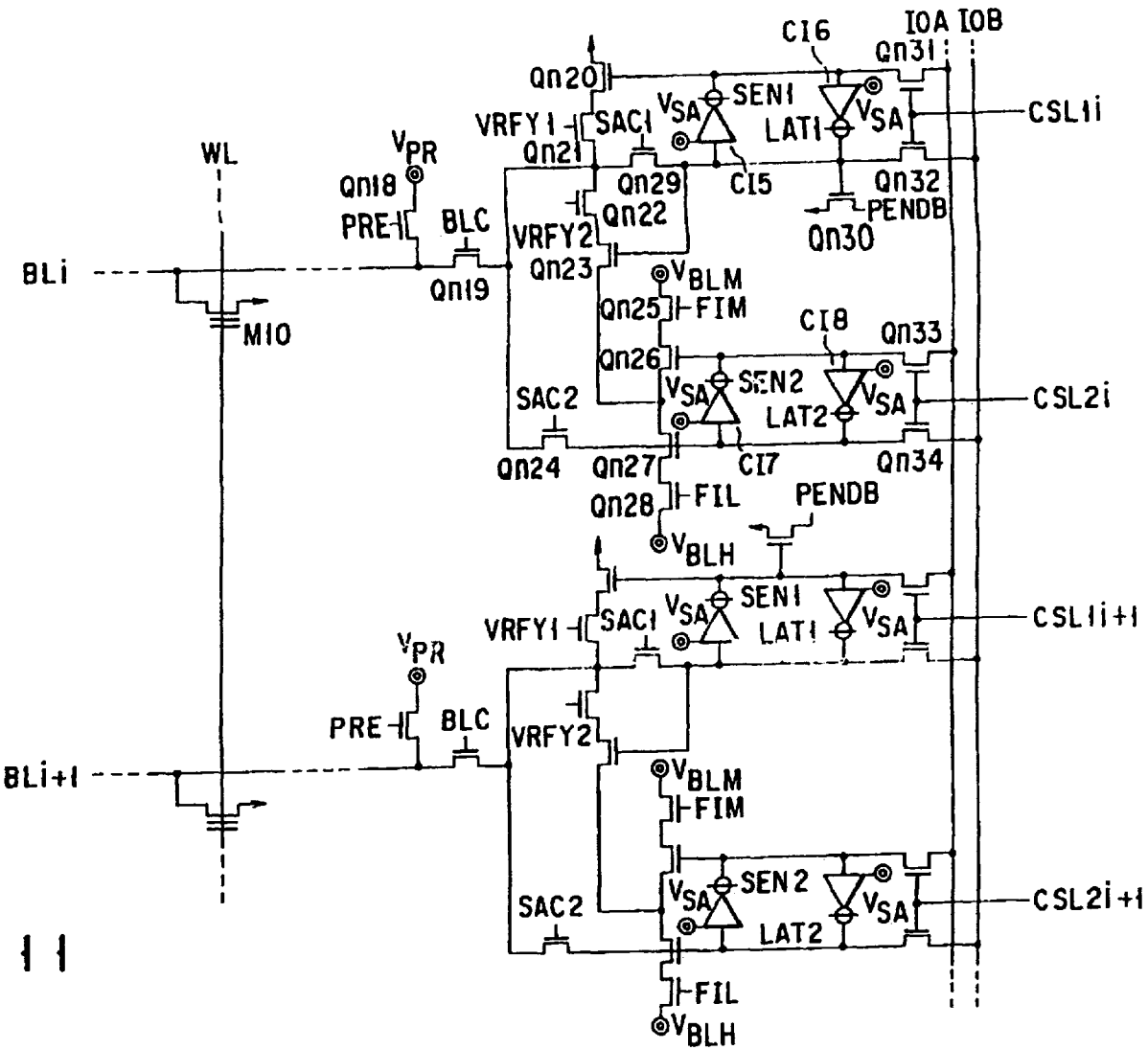
FIG. 11 is a circuit diagram showing the arrangements of a memory cell array and a bit line control circuit in the second embodiment.

FIG. 11 shows the detailed arrangement of a memory cell array 1 and a bit line control circuit 2 in a NOR-cell EEPROM according to the second embodiment of the present invention. A NOR cell is constituted by only a memory cell M10. One terminal of the NOR cell is connected to a bit line BL, and the other terminal is connected to a common ground line. Memory cells M which share one control gate WL constitute a page. Each of the memory cells M stores data at a threshold voltage Vt thereof. The memory cell stores data "0" indicating that the threshold voltage Vt is not less than Vcc, stores data "1" indicating that the threshold voltage Vt is lower than Vcc and not less than 2.5 V, and stores data "2" indicating that the threshold voltage Vt is lower than 2.5 V and not less than 0 V. One memory cell can have three states, and nine combinations can be obtained by two memory cells. Of these nine combinations, eight combinations are used, and data of three bits are stored in the two memory cells. In this embodiment, data of three bits are stored in a pair of adjacent memory cells which share a control gate.

A flip-flop is constituted by clocked synchronous inverters CI5 and CI6, and a flip-flop is constituted by clocked synchronous inverters CI7 and CI8. These flip-flops latch write/read data. The flip-flops are also operated as sense amplifiers. The flip-flop constituted by the clocked synchronous inverters CI5 and CI6 latches write data information indicating whether data "0" or data "1" or "2" is to be written, and latches read data information indicating whether a memory cell stores the information of data "0" or the information of data "1" or "2". The flip-flop constituted by the clocked synchronous inverters CI7 and CI8 latches write data information indicating whether data "1" or "2" is to be written, and latches read data information indicating whether a memory cell stores the information of data "2" or the information of data "0" or "1".

Of n-channel MOS transistors, an n-channel MOS transistor Qn18 transfers a voltage VPR to a bit line when a precharge signal PRE goes to "H" level. When a bit line connection signal BLC goes to "H" level, an n-channel MOS transistor Qn19 connects the bit line to a main bit line control circuit. N-channel MOS transistors Qn20 to Qn23 and Qn25 to Qn28 selectively transfer voltages VBLH, VBLM, and a voltage of 0 V to the bit line in accordance with the data latched in the above flip-flops, when signals SAC2 and SAC1 go to "H" level, n-channel MOS transistors Qn24 and Qn29 respectively connect the flip-flops to the bit line. An n-channel MOS transistor Qn30 is arranged to detect whether all the data of one page latched in the flip-flops are identical to each other. When column selection signals CSL1 and CSL2 go to "H" level, n-channel MOS transistors Qn31 and Qn32 selectively connect a corresponding one of the flip-flops to a data input/output line IOA or IOB, and n-channel MOS transistors Qn33 and Qn34 selectively connect a corresponding one of the flip-flops to the data input/output line IOA or IOB.

Figure 12:
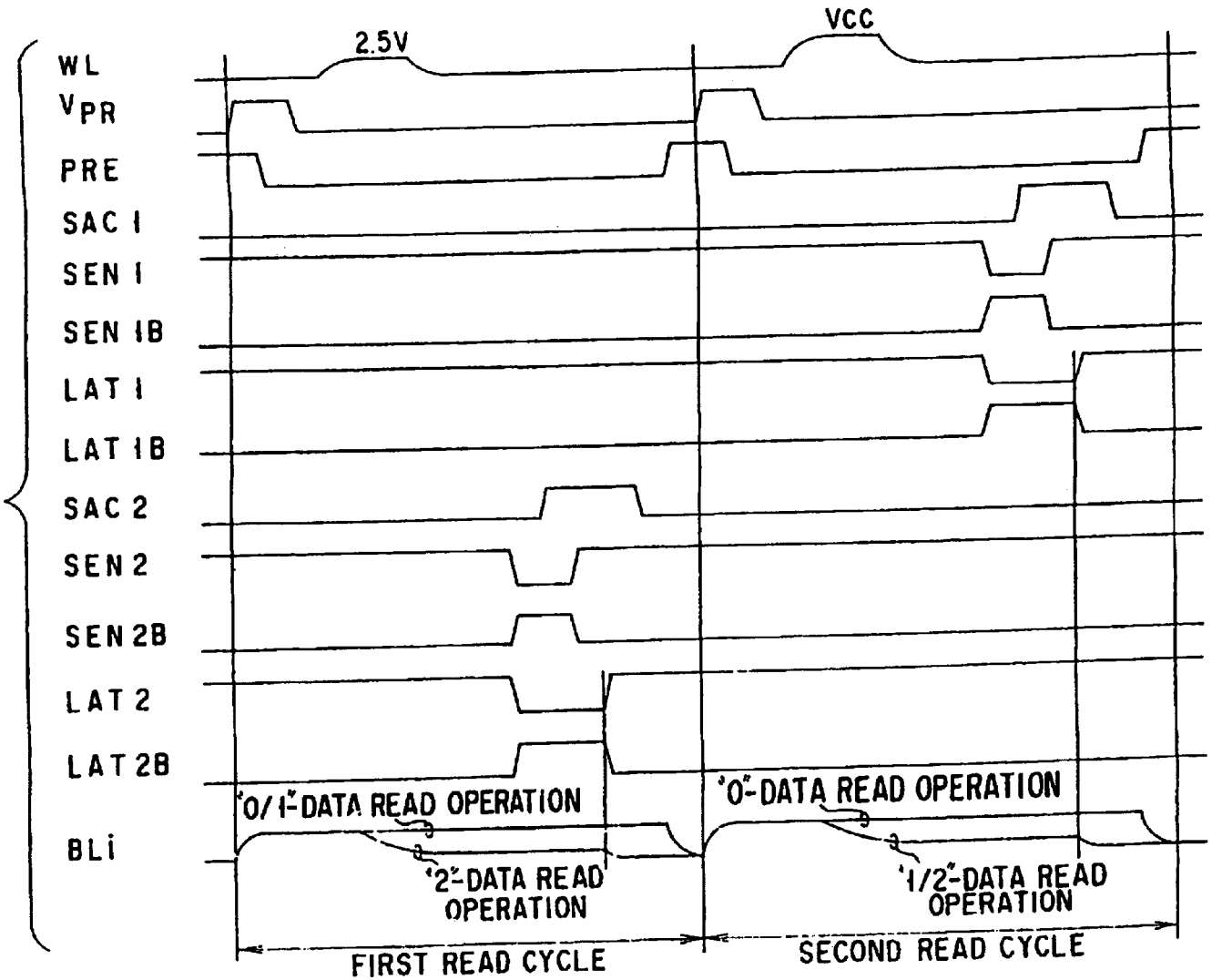
FIG. 12 is a timing chart showing a read operation in the second embodiment.
Figure 13:
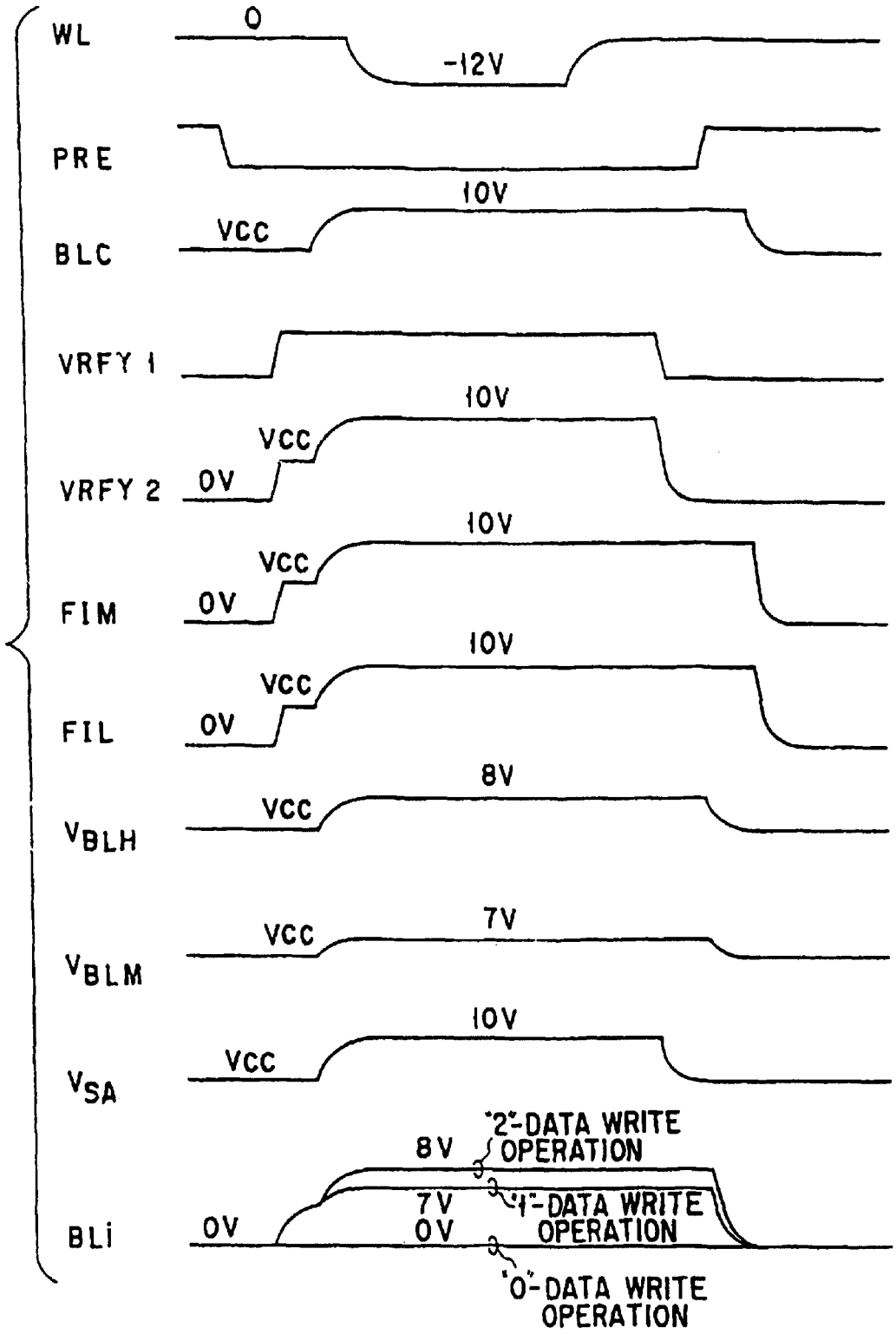
FIG. 13 is a timing chart showing a write operation in the second embodiment.
Figure 14:
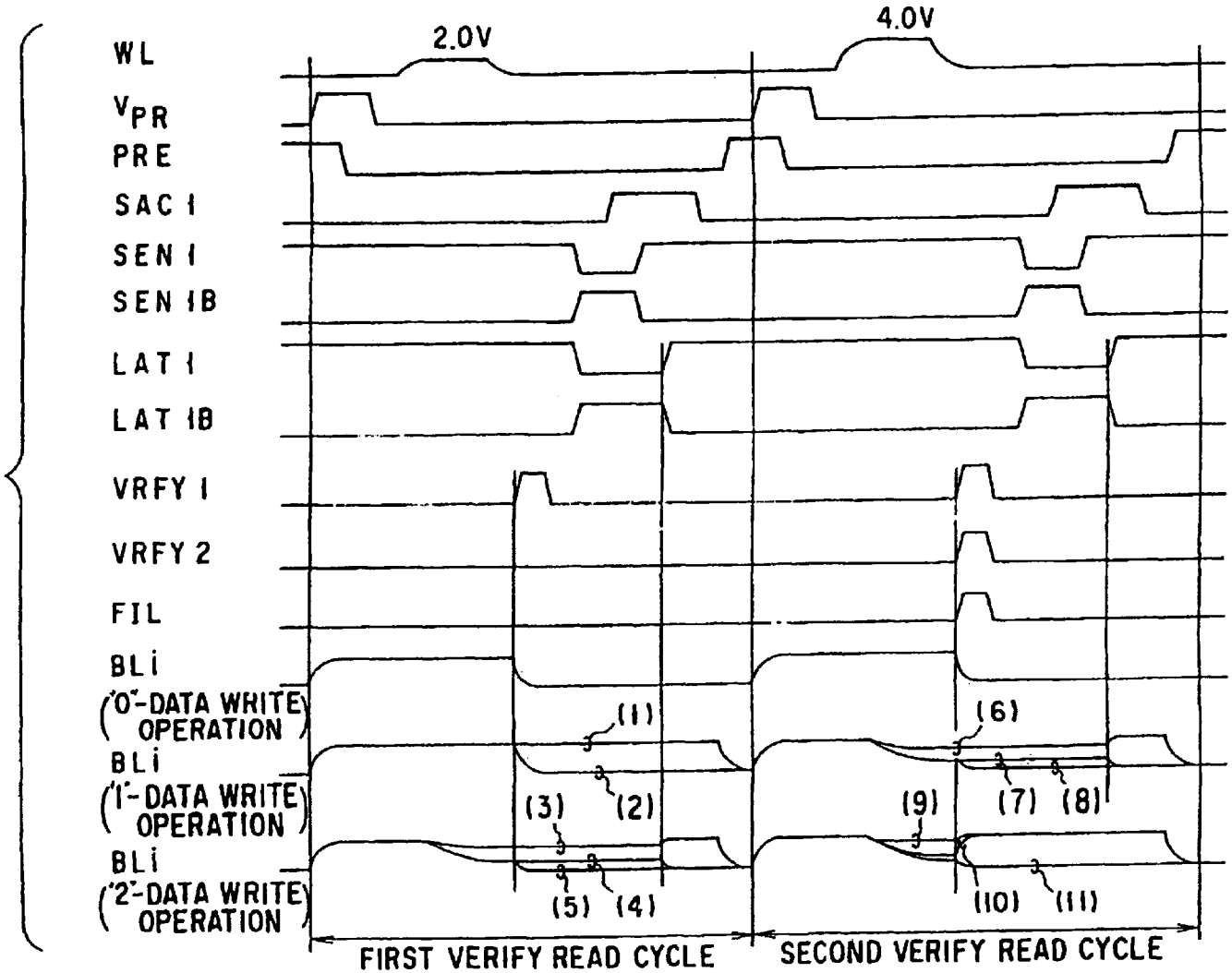
FIG. 14 is a timing chart showing a verify read operation in the second embodiment.

The operation of the EEPROM arranged as described above will be described below with reference to FIGS. 12 to 14. FIG. 12 shows read operation timings, FIG. 13 shows write operation timings, and FIG. 14 shows verify read operation timings.

A read operation is executed by two basic cycles. In the first read cycle, the voltage VPR becomes a power supply voltage Vcc to precharge a bit line, and the precharge signal PRE goes to "L" level to cause the bit line to float. Subsequently, the control gate WL is set to be 2.5 V. Only when the threshold voltage Vt of a selected memory cell is set to be 2.5 V or less, i.e., data "2" is written in this memory cell, the bit line goes to "L" level.

Thereafter, sense activation signals SEN2 and SEN2B go to "L" level and "H" level, respectively, and latch activation signals LAT2 and LAT2B go to "L" level and "H" level, respectively, thereby resetting the flip-flop constituted by the clocked synchronous inverters CI7 and CI8. The signal SAC2 goes to "H" level to connect the flip-flop constituted by the clocked synchronous inverters CI7 and CI8 to the bit line. After the sense activation signals SEN2 and SEN2B go to "H" level and "L" level, respectively, to sense a bit line potential, the latch activation signals LAT2 and LAT2B go to "H" level and "L" level, respectively, and the information of data "2" or "1" or data "0" is latched in the flip-flop constituted by the clocked synchronous inverters CI7 and CI8.

In the second read cycle, unlike the first read cycle, the voltage of the selection control gate WL is not set to be 2.5 V but is set to be Vcc, and signals SEN1, SEN1B, LAT1, LAT1B, and SAC1 are output in place of the signals SEN2, SEN2B, LAT2, LAT2B, and SAC2. Therefore, in the second read cycle, the information of data "0" or data "1" or "2" is latched in the flip-flop constituted by the clocked synchronous inverters CI5 and CI6.

Data written in the memory cells are read out by the two read cycles described above.

The data of the memory cells are erased prior to a data write operation, and the threshold voltage Vt of each of the memory cells is set to be Vcc or more. The control gate WL is set to be 20 V, and the bit line is set to be 0 V, thereby performing an erase operation.

In the write operation, the precharge signal PRE goes to "L" level to cause the bit line to float. Signals VRFY1, VRFY2, FIM, and FIL are set to be Vcc. In a "0"-data write operation, since the flip-flop constituted by the clocked synchronous inverters CI5 and CI6 latches data such that an output from the clocked synchronous inverter CI5 goes to "H" level, the bit line is set to be 0 V. In the "1"- or "2"-data write operation, the bit line is set to be Vcc.

Subsequently, the signals BLC, VRFY2, FIM, and FIL and a voltage VSA are set to be 10 V, the voltage VBLH is set to be 8 V, and the voltage VBLM is set to be 7 V. In the "1"-data write operation, since the flip-flop constituted by the clocked synchronous inverters CI7 and CI8 latches data such that an output from the clocked synchronous inverter CI7 goes to "H" level, a voltage of 7 V is applied to the bit line BL. In a "2"-data write operation, the bit line is set to be 8 V. In a "0"-data write operation, the bit line is set to be 0 V. Thereafter, the selected control gate WL is set to be −12 V.

In a "1"- or "2"-data write operation, electrons are discharged from the charge accumulation layers of the memory cells by the potential difference between the bit line BL and the control gate WL, and the threshold voltages of the memory cells decrease. In the "1"-data write operation, a total amount of charge to be removed from the charge accumulation layers of the memory cells must be smaller than that in the "2"-data write operation. For this reason, the bit line BL is set to be 7 V to relax the potential difference between the bit line BL and the control gate WL to 19 V. In a "0"-data write operation, the threshold voltages of the memory cells are not effectively changed by a bit line voltage of 0 V.

After the write operation, a verify read operation is performed to check the written states of the memory cells and perform an additional write operation to only a memory cell in which data is not sufficiently written. During the verify read operation, the voltages VBLH and FIM are set to be Vcc and 0 V, respectively. The verify read operation is executed through two basic cycles. Each of the basic cycles is almost identical to the second read cycle except that the voltage of the selected control gate WL and signals VRFY1, VRFY2, and FIL are output (only the signal VRFY1 is output in the first verify read cycle). The signals VRFY1, VRFY2, and FIL are output before the signals SEN1, SEN1B, LAT1, and LAT1B go to "L" level, "H" level, "L" level and "H" level, respectively, after the control gate WL is reset to 0 V. In other words, the signals VRFY1, VRFY2, and FIL are output before the flip-flop constituted by the clocked synchronous inverters CI5 and CI6 is reset after the potential of the bit line is determined by the threshold voltages of the memory cells. The potential of the selected control gate WL is set to be 2 V (first cycle) and 4 V (second cycle) which are respectively lower than 2.5 V (first cycle) and Vcc (second cycle) in the read operation to assure a threshold voltage margin.

In this case, data (data 1) latched in the flip-flop constituted by the clocked synchronous inverters CI5 and CI6, data (data 2) latched in the flip-flop constituted by the clocked synchronous inverters CI7 and CI8, and the voltage of the bit line BL determined by the threshold voltage of a selected memory cell will be described below. The data 1 controls a "0"-data write operation or a "1"- or "2"-data write operation. The n-channel MOS transistor Qn20 is set in an "ON" state when the "0"-data write operation is performed, and the n-channel MOS transistor Qn23 is set in an "ON" state when the "1"- or "2"-data write operation is performed. The data 2 controls a "1"-data write operation or "2"-data write operation. The n-channel MOS transistor Qn26 is set in an "ON" state when the "1"-data write operation is performed, and the n-channel MOS transistor Qn27 is set in an "ON" state when the "2"-data write operation is performed.

In the first verify read cycle in the "0"-data write operation (initial write data is data "0"), the data of the memory cell is data "0". For this reason, when the control gate WL is set to be 2 V, the bit line potential is kept at "H" level. Thereafter, when signal VRFY1 goes to "H" level, the potential of the bit line BL goes to "L" level.

In the first verify read cycle in the "1"), since the data of the memory cell is to be data "1", the threshold voltage of the memory cell is 2.5 V or more. When the control gate WL is set to be 2 V, the bit line potential is kept at "H" level. Thereafter, the signal VRFY1 goes to "H" level. In this case, when data verify is sufficiently written by the previous verify read cycles in advance, and the data 1 is converted into data for controlling the "0"-data write operation, the potential of the bit line BL goes to "L" level ((2) in FIG. 14); otherwise, "H" level ((1) in FIG. 14).

In the first verify read cycle in the "2"-data write operation (initial write data is data "2"), when the data of the selected memory cell is not data "2" (data "2" is not sufficiently written), even when the control gate WL is set to be 2 V, the bit line potential is kept at "H" level ((3) in FIG. 14). When data "2" is sufficiently written in the selected memory cell, and the control gate WL is set to be 2 V, the memory cell causes the bit line potential to go to "L" level ((4) and (5) in FIG. 14). (5) in FIG. 14 indicates a case wherein data "2" is sufficiently written in the memory cell by the previous verify read cycles in advance, and the data 1 is converted into data for controlling the "0"-data write operation by the previous verify read cycle. In this case, when the signal VRFY1 goes to "H" level, the bit line BL is grounded.

In the second verify read cycle in the "0"-data write operation (initial write data is data "0"), assume the data of the memory cell is data "0". For this reason, even when the control gate WL is set to be 4 V, the bit line potential is kept at "H" level. Thereafter, when the signal VRFY1 goes to "H" level, the potential of the bit line BL goes to "L" level.

The following table (Table 5) shows the potential at BL and WL of the memory cell array in an erase operation, a write operation, and a verify read operation.

TABLE 5

| | Erase | Write Operation | | | Read Operation | | Verify Read Operation | |
|---|---|---|---|---|---|---|---|---|
| | Operation | "0" | "1" | "2" | First Cycle | Second Cycle | First Cycle | Second Cycle |
| BL | 0 V | 0 V | 7 V | 8 V | "L" only when data "2" is read | "H" only when data "0" is read | See FIG. 14 | |
| WL | 20 V | | −12 V | | 2.5 V | 5 V | 2.0 V | 4.0 V |

In the second verify read cycle in the "1"-data write operation (initial write data is data "1"), if the data of the selected memory cell is not data "1" (data "1" is not sufficiently written), even when the control gate WL is set to be 4 V, the bit line potential "H" is kept at "H" level ((6) in FIG. 14). When data "1" is sufficient written in the selected memory cell, when the voltage of the control gate WL becomes 4 V, the bit line potential goes to "L" level ((7) and (8) in FIG. 14). (8) in FIG. 14 indicates a case wherein data "1" is sufficiently written in the memory cell by the previous verify read cycles in advance, and the data 1 is converted into data for controlling the "0"-data write operation. In this case, when the signal VRFY1 goes to "H" level, the bit line BL is grounded.

In the second verify read cycle in the "2"-data write operation (initial write data is data "2"), the data of the memory cell is to be data "2". For this reason, assuming that the threshold voltage of the memory cell is 4 V or less, even when data "2" is sufficiently written or is not sufficiently written in the memory cell, and the control gate WL is set to be 4 V, the bit line potential goes to "L" level ((10) and (11) in FIG. 14), when data "2" is not sufficiently written in the memory cell, and the threshold voltage of the memory cell is 4 V or more, the bit line potential goes to "H" level ((9) in FIG. 14).

Thereafter, when the signals VRFY1, VRFY2, and FIL go to "H" level, data "2" is sufficiently written, and the data 1 is converted into data for controlling a "0"-data write operation. In this case, the potential of the bit line BL goes to "L" level ((11) in FIG. 14); otherwise, "H" level ((9) and (10) in FIG. 14).

With the above verify read operation, rewrite data are set as shown in the following Table 1 on the basis of the write data and the written states of the memory cells, as in the first embodiment. In addition, when data are sufficiently written in all the memory cells, the n-channel MOS transistors Qn30 of all columns are set in an "OFF" state, and data write operation end information is output by a signal PENDB.

Data input/output operation timings, a data write algorithm, and an additional data write algorithm in the second embodiment are the same as those of the first embodiment as shown in FIGS. 7 to 9 and Tables 2 and 3.

Figure 15:
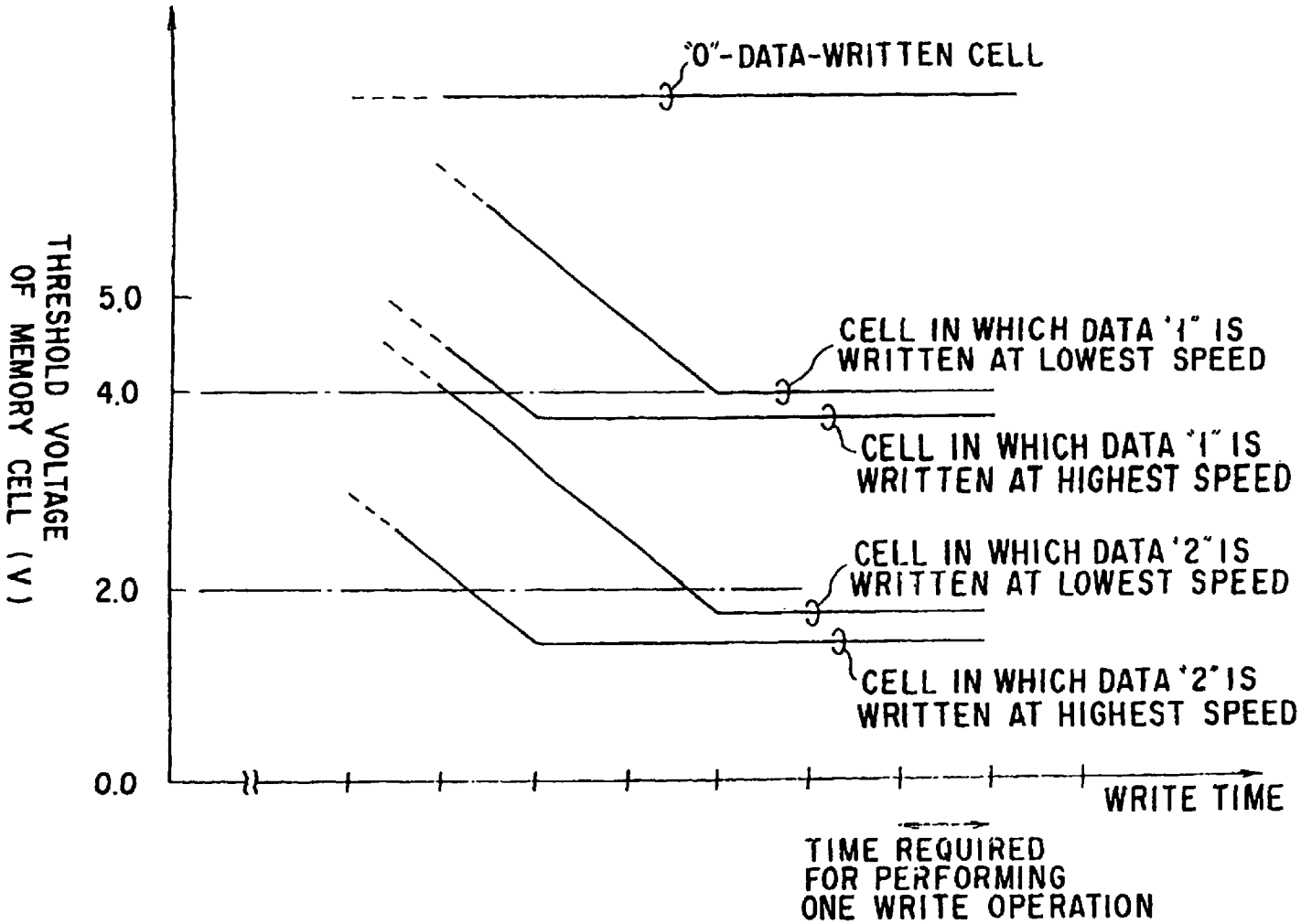
FIG. 15 is a graph showing the write characteristics of the memory cell in the second embodiment.

FIG. 15 shows write characteristics with respect to the threshold voltages of memory cells in the EEPROM described above. A write operation in a memory cell in which data "1" is to be written and a write operation in a memory cell in which data "2" is to be written are performed at once, and write periods of time are independently set for these memory cells.

Figure 16:
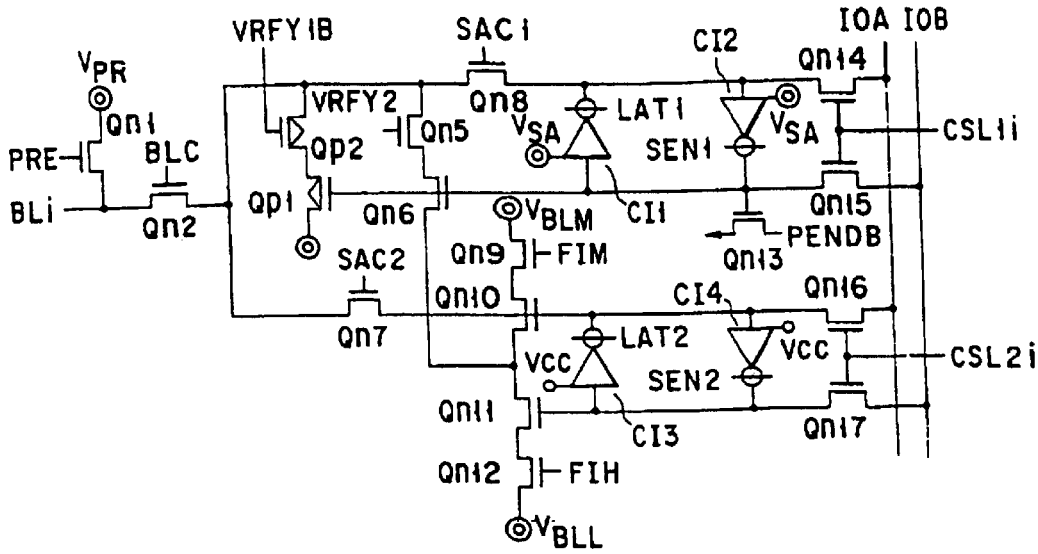
FIG. 16 is a circuit diagram showing a modification of the bit line control circuit in the first embodiment.
Figure 17:
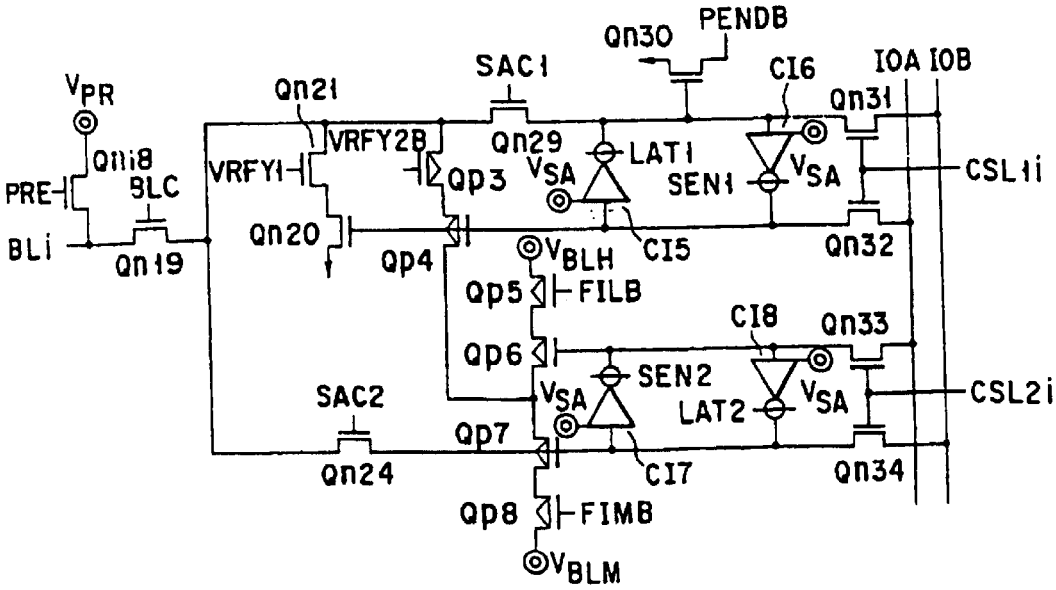
FIG. 17 is a circuit diagram showing a modification of the bit line control circuit in the second embodiment.

The circuits shown in FIGS. 3 and 11 can be modified into, e.g., the circuits shown in FIGS. 16 and 17, respectively. Referring to FIG. 16, the n-channel MOS transistors Qn3 and Qn4 are replaced with p-channel MOS transistor Qp1 and Qp2, respectively. Referring to FIG. 17, the n-channel MOS transistors Qn22 and Qn23 and the n-channel MOS transistors Qn25 to Qn28 are replaced with p-channel MOS transistors Qp3 to Qp8 with the above arrangement, a voltage which can be transferred through transistors can be prevented from dropping according to the threshold voltage of the n-channel MOS transistor. In this embodiment, since it is required only to increase the voltage VSA to 8 V, the breakdown voltage of the transistors constituting the above circuit can be decreased. A signal VRFY1B in FIG. 16 is the inverted signal of the VRFY1 in FIGS. 2 and 3. Signals VRFY2B, FILB, and FIMB are inverted signals of the signals VRFY2, FIL, and FIM in FIG. 11, respectively.

Figure 18:
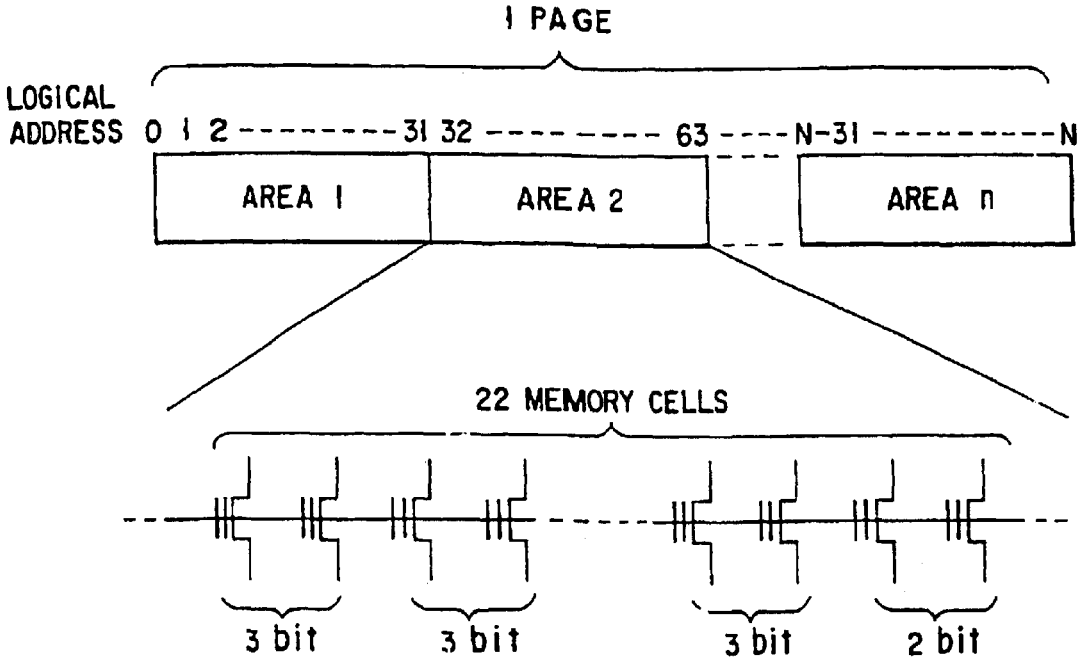
FIG. 18 is a view showing a unit for an additional data write operation in the first and second embodiments.

The additional data write operation is described in FIG. 8. For example, as shown in FIG. 18, it is one effective method that one page is divided into areas to easily perform an additional data write operation. In this embodiment, one area is constituted by 22 memory cells set every 32 logical addresses. In this manner, an additional data write operation in units of areas can be easily performed. More specifically, when additional data is to be written in the area 2, the write data in all areas except for the area 2 are set to be data "0", and the additional data may be written in the area 2 according to the data write algorithm shown in FIG. 9A. Each area may have a size except for the size of each of the areas shown in FIG. 18.

Figure 20:
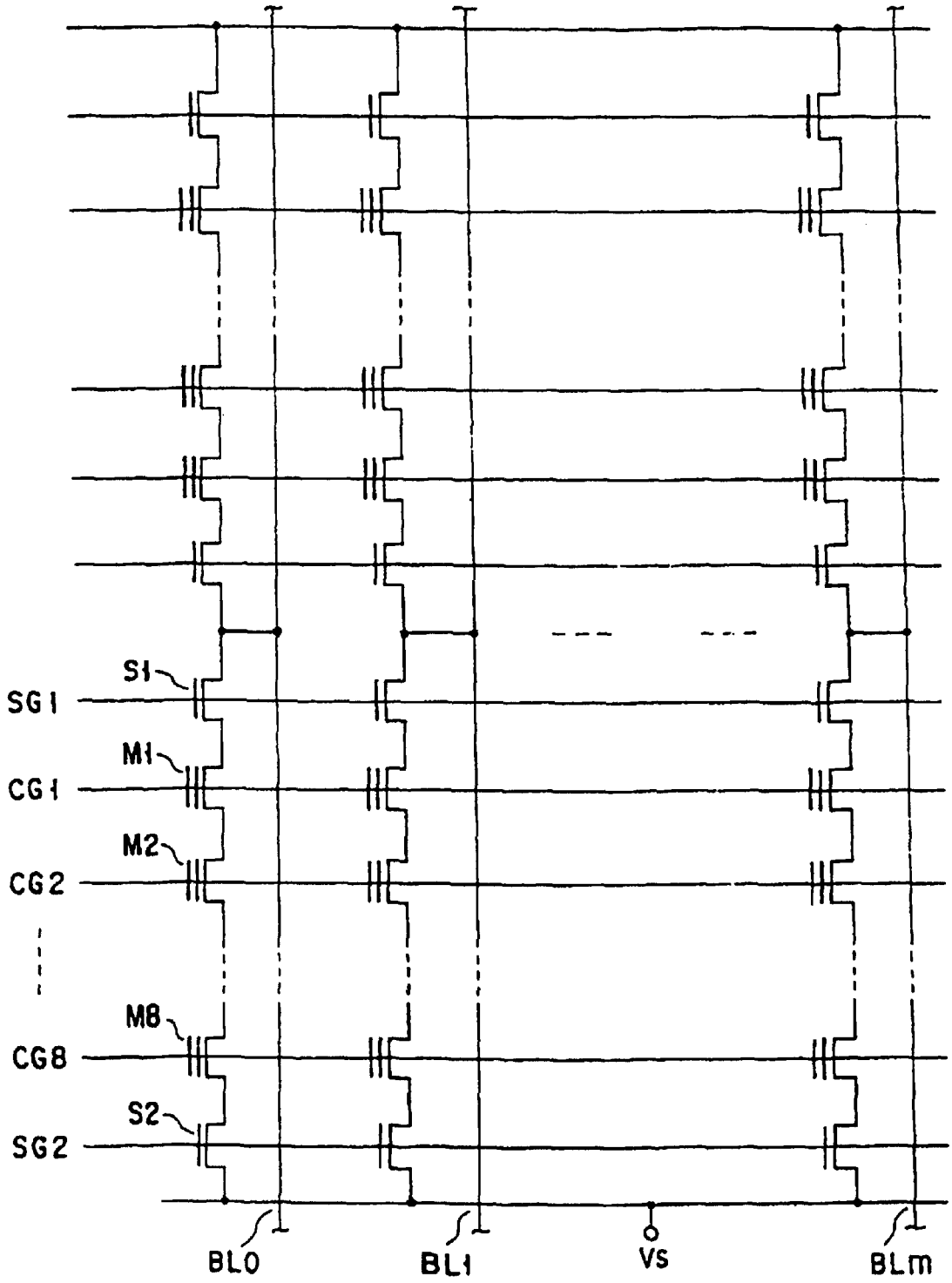
FIG. 20 is a circuit diagram showing the arrangement of a NAND cell array according to the third embodiment of the present invention.

FIG. 20 shows a memory cell array 1 of a NAND-cell EEPROM according to the third embodiment of the present invention. The memory cell array 1 is formed on a p-type well or a p-type substrate, and eight memory cells M1 to M8 are connected in series between a selection transistor S1 connected to a bit line BL and a selection transistor S2 connected to a common source line Vs, thereby constituting one NAND cell. The selection transistors S (S1 and S2) have selection gates SG (SG1 and SG2), respectively. The memory cells have floating gates (charge accumulation layers) and control gates CG (CG1 to CGS) which are stacked and formed on each other. The memory cells store information by using amounts of charges accumulated in the floating gates of the memory cells. The amounts of accumulated charges can be read out as the threshold voltages of the corresponding memory cells.

Figure 21A:
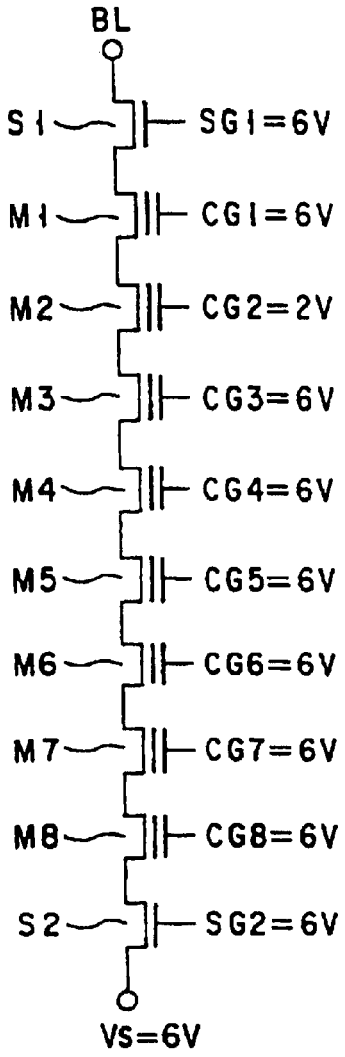
FIGS. 21A and 21B are a circuit diagram and a chart, respectively, showing the read operation of the NAND cell in the third embodiment.
Figure 21B:
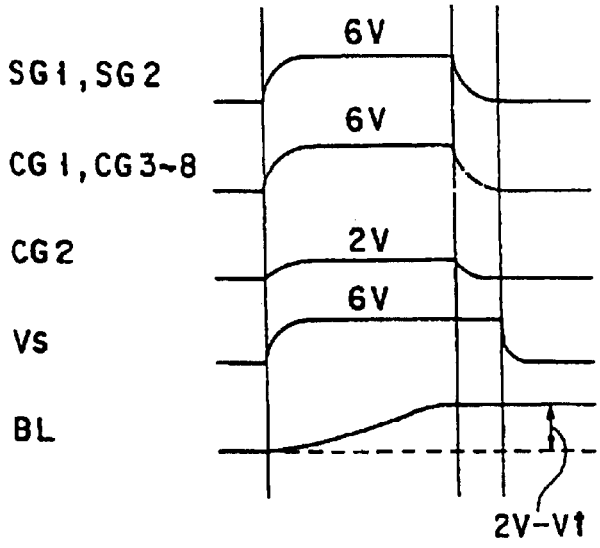

In the present invention, such as threshold voltage is read out as shown in FIGS. 21A and 21B. In this case, the memory cell M2 having the control gate CG2 is selected. As shown in FIG. 21A, a voltage is applied to each portion, and the bit line BL is set in a floating state. When the bit line BL is reset to 0 V in advance, the bit line BL is charged by the common source line Vs through the NAND cell. The selection gate voltages and control gate voltages are controlled such that the potential of the charged bit line BL is determined by the threshold voltage of the selected memory cell M2.

In this embodiment, the selection gates SG1 and SG2, the control gates CG1 and CG3 to CG8 are set to be 6 V, the selected control gate CG2 is set to be 2 V, and the common source line Vs is set to be 6 V. The voltage waveforms of these parts are shown in FIG. 21B. In this case, a threshold voltage of 2 V or less can be read out. When the threshold voltage of each non-selected memory cell is controlled to be 2.5 V or less, a threshold voltage of −1.5 V or more can be read out. When the potential of the bit line BL is 0 V, a threshold voltage of 2 V or more can be read out; when the bit line potential is 3.5 V, a threshold voltage of −1.5 V or less can be read out. When the voltages of the selection gates SG1 and SG2 and the non-selected control gates CG1 and CG3 to CG8 are made sufficiently high, a threshold voltage of up to −4 V can also be read out.

Figure 22:
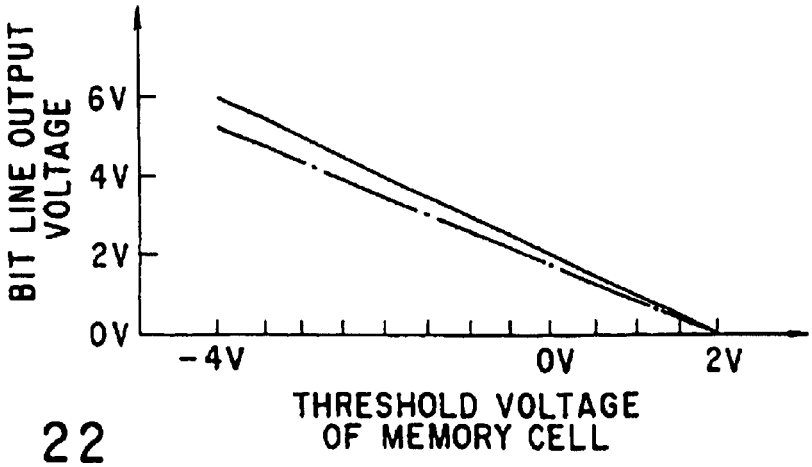
FIG. 22 is a graph showing the relationship between a bit line output voltage in a read operation and the threshold voltage of a memory cell in the third embodiment.

The relationship between the threshold voltage of the memory cell and a bit line output voltage in this case is shown in FIG. 22. When calculation is performed on the basis of a threshold voltage obtained when a back bias voltage is 0 V, a solid line in FIG. 22 is obtained. However, the bit line voltage becomes equal to the back bias voltage in practice, and the bit line output voltage decreases as indicated by a chain line in FIG. 22. For the sake of descriptive convenience, a threshold voltage is obtained in consideration of a back bias voltage hereinafter, unless otherwise specified.

After electrons are discharged from the floating gate of the memory cell by an erase operation, electrons are injected into the floating gate by a write operation performed according to write data. FIG. 23 shows the relationship between a write time and a bit line output voltage in a read operation when a bit line output voltage in the read operation is not limited to the threshold voltage of each non-selected memory cell. For example, when the voltage of the common source line in the read operation is 3 V, the bit line output voltage does not change unless the threshold voltage becomes −1 V or more, as a result of electron injection into the floating gate. Even when the voltage of the common source line is 6 V, when the threshold voltage of each non-selected memory cell is positive, the bit line output voltage in the read operation is limited.

Figure 24:
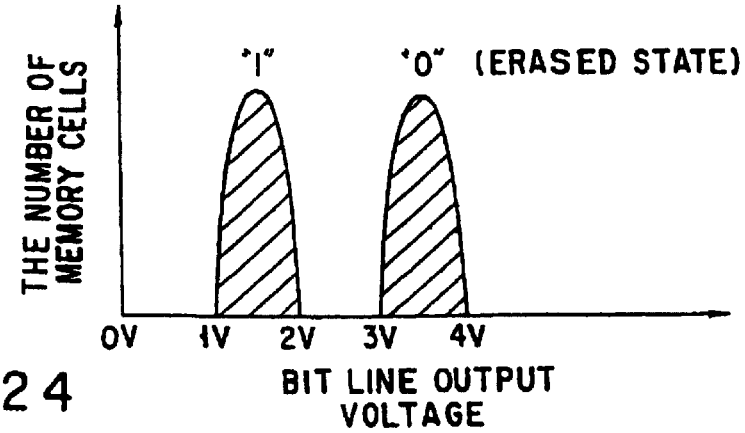
FIG. 24 is a graph showing the relationship between data and a bit line output voltage in a read operation when a binary storing operation is performed to one memory cell in the third embodiment.

When one memory cell has two states (data "0" and data "1"), for example, as shown in FIG. 24, a state in which the bit line output voltage in a read operation becomes 3 to 4 V (threshold voltage of about −2 V to −1 V) may be set as data "0" (erased state), and a state in which the bit line output voltage becomes 1 to 2 V (threshold voltage of about 0 to 1 V) may be set as data "1".

Figure 25:
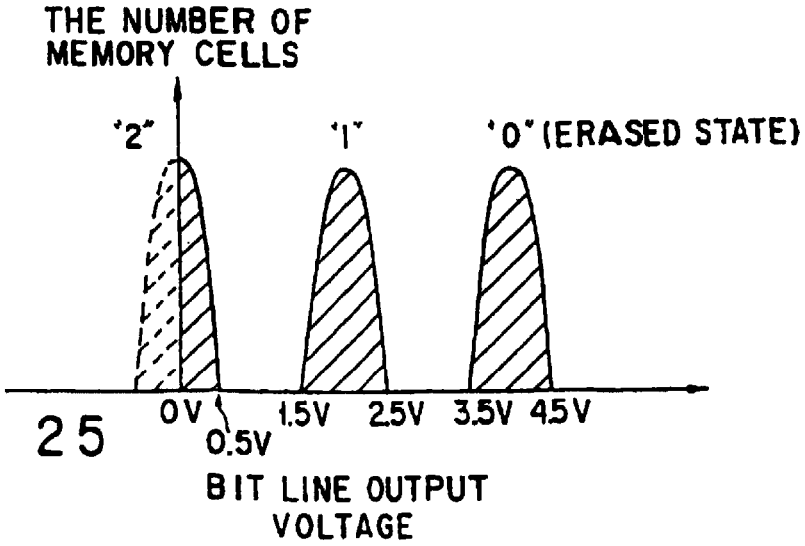
FIG. 25 iS a graph showing the relationship between data and a bit line output voltage in a read operation when a ternary storing operation is performed to one memory cell in the third embodiment.

When one memory cell has three states (data "0", data "1", and data "2"), for example, as shown in FIG. 25, a state in which the bit line output voltage in a read operation becomes 3.5 to 4.5 V (threshold voltage of about −2.5 V to −1.5 V) may be set as data "0" (erased state), a state in which the bit line output voltage becomes 1.5 to 2.5 V (threshold voltage of about −0.5 to 0.5 V) may be set as data "1", and a state in which the bit line output voltage becomes 0 to 0.5 V (threshold voltage of about 1.5 to 2.5 V) may be set as data "2".

Figure 26:
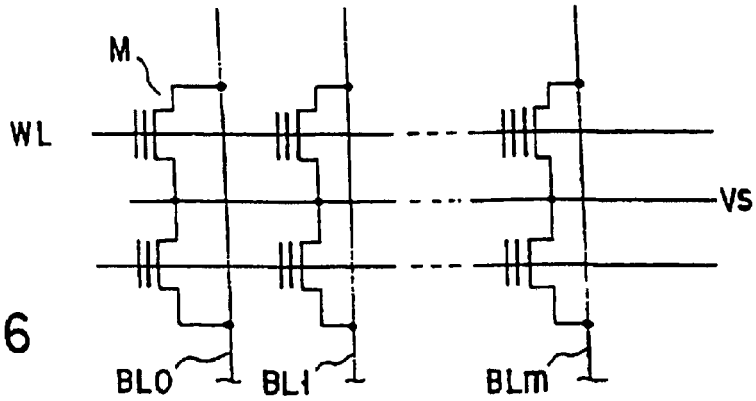
FIG. 26 is a circuit diagram showing the arrangement of a NOR cell array according to the fourth embodiment of the present invention.

FIG. 26 shows a memory cell array 1 of a NOR-cell EEPROM according to the fourth embodiment of the present invention. The memory cell array 1 is formed on a p-type well or a p-type substrate, and each memory cell M is arranged between a bit line BL and a common source line Vs. Each memory cell has a floating gate and a word line WL which are stacked and formed on each other.

Figure 27A:
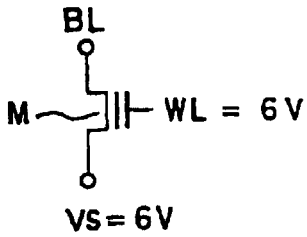
FIGS. 27A and 27B are a circuit diagram and a chart, respectively, showing the read operation of a NOR cell in the fourth embodiment.
Figure 27B:
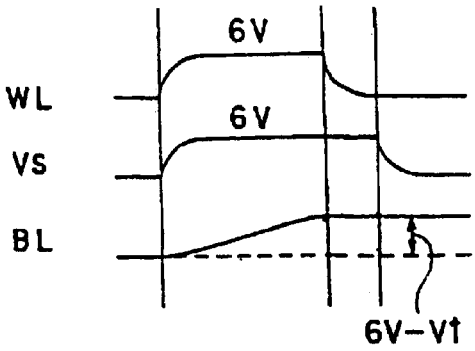

The threshold voltages of the memory cells are read out as shown in FIGS. 27A and 27B. Voltages are applied as shown in FIG. 27A, and the bit line BL is set in a floating state. When the bit line BL is reset to 0 V in advance, the bit line BL is charged by the common source line Vs through the memory cell. The potential of the charged bit line BL is determined by the threshold voltage of selected memory cell M.

Figure 28:
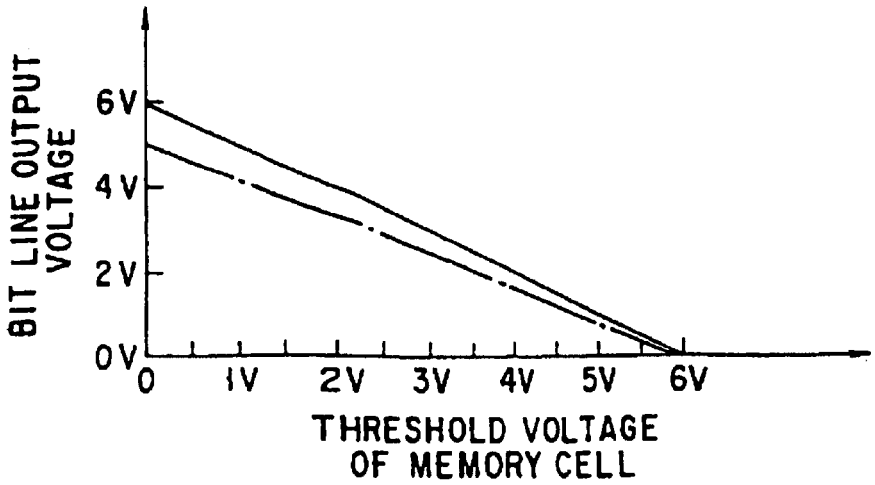
FIG. 28 is a graph showing the relationship between a bit line output voltage in a read operation and the threshold voltage of a memory cell in the fourth embodiment.

In this embodiment, the word line WL is set to be 6 V, and the common source line Vs is set to be 6 V. The voltage waveforms of these parts are shown in FIG. 27B. In this manner, a threshold voltage of 0 to 6 V can be read out. When the potential of the bit line BL is 0 V, a threshold voltage of 6 V or more can be read out; when the bit line potential is 6 V, a threshold voltage of 0 V or less can be read out. The relationship between the threshold voltage of the memory cell and a bit line output voltage in this case is shown in FIG. 28. When a calculation is performed on the basis of a threshold voltage at a back bias voltage of 0 V, a solid line in FIG. 28 is obtained. However, as in FIG. 22, the bit line voltage becomes equal to the back bias voltage in practice, and the bit line output voltage decreases as indicated by a chain line in FIG. 28.

After electrons are injected into the floating gate of the memory cell by an erase operation, the electrons are discharged from the floating gate by a write operation performed according to write data. FIG. 29 shows the relationship between a write time and a bit line output voltage in a read operation. For example, in the case of the voltage of the common source line in the read operation is 3 V, when the threshold voltage becomes 3 V or less according to electron discharge from the floating gate, the bit line output voltage does not change. Even when the voltage of the common source line is 6 V, the bit line output voltage in the read operation does not change at the threshold voltage of 0 V or less.

When one memory cell has two states (data "0" and data "1"), for example, as shown in FIG. 30, a state in which the bit line output voltage in a read operation becomes 1 to 2 V (threshold voltage of about 4 V to 5 V) may be set as data "0" (erased state), and a state in which the bit line output voltage becomes 3 to 4 V (threshold voltage of about 2 to 3 V) may be set as data "1".

Figure 31:
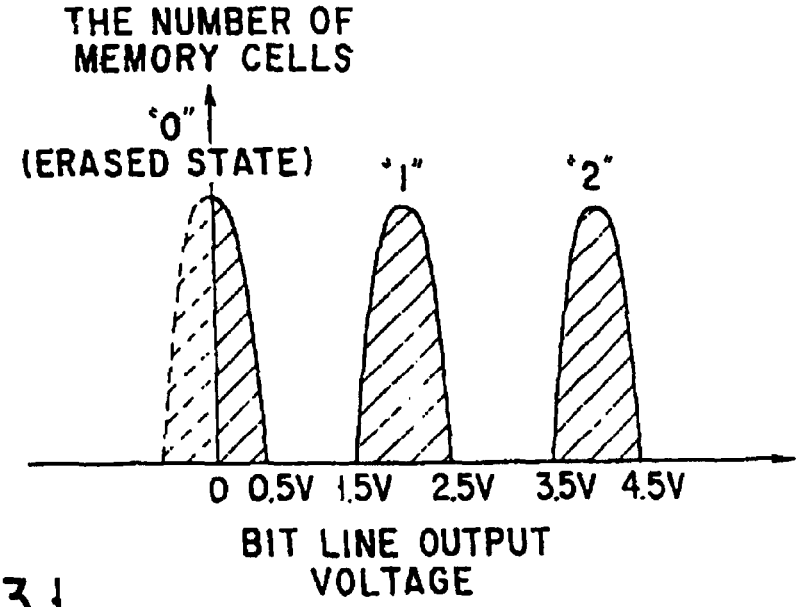
FIG. 31 is a graph showing the relationship between data and a bit line output voltage in a read operation when a ternary storing operation is performed to one memory cell in the fourth embodiment.

When one memory cell has three states (data "0", data "1", and data "2"), for example, as shown in FIG. 31, a state in which the bit line output voltage in a read operation becomes 0 to 0.5 V (threshold voltage of about 5.5 V or more) may be set as data "0" (erased state), a state in which the bit line output voltage becomes 1.5 to 2.5 V (threshold voltage of about 3.5 to 4.5 V) may be set as data "1", and a state in which the bit line output voltage becomes 3.5 to 4.5 V (threshold voltage of about 1.5 to 2.5 V) may be set as data "2".

Figure 32:
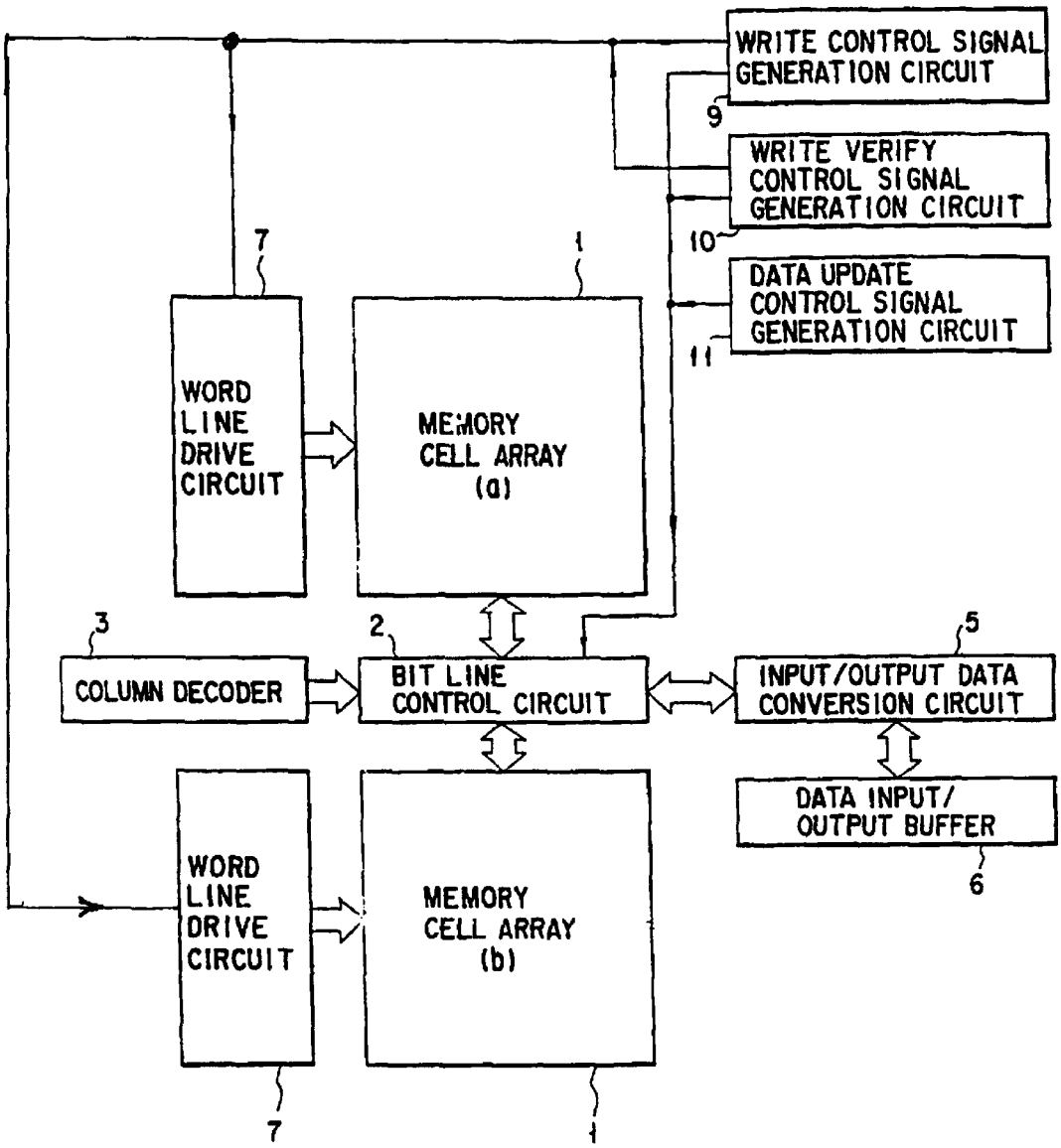
FIG. 32 is a block diagram showing the arrangement of an EEPROM according to the third and fourth embodiments.

FIG. 32 shows the arrangement of a ternary storage type EEPROM according to the third and fourth embodiments of the present invention. For memory cell arrays 1 ((a) and (b)), a bit line control circuit 2 for controlling a bit line in read/write operations and a word line drive circuit 7 for controlling a word line potential are arranged. The bit line control circuit 2 is selected by a column decoder 3. The bit line control circuit 2 receives and outputs read/write data from/to an input/output data conversion circuit 5 through a data input/output line (IO line). The input/output data con10 version circuit 5 converts multivalue information of a read-out memory cell into binary information to externally output the multivalue information, and converts the binary information of external input write data into the multivalue information of a memory cell. The input/output data conversion circuit 5 is connected to a data input/output buffer 6 for controlling a data input/output operation with an external circuit.

Figure 33:
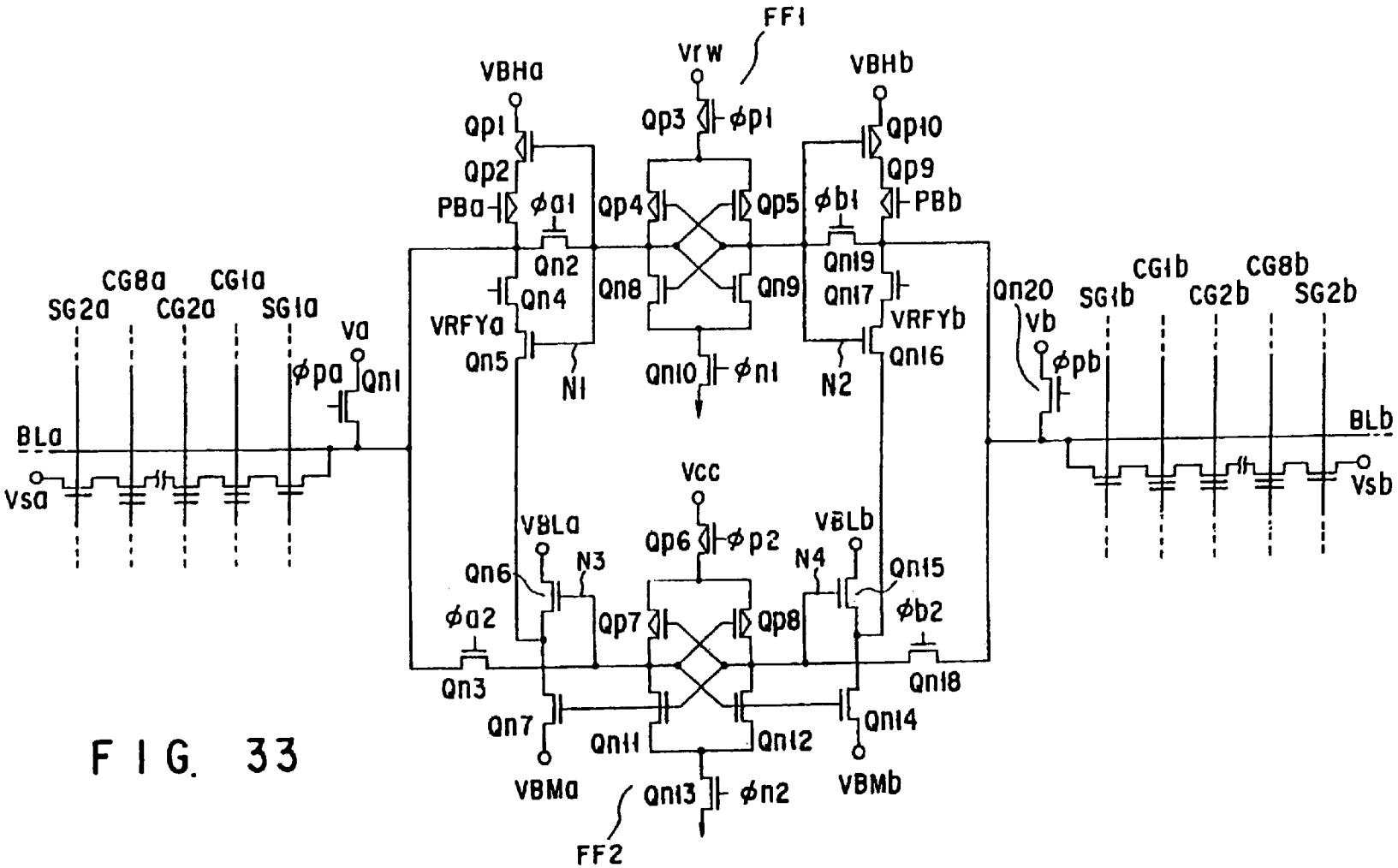
FIG. 33 is a circuit diagram showing the arrangements of a memory cell array and a bit line control circuit in the third embodiment.

FIG. 33 shows the detailed arrangements of a memory cell array 1 and a bit line control circuit 2 in a NAND-cell EEPROM according to the third embodiment of the present invention. One terminal of the NAND cell is connected to a bit line BL, and the other terminal is connected to a common source line Vs. Selection gates SG1 and SG2 and control gates CG1 to CG8 are shared by a plurality of NAND cells, and memory cells M which share one control gate constitute a page. Each of the memory cells M stores data at a threshold voltage Vt thereof. As shown in FIG. 25, the memory cell stores data "0", data "1", and data "2". One memory cell has three states, and nine combinations can be obtained by two memory cells. Of these nine combinations, eight combinations are used, and data of three bits are stored in the two memory cells.

In this embodiment, data of three bits are stored in a pair of adjacent memory cells which share a control gate. In addition, the memory cell arrays 1 ((a) and (b)) are formed on dedicated p-type wells, respectively.

N-channel MOS transistors (n-ch Trs.) Qn8 and Qn10 and p-channel MOS transistors (p-ch Trs.) Qp3 to Qp5 constitute a flip-flop FF1, and n-ch Trs. Qn11 to Qn13 and p-ch Trs. Qp6 to Qp8 constitute a flip-flop FF2. These flip-flops latch write/read data. The flip-flops are also operated as sense amplifiers. The flip-flop FF1 latches write data information indicating whether data "0" or data "1" or "2" is to be written, and latches read data information indicating whether a memory cell stores the information of data "0" or the information of data "1" or "2". The flip-flop FF2 latches write data information indicating whether data "1" or "2" is to be written, and latches read data information indicating whether a memory cell stores the information of data "2" or the information of data "0" or "1".

An n-ch Tr. Qn1 transfers a voltage Va to a bit line BLa when a precharge signal ϕpa goes to "H" level. An n-ch Tr. Qn20 transfers a voltage Vb to a bit line BLb when a precharge signal ϕpb goes to "H" level. N-ch Trs. Qn4 to Qn7 and p-ch Trs. Qp1 and Qp2 selectively transfer voltages VBHa, VBMa, and VBLa to the bit line BLa in accordance with the data latched in the flip-flops FF1 and FF2. N-ch Trs. Qnt4 to Qn17 and p-ch Trs. Qp9 and Qp10 selectively transfer voltages VBHb, VBMb, and VBLb to the bit line BLb in accordance with the data latched in the flip-flops FF1 and FF2. An n-ch Tr. Qn2 connects the flip-flop FF1 to the bit line BLa when a signal ϕa1 goes to "H" level. An n-ch Tr Qn3 connects the flip-flop FF2 to the bit line BLa when a signal ϕa2 goes to "H". An n-ch Tr. Qn19 connects the flip-flop FF1 to the bit line BLb when a signal ϕb1 goes to "H" level. An n-ch Tr. Qn18 connects the flip-flop FF2 to the bit line BLb when a signal ϕb2 goes to "H" level.

Figure 34:
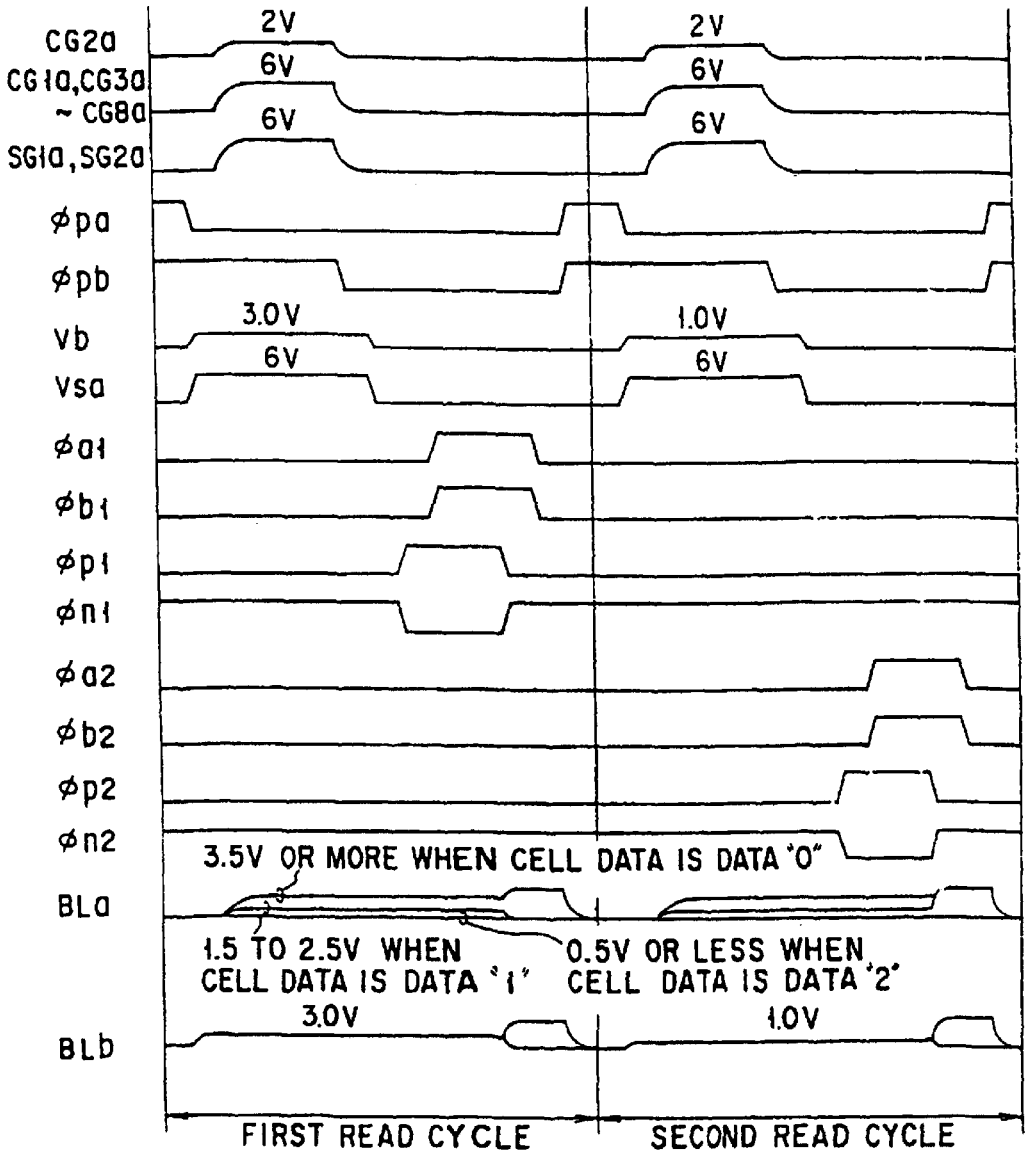
FIG. 34 is a timing chart showing a read operation in the third embodiment.
Figure 35:
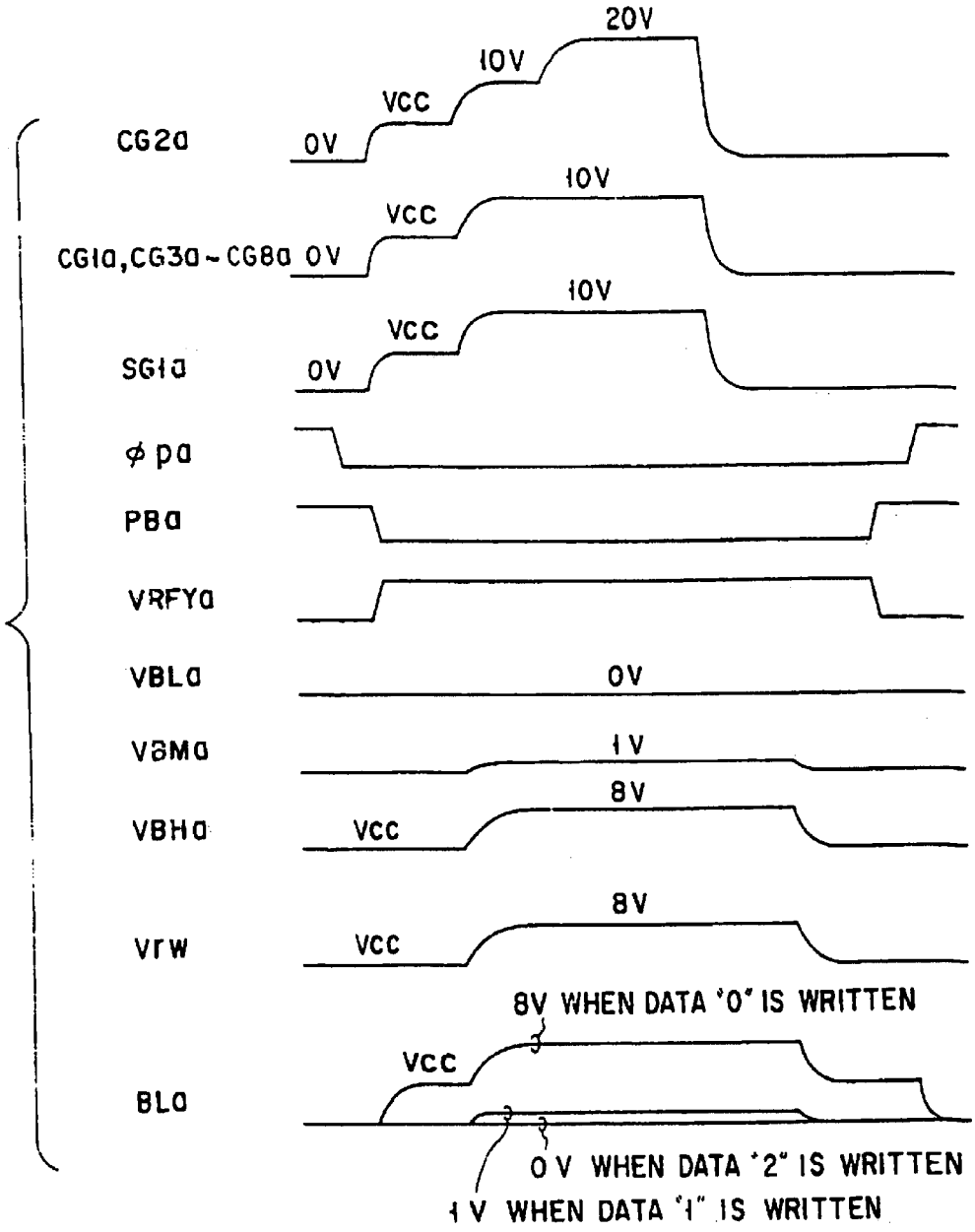
FIG. 35 is a timing chart showing a write operation in the third embodiment.
Figure 36:
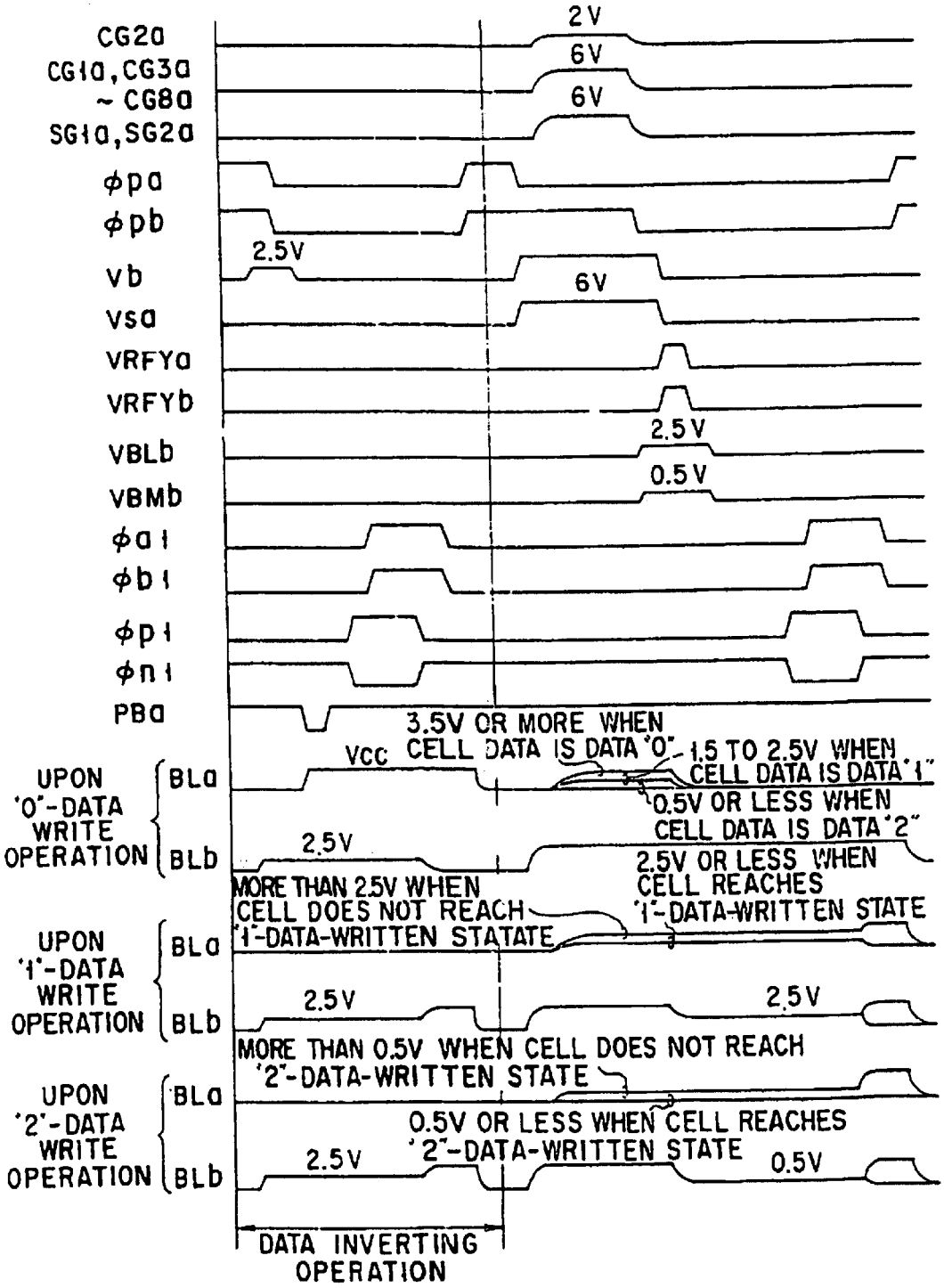
FIG. 36 is a timing chart showing a verify read operation in the third embodiment.

The operation of the EEPROM arranged as described above will be described below with reference to FIGS. 34 to 36. FIG. 34 shows read operation timings, FIG. 35 shows write operation timings, and FIG. 36 shows verify read operation timings. FIGS. 34 to 36 show timings obtained when a control gate CG2a is selected.

The read operation is executed by two basic cycles. In the first read cycle, the voltage Vb is set to be 3 V, and the bit line BLb serving as a dummy bit line is precharged. The precharge signal ϕpa goes to "L" level to cause the bit line BLa to float, and a common source line Vsa is set to be 6 V. Subsequently, selection gates SG1a and SG2a and control gates CG1a and CG3a to CG8a are set to be 6 V. At the same time, the selected control gate CG2a is set to be 2 V. Only when data "0" is written in the selected memory cell, the voltage of the bit line BLa is set to be 3 V or more.

Thereafter, flip-flop activation signals ϕn1 and ϕp1 go to "L" level and "H" level, respectively, to reset the flip-flop FF1. The signals ϕa1 and ϕb1 go to "H" level to connect the flip-flop FF1 to the bit lines BLa and BLb. The signals ϕn1 and ϕp1 go to "H" level and "L" level, respectively, to sense a bit line potential, and the flip-flop FF1 latches the information of data "0" or the information of data "1" or "2".

In the second read cycle, unlike the first read cycle, the voltage of the dummy bit line BLb is not 3 V but is 1 V, and signals ϕa2, ϕb2, ϕn2, and ϕp2 are output in place of the signals ϕa1, ϕb1, ϕn1, and ϕp1. Therefore, in the second read cycle, the flip-flop FF2 latches the information of data "2" or the information of data "1" or "0".

With the two read cycles described above, the data written in the memory cells are read out.

Data in the memory cells are erased prior to a data write operation, and the threshold voltages Vt of the memory cells are set to be −1.5 V or less. The common source line Vsa and the selection gates SG1a and SG2a are set to be 20 V, and the control gates CG1a to CG8a are set to be 0 V, thereby performing an erase operation.

In the write operation, the precharge signal ϕpa goes to "L" level to cause the bit line BLa to float. The selection gate SG1a is set to be Vcc, and the control gates CG1a to CG8a are set to be Vcc. The selection gate SG2a is set to be 0 V during the write operation. At the same time, a signal VRFYa goes to "H" level, and a signal PBa goes to "L" level. In a "0"-data write operation, since the flip-flop FF1 latches data such that the potential of a node N1 goes to "L" level, the bit line BLa is charged to Vcc by the voltage VBHa. In a "1"- or "2"-data write operation, the bit line BLa is set to be 0 V.

Subsequently, the selection gate SG1a and the control gates CG1a to CG8a are set to be 10 V, the voltage VBHa and a voltage vrw are set to be 8 V, and the voltage VBMa is set to be 1 V. In the "1"-data write operation, since the flip-flop FF2 latches data such that the potential of a node N3 goes to "L" level, a voltage of 1 V is applied to the bit line BLa by the voltage VBMa. The bit line BLa is set to be 0 V in the "2"-data write operation, and bit line BLa is set to be 8 V in the "0"-data write operation. Thereafter, the selected control gate CG2a is set to be 20 V.

In the "1"- or "2"-data write operation, electrons are injected into the charge accumulation layers of the memory cells by the potential difference between the bit line BLa and the control gate CG2a, and the threshold voltages of the memory cells increase. In a "1"-data write operation, since amounts of charges to be injected into the charge accumulation layers of the memory cells in the "1"-data write operation must be smaller than those in the "2"-data write operation, the bit line BLa is set to be 1 V to relax the potential difference between the bit line BLa and the control gate CG2a to 19 V. In the "0"-data write operation, the threshold voltages of the memory cells do not effectively change according to the bit line voltage of 8 V.

Upon completion of the write operation, the selection gate SG1a and the control gates CG1a to CG8a are set to be 0 V, and then the voltage of the bit line BLa set to be 8 V in the "0"-data write operation is reset to 0 V with a time lag. This is because, when the order of the resetting operations is reversed, a "2"-data write operation state is temporarily set, and erroneous data is written in the "0"-data write operation.

After the write operation, a verify read operation is performed to check the written state of the memory cell and perform an additional write operation to only a memory cell in which data is not sufficiently written.

The verify read operation is similar to the first read cycle except that the data of the flip-flop FF1 is inverted, the voltage Vb is set to be Vcc, the signal VRFYa and a signal VRFYb are output, and at this time, the voltages VBLb and VBMb are set to be 2.5 V and 0.5 V, respectively. The voltage of the bit line BLb is determined by the voltages Vb, VBLb, and VBMb and the data of the flip-flops FF1 and FF2. The signals VRFYa and VRFYb are output before the signals ϕn1 and ϕp1 go to "L" level and "H" level, respectively, after the selection gates SG1a and SG2a and the control gates CG1a to CG8a are reset to 0 V. In other words, the signals VRFYa and VRFYb are output before the flip-flop FF1 is reset after the potential of the bit line BLa is determined by the threshold voltage of the memory cell.

The inverting operation of the data of the flip-flop FF1 will be described below. The voltage Vb is set to be 2.5 V to precharge the bit line BLb serving as a dummy bit line. In addition, the precharge signals ϕpa and ϕpb go to "L" level to cause the bit lines BLa and BLb to float. Subsequently, the signal PBa goes to "L" level, and the bit line BLa is charged to 2.5 V or more only when the potential of the node N1 is set at "L" level. Thereafter, the flip-flop activation signals ϕn1 and ϕp1 go to "L" level and "H" level, respectively, to reset the flip-flop FF1. The signals ϕa1 and ϕb1 go to "H" level to connect the flip-flop FF1 to the bit lines BLa and BLb, and the signals ϕn1 and ϕp1 go to "H" level and "L" level, respectively, to sense a bit line potential. By this operation, the data of the flip-flop FF1 is inverted.

The data (data 1) latched in the flip-flop FF1, the data (data 2) latched in the flip-flop FF2, and the voltages of the bit lines BLa and BLb determined by the threshold voltage of a selected memory cell and obtained after the data inverting operation will be described below. The data 1 controls "0"-data circuit write or "1"- or "2"-data write operation. In the "0"-data write operation, the potential of the node N1 goes to "H" level set upon the data inverting operation. In the "1"- or "2"-data write operation, the potential of the node N1 goes to "L" level set upon the data inverting operation. The data 2 controls "1"-data write operation or "2"-data write operation. The potential of the node N3 goes to "L" level in the "1"-data write operation, and the potential of the node N3 goes to "H" level in the "2"-data write operation.

In the verify read operation performed after the "0"-data write operation, regardless of the states of the memory cells, when the signal VRFYa goes to "H" level, the voltage VBLa or VBMa causes the potential of the bit line BLa to go to "L" level. Therefore, the bit line BLa is sensed by the flip-flop FF1 such that the node N1 goes to "L" level, and rewrite data to be latched is data "0".

In the verify read operation set upon the "1" data write operation, the signal VRFYb goes to "H" level, and the dummy bit line BLb is set to be 2.5 V. When the memory cell is not set in a "1"-data-written state, the voltage of the bit line BLa is 2.5 V or more, and the bit line BLa is sensed by the flip-flop FF1 such that the potential of the node N1 goes to "H" level, and rewrite data to be latched is data "1". When the memory cell reaches the "1"-data-written state, the bit line BLa is 2.5 V or less, the bit line BLa is sensed by the flip-flop FF1 such that the potential of the node N1 goes to "L" level, and rewrite data to be latched is data "0".

In the verify read operation performed after the "2"-data write operation, the signal VRFYb goes to "H" level to set the dummy bit line BLb to be 0.5 V. When the memory cell does not read a "2"-data-written state, the voltage of the bit line BLa is 0.5 or more, the bit line BLa is sensed by the flip-flop FF1 such that the potential of the node N1 goes to "H" level, and rewrite data to be latched is data "2", when the memory cell reaches the "2"-data-written state, the voltage of the bit line BLa is 0.5 V or less, the bit line BLa is sensed by the flip-flop FF1 such that the potential of the node N1 goes to "L" level, and rewrite data to be latched is data "0".

With this verify read operation, rewrite data is set as described in the following table (Table 6) on the basis of write data and the written state of the memory cell.

TABLE 6

| | | | | | | | | |
|---|---|---|---|---|---|---|---|---|
| Write Data | 0 | 0 | 0 | 1 | 1 | 2 | 2 | 2 |
| Memory Cell Data | 0 | 1 | 2 | 0 | 1 | 0 | 1 | 2 |
| Rewrite Data | 0 | 0 | 0 | 1 | 0 | 2 | 2 | 0 |

As is apparent from the table (Table 6), although the "1"-data-written state is to be set, data "1" is written again in only a memory cell in which data "1" is not sufficiently written. Although the "2"-data-written state is to be set, data "2" is written again in only a memory cell in which data "2" is not sufficiently written.

The write operation and the verify read operation are repeatedly performed, thereby performing a data write operation.

The following table (Table 7) shows the potentials at the several points of the memory cell array in an erase operation, a write operation, a read operation, and a verify read operation.

TABLE 7

| | Erase | Write Operation | | | Read Operation | | Verify Read |
|---|---|---|---|---|---|---|---|
| | Operation | "0" | "1" | "2" | First Cycle | Second Cycle | Operation |
| BLa | 20 V | 8 V | 1 V | 0 V | "H" only when data "2" is read | "L" only when data "2" is read | See FIG. 36 |
| SG1a | 20 V | | 10 V | | 6 V | 6 V | 6 V |
| CG1a | 0 V | | 10 V | | 6 V | 6 V | 6 V |
| CG2a | 0 V | | 20 V | | 2 V | 2 V | 2 V |

TABLE 7-continued

| | Erase | Write Operation | | | Read Operation | | Verify Read |
|---|---|---|---|---|---|---|---|
| | Operation | "0" | "1" | "2" | First Cycle | Second Cycle | Operation |
| CG3a | 0 V | | 10 V | | 6 V | 6 V | 6 V |
| CG4a | 0 V | | 10 V | | 6 V | 6 V | 6 V |
| CG5a | 0 V | | 10 V | | 6 V | 6 V | 6 V |
| CG6a | 0 V | | 10 V | | 6 V | 6 V | 6 V |
| CG7a | 0 V | | 10 V | | 6 V | 6 V | 6 V |
| CG8a | 0 V | | 10 V | | 6 V | 6 V | 6 V |
| SG2a | 20 V | | 0 V | | 6 V | 6 V | 6 V |
| Vsa | 20 V | | 0 V | | 6 V | 6 V | 6 V |
| P well | 20 V | | 0 V | | 0 V | 0 V | 0 V |

Figure 37:
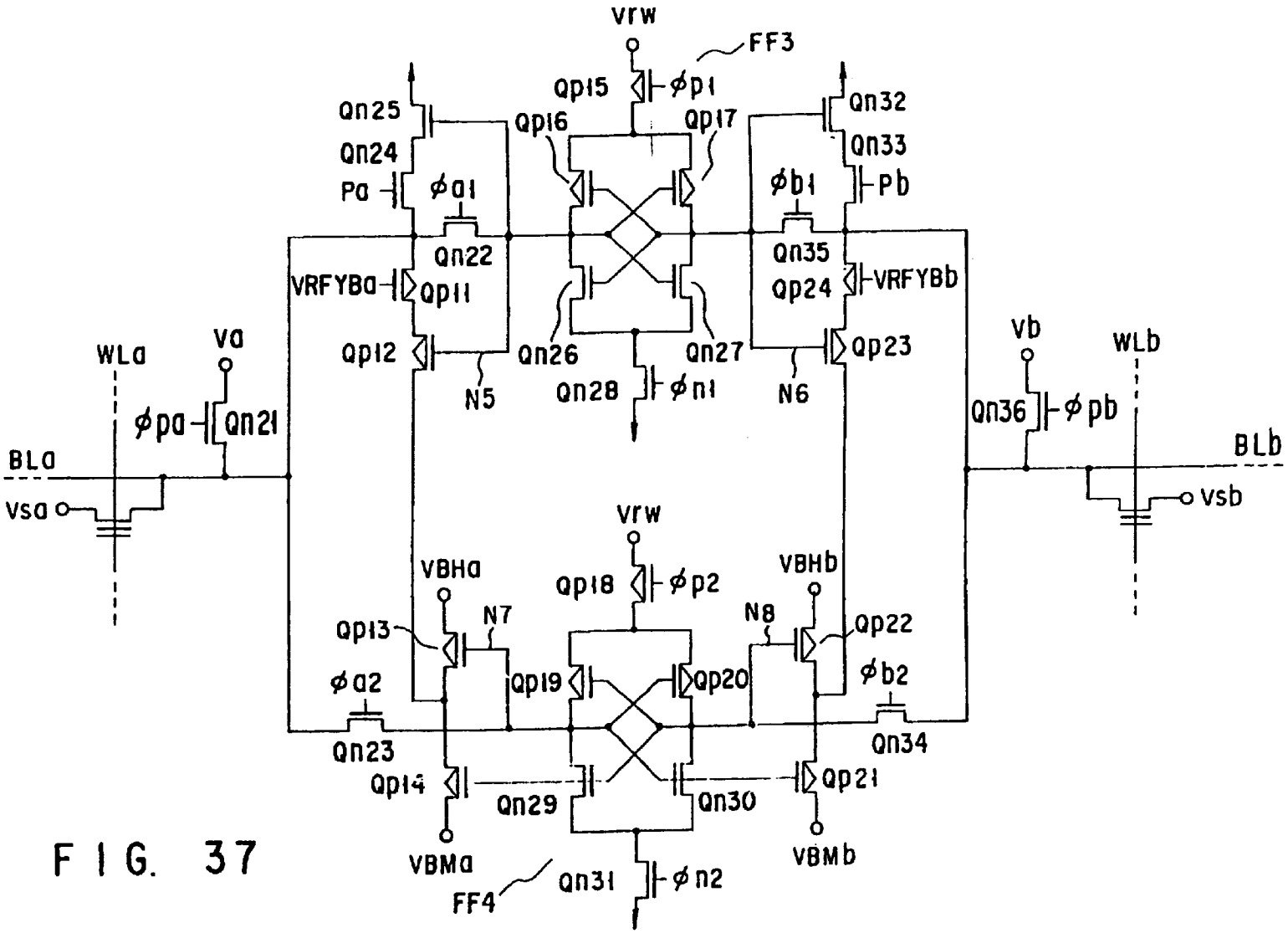
FIG. 37 is a circuit diagram showing the arrangements of a memory cell array and a bit line control circuit in the fourth embodiment.

FIG. 37 shows the detailed arrangement of a memory cell array and a bit line control circuit 2 in a NOR-cell EEPROM according to the fourth embodiment of the present invention. One terminal of a NOR cell is connected to a bit line BL, and the other terminal is connected to a common source line Vs. A word line WL is shared by a plurality of NOR cells, and memory cells M which share one word line constitute a page. Each memory cell stores data by using a threshold voltage Vt of the corresponding memory cell, and as shown in FIG. 31, stores data "0", data "1", and data "2". One memory cell has three states, and nine combinations can be obtained by two memory cells. Of these nine combinations, eight combinations are used, and data of three bits are stored in the two memory cells. In this embodiment, data of three bits are stored in a pair of adjacent memory cells which share a word line. In addition, the memory cell arrays 1 ((a) and (b)) are formed on a p-type substrate.

N-ch Trs. Qn26 to Qn28 and p-ch Trs. Qp15 to Qp17 constitute a flip-flop FF3, and n-ch Trs. Qn29 to Qn31 and p-ch Trs. Qp18 to Qp20 constitute a flip-flop FF4. These flip-flops latch write/read data. The flip-flops are also operated as sense amplifiers. The flip-flop FF3 latches write data information indicating whether data "0" or data "1" or "2" is to be written, and latches read data information indicating whether a memory cell stores the information of data "0" or the information of data "1" or "2". The flip-flop FF4 latches write data information indicating whether data "1" or "2" is to be written, and latches read data information indicating whether a memory cell stores the information of data "2" or the information of data "0" or "1".

An n-ch Tr. Qn21 transfers a voltage Va to a bit line BLa when a precharge signal ϕpa goes to "H" level. An n-ch Tr. Qn36 transfers a voltage Vb to a bit line BLb when a precharge signal ϕpb goes to "H" level. N-ch Trs. Qn24 and Qn25 and p-ch Trs. Qp11 to Qp14 selectively transfer voltages VBHa and VBMa and a voltage of 0 V to the bit line BLa in accordance with the data latched in the flip-flops FF3 and FF4. N-ch Trs. Qn32 and Qn33 and p-ch Trs. Qp21 to Qp24 selectively transfer voltages VBHb and VBMb and a voltage of 0 V to the bit line BLb in accordance with the data latched in the flip-flops FF3 and FF4. An n-ch Tr. Qn22 connects the flip-flop FF3 to the bit line BLa when a signal ϕa1 goes to "H" level. An n-ch Tr Qn23 connects the flip-flop FF4 to the bit line BLa when a signal ϕa2 goes to "H" level. An n-ch Tr. Qn35 connects the flip-flop FF3 to the bit line BLb when a signal ϕb1 goes to "H" level. An n-ch Tr. Qn34 connects the flip-flop FF4 to the bit line BLb when a signal ϕb2 goes to "H" level.

Figure 38:
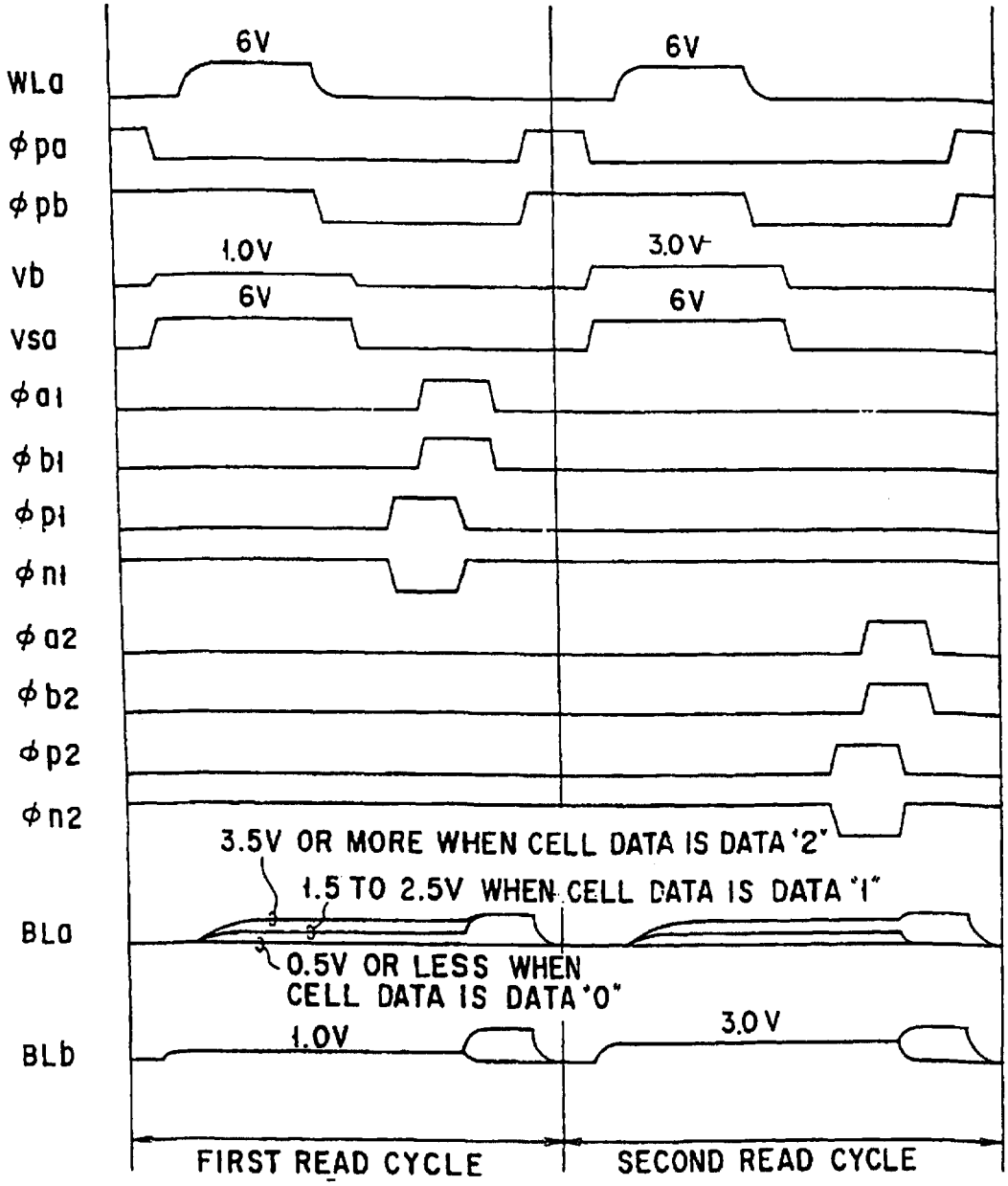
FIG. 38 is a timing chart showing a read operation in the fourth embodiment.
Figure 39:
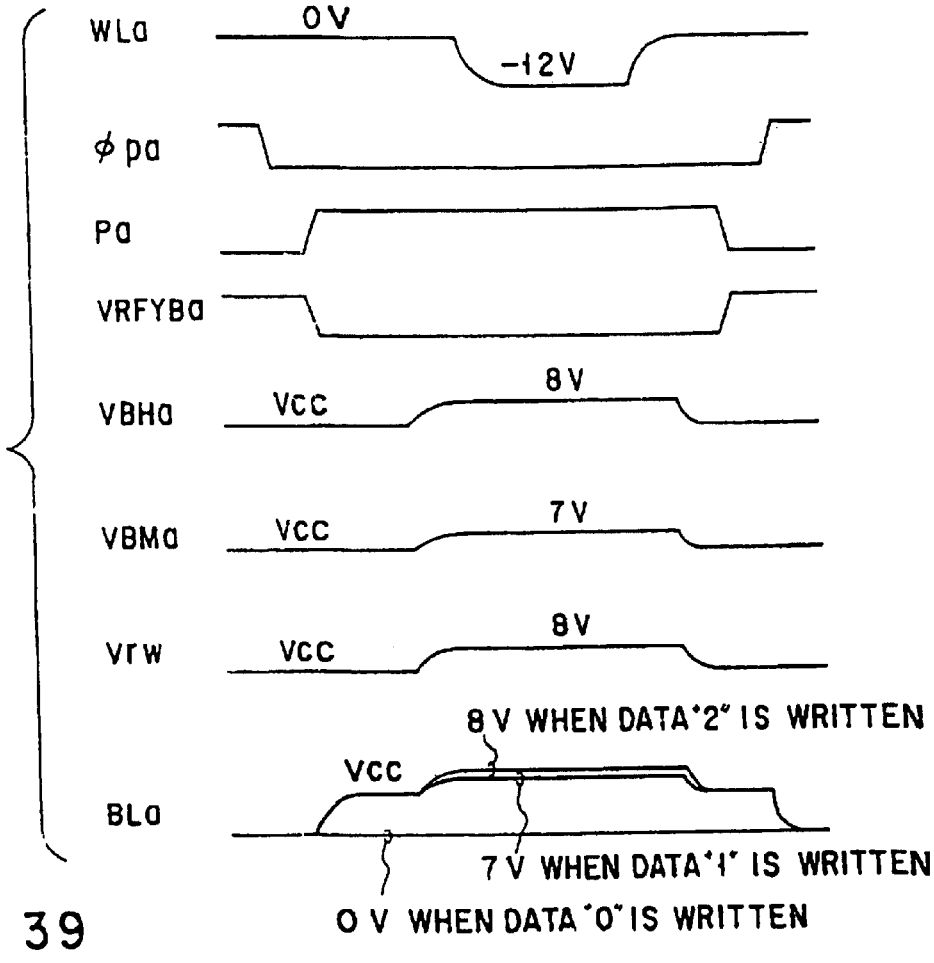
FIG. 39 is a timing chart showing a write operation in the fourth embodiment.
Figure 40:
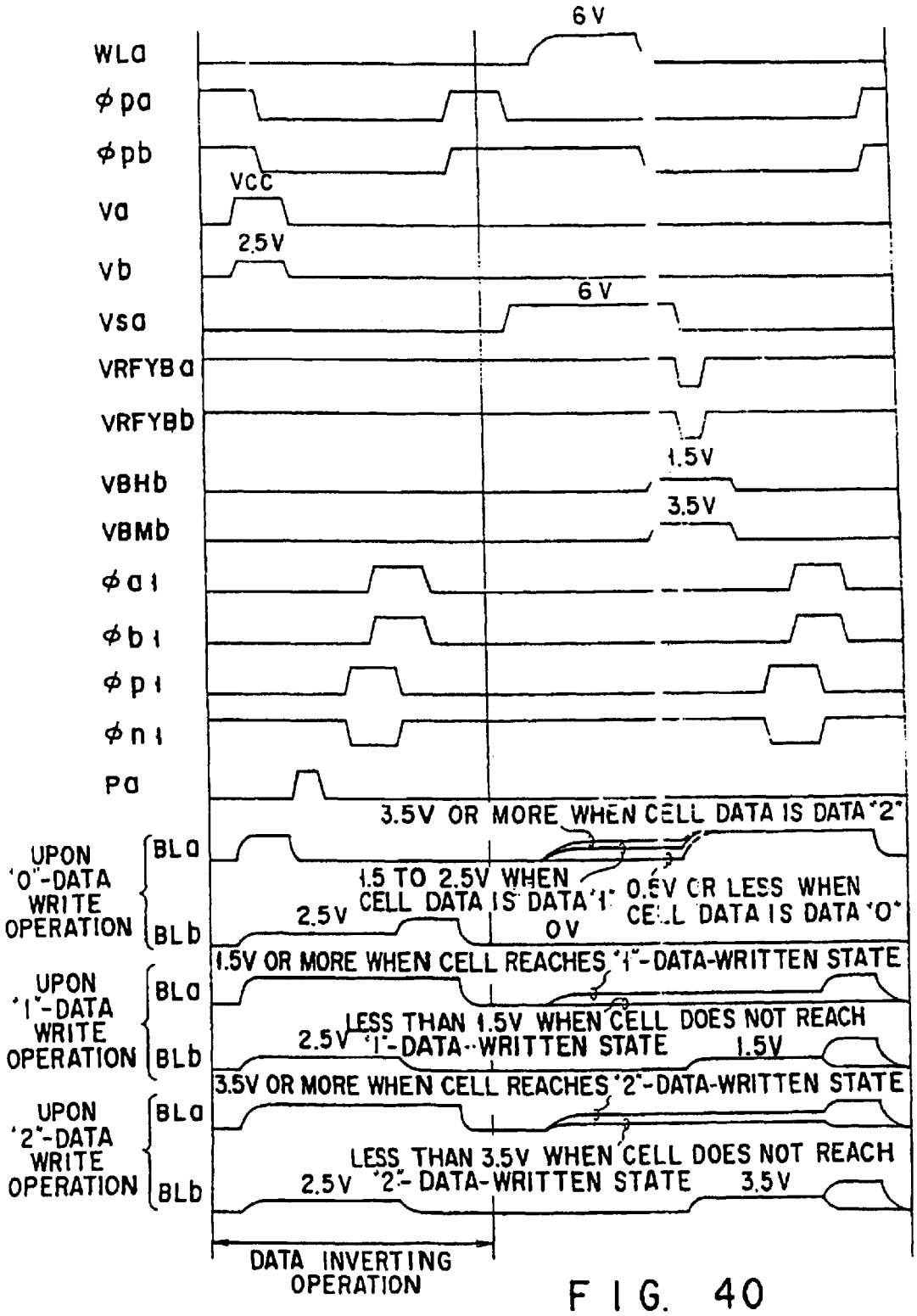
FIG. 40 is a timing chart showing a verify read operation in the fourth embodiment.

The operation of the EEPROM arranged as described above will be described below with reference to FIGS. 38 to 40. FIG. 38 shows read operation timings, FIG. 39 shows write operation timings, and FIG. 40 shows a verify read operation timings. FIGS. 38 to 40 show timings obtained when a word line WLa is selected.

The read operation is executed by two basic cycles. In the first read cycle, the voltage Vb becomes 1 V to precharge the bit line BLb serving as a dummy bit line. The precharge signal ϕpa goes to "L" level to cause the bit line BLa to float, and a common source line Vsa is set to be 6 V. Subsequently, the word line WLa is set to be 6 V. Only when data "0" is written in the selected memory cell, the voltage of the bit line BLa is set to be 0.5 V or less.

Thereafter, flip-flop activation signals ϕn1 and ϕp1 go to "L" level and "H" level, respectively, to reset the flip-flop FF3. The signals ϕa1 and ϕb1 go to "H" level to connect the flip-flop FF3 to the bit lines BLa and BLb. The signals ϕn1 and ϕp1 go to "H" level and "L" level, respectively, to sense a bit line potential, and the flip-flop FF3 latches the information of data "0" or the information of data "1" or "2".

In the second read cycle, unlike the first read cycle, the voltage of the dummy bit line BLb is not 1 V but is 3 V, and signals ϕa2, ϕb2, ϕn2, and ϕp2 are output in place of the signals ϕa1, ϕb1, ϕn1, and ϕp1. Therefore, in the second read cycle, the flip-flop FF4 latches the information of data "2" or the information of data "1" or "0".

With the two read cycles described above, the data written in the memory cells are read out.

Data in the memory cells are erased prior to a data write operation, and the threshold voltages Vt of the memory cells are set to be 5.5 V or more. The word line WLa is set to be 20 V, and the bit line BLa is set to be 0 V, thereby performing the erase operation. In the write operation, the precharge signal ϕpa goes to "L" level to cause the bit line BLa to float. Subsequently, a signal VRFYBa goes to "L" level, and a signal Pa goes to "H" level. In a "0"-data write operation, since the flip-flop FF3 latches data such that the potential of a node N5 goes to "H" level, the bit line BLa is set to be 0 V. In a "1"- or "2"-data write operation, the bit line BLa is set to be Vcc by the voltage VBHa or VBMa.

Subsequently, each of the voltage VBHa and a voltage Vrw becomes 8 V, and the voltage VBMa becomes 7 V. In the "1"-data write operation, since the flip-flop FF4 latches data such that the potential of node N7 goes to "H" level, a voltage of 7 V is applied to the bit line BLa by the voltage VBMa. The bit line BLa is set to be 8 V in the "2"-data write operation, and bit line BLa is set to be 0 V in the "0"-data write operation. Thereafter, the selected word line WLa is set to be −12 V.

In the "1"- or "2"-data write operation, electrons are discharged from the charge accumulation layers of the memory cells by the potential difference between the bit line BLa and the word line WLa, and the threshold voltages of the memory cells decrease. In a "1"-data write operation, since amounts of charges to be discharged from the charge accumulation layers of the memory cells in the "1"-data write operation must be smaller than those in the "2"-data write operation, the bit line BLa is set to be 7 V to relax the potential difference between the word line WLa and the bit line BLa to 19 V. In the "0"-data write operation, the threshold voltage of the memory cell does not effectively change according to the bit line voltage of 0 V.

After the write operation, a verify read operation is performed to check the written state of the memory cells and perform an additional write operation to only a memory cell in which data is not sufficiently written.

The verify read operation is similar to the first read cycle except that the data of the flip-flop FF3 is inverted, the voltage Vb is 0 V, the signal VRFYBa and a signal VRFYBb are output, and at this time, the voltages VBHb and VBMb become 1.5 V and 3.5 V, respectively. The voltage of the bit line BLb is determined by the voltages Vb, VBHb, and VBMb and the data of the flip-flops FF3 and FF4. The signals VRFYBa and VRFYBb are output before the signals ϕn1 and ϕp1 go to "L" level and "H" level, respectively, after the word line WLa is reset to 0 V. In other words, the signals VRFYBa and VRFYBb are output before the flip-flop FF3 is reset after the potential of the bit line BLa is determined by the threshold voltages of the memory cells.

The inverting operation of the data of the flip-flop FF3 will be described below. The voltages Va and Vb become Vcc and 2.5 V, respectively, to precharge the bit lines BLa and BLb. In addition, the precharge signals ϕpa and ϕpb go to "L" level to cause the bit lines BLa and BLb to float. Subsequently, the signal Pa goes to "H" level, and the bit line BLa is discharged to 2.5 V or less only when the potential of the node N5 is set at "H" level. Thereafter, the flip-flop activation signals ϕn1 and ϕp1 go to "L" level and "H" level, respectively, to reset the flip-flop FF3, the signals ϕa1 and ϕb1 go to "H" level to connect the flip-flop FF3 to the bit lines BLa and BLb, and the signals ϕn1 and ϕp1 go to "H" level and "L" level, respectively, to sense a bit line potential. With this operation, the data of the flip-flop FF3 is inverted.

The data (data 1) latched in the flip-flop FF3, the data (data 2) latched in the flip-flop FF4, and the voltages of the bit lines BLa and BLb determined by the threshold voltage of a selected memory cell and obtained after the data inverting operation will be described below. The data 1 controls "0"-data write operation or "1"- or "2"-data write operation. In the "0"-data write operation, the potential of the node N5 goes to "L" level set upon the data inverting operation. In the "1"- or "2"-data write operation, the potential of the node N5 goes to "H" level set upon the data inverting operation. The data 2 controls "1"-data write operation or "2"-data write operation. The potential of the node N7 goes to "H" level in the "1"-data write operation, and the potential of the node N7 goes to "L" level in the "2"-data write operation.

In the verify read operation performed after the "0"-data write operation, regardless of the states of the memory cells, when the signal VRFYBa goes to "L" level, the voltage VBHa or VBMa causes the potential of the bit line BLa to go to "H" level. Therefore, the bit line BLa is sensed by the flip-flop FF3 such that the node N5 goes to "H" level, and rewrite data to be latched is data "0".

In the verify read operation after the "1" data write operation, the signal VRFYBb goes to "L" level to set the dummy bit line BLb to be 1.5 V. Therefore, when the memory cell does not reach a "1"-data-written state, the bit line BLa is set to be 1.5 V or less, the bit line BLa is sensed by the flip-flop FF3 such that the potential of the node N5 goes to "L" level, and rewrite data to be latched is data "1". When the memory cell reaches the "1"-data-written state, the bit line BLa is set to be 1.5 V or more, the bit line BLa is sensed by the flip-flop FF3 such that the potential of the node N5 goes to "H" level, and rewrite data to be latched is data "0".

In the verify read operation performed after the "2"-data write operation, the signal VRFYBb goes to "L" level to set the dummy bit line BLb to be 3.5 V. Therefore, when the memory cell does not reach a "2"-data-written state, the bit line BLa is set to be 3.5 or less, the bit line BLa is sensed by the flip-flop FF3 such that the potential of the node N5 goes to "L" level, and rewrite data to be latched is data "2". When the memory cell reaches the "2"-data-written state, the bit line BLa is set to be 3.5 V or more, the bit line BLa is sensed by the flip-flop FF3 such that the potential of the node N5 goes to "H" level, and rewrite data to be latched is data "0".

With this verify read operation, rewrite data is set as described in the above Table 6 on the basis of write data and the written states of the memory cells. As is apparent from the Table 6, although the "1"-data-written state is to be set, data "1" is written again in only a memory cell in which data "1" is not sufficiently written. Although the "2"-data-written state is to be set, data "2" is written again in only a memory cell in which data "2" is not sufficiently written.

The write operation and the verify read operation are repeatedly performed, thereby performing a data write operation.

The following table (Table 8) shows the potentials at BLa, WLa and Vsa of the memory cell array in an erase operation, a write operation, a read operation, and a verify read operation.

TABLE 8

| | Erase | Write Operation | | | Read Operation | | Verify Read |
|---|---|---|---|---|---|---|---|
| | Operation | "0" | "1" | "2" | First Cycle | Second Cycle | Operation |
| RLa | 0 V | 0 V | 7 V | 8 V | "L" only when data "2" is read | "H" only when data "2" is read | See FIG. 40 |
| WLa | 20 V | | −12 V | | 6 V | 6 V | 5 V |
| Vsa | 0 V | | 0 V | | 6 V | 6 V | 6 V |

Figure 41:
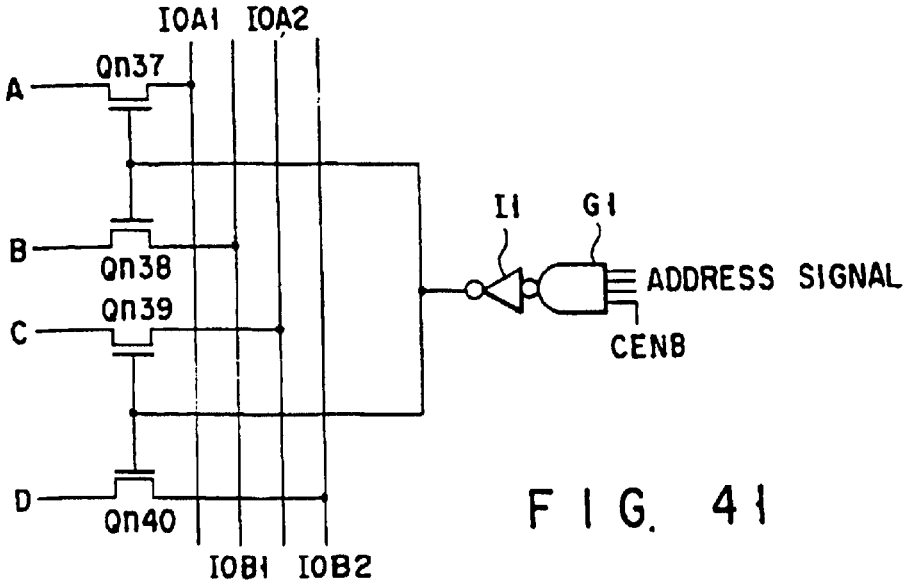
FIG. 41 is a circuit diagram showing the arrangement of a column decoder in the third and fourth embodiments.

FIG. 41 shows a circuit for controlling data input/output operations between the flip-flops FF1 and FF2 shown in FIG. 33 or the flip-flops FF3 and FF4 shown in FIG. 37 and the input/output data conversion circuit shown in FIG. 32. An inverter $I_1$ and a NAND circuit $G_1$ constitute a column decoder 3. When a column activation signal CENB goes to "H" level, a decoder output selected by an address signal goes to "H" level, and nodes A, B, C, and D are connected to input/output lines IOA1, IOB1, IOA2, and IOB2, respectively. The nodes A, B, C, and D correspond to the nodes N1, N2, N3, and N4 in FIG. 33, respectively, and correspond to the nodes N6, N5, N8, and N7 in FIG. 37, respectively. The relationships between read/write data and the input/output lines IOA1, IOB1, IOA2, and IOB2 are summarized in the following table (Table 9).

TABLE 9

| Write Data | IOA1 | IOB1 | IOA2 | IOB2 |
|---|---|---|---|---|
| 0 | L | H | — | — |
| 1 | H | L | L | H |
| 2 | H | L | H | L |

(a)

TABLE 9

| Read Data | IOA1 | IOB1 | IOA2 | IOB2 |
|---|---|---|---|---|
| 0 | H | L | H | L |
| 1 | L | H | H | L |
| 2 | L | H | L | H |

(b)

As has been described above, according to the present invention, while an increase in circuit area is suppressed, three written states are set in one memory cell, and write times required for setting written states in memory cells are independently made optimum by write verify control, thereby obtaining an EEPROM capable of controlling the threshold voltage distribution of each memory cell in which data is finally written to fall within a small range at a high speed. In addition, when two, four, or more written states are set in one memory cell, the same effect as described above can be obtained according to the purport and scope of the present invention.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

[1. A multi-level non-volatile semiconductor memory device comprising:

a semiconductor substrate;

a plurality of bit lines;

a plurality of word lines insulatively intersecting said bit lines;

a memory cell array comprising a plurality of memory cells coupled to said word lines and bit lines, each memory cell including a transistor with a charge storage portion and having written states of first, second, . . . , (n−1)th and nth (n≧3) predetermined storage levels;

a plurality of programming control circuits coupled to said memory cell array for storing data of first, second, . . . , (n−1)th and nth predetermined logic levels in data storage portions which define write voltages to be applied to respective of said memory cells, for applying said write voltages to said respective of said memory cells according to the data stored in said data storage portions, for determining actual written states of said memory cells, for modifying stored data from said ith (i=2, 3, . . . , n−1, n) predetermined logic level to said first predetermined logic level in the data storage portions storing the data of said ith (respectively, i=2, 3, . . . , n−1, n) predetermined logic level and corresponding to the memory cells in which successful writing of said ith (respectively, i=2, 3, . . . , n−1, n) predetermined storage level has been determined, for maintaining said stored data at said ith (i=2, 3, . . . , n−1, n) predetermined logic level in the data storage portions storing the data of said ith (respectively, i=2, 3, . . . , n−1, n) predetermined logic level and corresponding to the memory cells in which it has been determined that said ith (respectively, i=2, 3, . . . , n−1, n) predetermined storage level has not been successfully written, and for maintaining said stored data at said first predetermined logic level in the data storage portions storing the data of said first predetermined logic level.]

[2. The device according to claim 1, wherein said data stored in said data storage portions are initially set to initial data, and then said initial data stored in said data storage portions are modified.]

[3. The device according to claim 2, wherein said initial data are loaded from at least one input line coupled to said data storage portions.]

[4. The device according to claim 1, wherein said actual written states of said memory cells corresponding to the data storage portions storing the data of said ith (i=2, 3, . . . , n−1, n) predetermined logic level are simultaneously determined.]

[5. The device according to claim 1, wherein said actual written states of said memory cells corresponding to the data storage portions storing the data of said second, third, . . . , (n−1)th and nth predetermined logic levels are simultaneously determined.]

[6. The device according to claim 1, wherein said data of said ith (i=2, 3, . . . , n−1, n) predetermined logic level stored in the data storage portions corresponding to the memory cells in which successful writing has been determined are simultaneously modified to the data of said first predetermined logic level.]

[7. The device according to claim 1, wherein said data of said second, third, . . . , (n−1)th and nth predetermined logic levels stored in the data storage portions corresponding to the memory cells in which successful writing has been determined are simultaneously modified to the data of said first predetermined logic level.]

[8. The device according to claim 1, further comprising a plurality of data write end detection circuits coupled to said data storage portions for simultaneously detecting whether or not all of said data storage portions store the data of said first predetermined logic level.]

[9. The device according to claim 8, wherein each of said data write end detection circuits is provided for each of said data storage portions.]

[10. The device according to claim 9, wherein said data write end detection circuits are coupled to at least one common output line, and said data write end detection circuits output a programming completion signal on said common output line when each data storage portion stores the data of said first predetermined logic level.]

[11. The device according to claim 10, wherein said applying, determining and modifying are continued until said data write end detection circuits output said programming completion signal.]

[12. The device according to claim 1, wherein said applying, determining and modifying are continued until each memory cell is sufficiently written.]

[13. The device according to claim 1, wherein said write voltages are simultaneously applied to said respective of said memory cells.]

[14. The device according to claim 13, wherein said write voltages defined by said data stored in said data storage portions and applied to said respective of said memory cells differ according to said data stored in said data storage portions.]

[15. The device according to claim 1, wherein said programming control circuits are arranged adjacent to said memory cell array.]

[16. The device according to claim 1, wherein each of said programming control circuits is connected to a respective one of said bit lines.]

[17. The device according to claim 1, wherein said programming control circuits include bit line voltage regulators for selectively changing voltages of said bit lines according to said data stored in said data storage portions.]

[18. The device according to claim 17, wherein said voltages of said bit lines are selectively and simultaneously changed by said bit line voltage regulators.]

[19. A multi-level non-volatile semiconductor memory device comprising:

a semiconductor substrate;

a plurality of bit lines;

a plurality of word lines insulatively intersecting said bit lines;

a memory cell array comprising a plurality of memory cells coupled to said word lines and bit lines, each memory cell including a transistor with a charge storage portion and having written states of first, second, . . . , (n−1)th and nth (n≧3) predetermined storage levels;

a plurality of programming control circuits coupled to said memory cell array for storing data of first, second, . . . , (n−1)th and nth predetermined logic levels in data storage portions which define write voltages to be applied to respective of said memory cells, said data being initially set to initial data which are loaded from at least one input line coupled to said data storage portions, for applying said write voltages to said respective of said memory cells according to the data stored in said data storage portions, for determining actual written states of said memory cells, for modifying stored data from said ith (i=2, 3, . . . , n−1, n) predetermined logic level to said first predetermined logic level in the data storage portions storing the data of said ith (respectively, i=2, 3, . . . , n−1, n) predetermined logic level and corresponding to the memory cells in which successful writing of said ith (respectively, i=2, 3, . . . , n−1, n) predetermined storage level has been determined, for maintaining said stored data at said ith (i=2, 3, . . . , n−1, n) predetermined logic level in the data storage portions storing the data of said ith (respectively, i=2, 3, . . . , n−1, n) predetermined logic level and corresponding to the memory cells in which it has been determined that said ith (respectively, i=2, 3, . . . , n−1, n) predetermined storage level has not been successfully written, and for maintaining said stored data at said first predetermined logic level in the data storage portions storing the data of said first predetermined logic level.]

[20. The device according to claim 19, wherein said actual written states of said memory cells corresponding to the data storage portions stored the data of said ith (i=2, 3, . . . , n−1, n) predetermined logic level are simultaneously determined.]

[21. The device according to claim 19, wherein said actual written states of said memory cells corresponding to the data storage portions storing the data of said second, third, . . . , (n−1)th and nth predetermined logic levels are simultaneously determined.]

[22. The device according to claim 19, wherein said data of said ith (i=2, 3, . . . , n−1, n) predetermined logic level stored in the data storage portions corresponding to the memory cells in which successful writing has been determined are simultaneously modified to the data of said first predetermined logic level.]

[23. The device according to claim 19, wherein said data of said second, third, . . . , (n−1)th and nth predetermined logic levels stored in the data storage portions corresponding to the memory cells in which successful writing has been determined are simultaneously modified to the data of said first predetermined logic level.]

[24. The device according to claim 19, further comprising a plurality of data write end detection circuits coupled to said data storage portions for simultaneously detecting whether or not all of said data storage portions store the data of said first predetermined logic level.]

[25. The device according to claim 24, wherein each of said data write end detection circuits is provided for each of said data storage portions.]

[26. The device according to claim 25, wherein said data write end detection circuits are coupled to at least one common output line, and said data write end detection circuits output a programming completion signal on said common output line when each data storage portion stores the data of said first predetermined logic level.]

[27. The device according to claim 26, wherein said applying, determining and modifying are continued until said data write end detection circuits output said programming completion signal.]

[28. The device according to claim 19, wherein said applying, determining and modifying are continued until each memory cell is sufficiently written.]

[29. The device according to claim 19, wherein said write voltages are simultaneously applied to said respective of said memory cells.]

[30. The device according to claim 29, wherein said write voltages defined by said data stored in said data storage portions and applied to said respective of said memory cells differ according to said data stored in said data storage portions.]

[31. The device according to claim 19, wherein said programming control circuits are arranged adjacent to said memory cell array.]

[32. The device according to claim 19, wherein each of said programming control circuits is connected to a respective one of said bit lines.]

[33. The device according to claim 19, wherein said programming control circuits include bit line voltage regulators for selectively changing voltages of said bit lines according to said data stored in said data storage portions.]

[34. The device according to claim 33, wherein said voltages of said bit lines are selectively and simultaneously changed by said bit line voltage regulators.]

[35. A multi-level non-volatile semiconductor memory device comprising:

a semiconductor substrate;

a plurality of bit lines;

a plurality of word lines insulatively intersecting said bit lines;

a memory cell array comprising a plurality of memory cells coupled to said word lines and bit lines, each memory cell including a transistor with a charge storage portion and having written states of first, second, . . . , (n−1)th and nth (n≧3) predetermined storage levels;

a plurality of programming control circuits coupled to said memory cell array for storing data of first, second, . . . , (n−1)th and nth predetermined logic levels in data storage portions which define write voltages to be applied to respective of said memory cells, said data being initially set to initial data which are loaded from at least one input line coupled to said data storage portions, for applying said write voltages to said respective of said memory cells according to the data stored in said data storage portions, for determining actual written states of said memory cells, for maintaining stored data at said first predetermined logic level in the data storage portions storing the data of said first predetermined logic level, and for selectively modifying said stored data to the data of said first predetermined logic level in only data storage portions initially storing the initial data of said ith (i=2, 3, . . . , n−1, n) predetermined logic level and corresponding to the memory cells in which successful writing of said ith (respectively, i=2, 3, . . . , n−1, n) predetermined storage level has been determined, such that only memory cells which are not sufficiently written have write voltages applied thereto which achieve the written state predetermined by the initial data in the respective memory cell upon application of the write voltages to the respective memory cell.]

[36. The device according to claim 35, wherein said actual written states of said memory cells corresponding to the data storage portions storing the data of said ith (i=2, 3, . . . , n−1, n) predetermined logic level are simultaneously determined.]

[37. The device according to claim 35, wherein said actual written states of said memory cells corresponding to the data storage portions storing the data of said second, third, . . . , (n−1)th and nth predetermined logic levels are simultaneously determined.]

[38. The device according to claim 35, wherein said data of said ith (i=2, 3, . . . , n−1, n) predetermined logic level stored in the data storage portions corresponding to the memory cells in which successful writing has been determined are simultaneously and selectively modified to the data of said first predetermined logic level.]

[39. The device according to claim 35, wherein said data of said second, third, . . . , (n−1)th and nth predetermined logic levels stored in the data storage portions corresponding to the memory cells in which successful writing has been determined are simultaneously and selectively modified to the data of said first predetermined logic level.]

[40. The device according to claim 35, further comprising a plurality of data write end detection circuits coupled to said data storage portions for simultaneously detecting whether or not all of said data storage portions store the data of said first predetermined logic level.]

[41. The device according to claim 40, wherein each of said data write end detection circuits is provided for each of said data storage portions.]

[42. The device according to claim 41, wherein said data write end detection circuits are coupled to at least one common output line, and said data write end detection circuits output a programming completion signal on said common output line when each data storage portion stores the data of said first predetermined logic level.]

[43. The device according to claim 42, wherein said applying, determining and selective modifying are continued until said data write end detection circuits output said programming completion signal.]

[44. The device according to claim 35, wherein said applying, determining and selective modifying are continued until each memory cell is sufficiently written.]

[45. The device according to claim 35, wherein said write voltages are simultaneously applied to said respective of said memory cells.]

[46. The device according to claim 45, wherein said write voltages defined by said data stored in said data storage portions and applied to said respective of said memory cells differ according to said data stored in said data storage portions.]

[47. The device according to claim 45, wherein said programming control circuits are arranged adjacent to said memory cell array.]

[48. The device according to claim 35, wherein each of said programming control circuits is connected to a respective one of said bit lines.]

[49. The device according to claim 35, wherein said programming control circuits include bit line voltage regulators for selectively changing voltages of said bit lines according to said data stored in said data storage portions.]

[50. The device according to claim 49, wherein said voltages of said bit lines are selectively and simultaneously changed by said bit line voltage regulators.]

[51. A multi-level non-volatile semiconductor memory device comprising:

a semiconductor substrate;

a plurality of bit lines;

a plurality of word lines insulatively intersecting said bit lines;

a memory cell array comprising a plurality of memory cells coupled to said word lines and bit lines, each memory cell including a transistor with a charge storage portion and having written states of first, second, . . . , (n−1)th and nth (n≧3) predetermined storage levels;

a plurality of cell selection circuits coupled to said memory cell array for controlling selection of memory cells and application of write voltages to the selected memory cells;

a plurality of data circuits coupled to said memory cell array of storing write control data of first, second, . . . , (n−1)th, and nth predetermined logic levels which define write control voltages to be applied to respective of said memory cells selected by said cell selection circuits, said write control data being initially set to initial write control data which are loaded from at least one input line coupled to said data circuits, for applying said write control voltages to said respective of said memory cells, for selectively sensing actual written states of only those of said respective memory cells corresponding to the data circuits in which the write control data of said second, third, . . . , (n−1)th and nth predetermined logic levels are stored, for maintaining stored write control data at said first predetermined logic level in the data circuits storing the write control data of said first predetermined logic level, and for selectively modifying said stored write control data to the write control data of said first predetermined logic level in only data circuits initially storing the initial write control data of said ith (i=2, 3, . . . , n−1, n) predetermined logic level and corresponding to the memory cells in which successful writing of said ith (respectively, i=2, 3, . . . , n−1, n) predetermined storage level has been sensed, such that only memory cells which are not sufficiently written have write control voltages applied thereto which achieve the written state predetermined by the initial write control data in the respective memory cell upon application of the write control voltages to the respective memory cell.]

[52. The device according to claim 51, wherein said actual written states of said memory cells corresponding to the data circuits storing the write control data of said ith (i=2, 3, . . . , n−1, n) predetermined logic level are simultaneously sensed.]

[53. The device according to claim 51, wherein said actual written states of said memory cells corresponding to the data circuits storing the write control data of said second, third, . . . , (n−1)th and nth predetermined logic levels are simultaneously sensed.]

[54. The device according to claim 51, wherein said write control data of said ith (i=2, 3, . . . , n−1, n) predetermined logic level stored in the data circuits corresponding to the memory cells in which successful writing has been sensed are simultaneously and selectively modified to the write control data of said first predetermined logic level.]

[55. The device according to claim 51, wherein said write control data of said second, third, . . . , (n−1)th and nth predetermined logic levels stored in the data circuits corresponding to the memory cells in which successful writing has been sensed are simultaneously and selectively modified to the write control data of said first predetermined logic level.]

[56. The device according to claim 51, further comprising a plurality of data write end detection circuits coupled to said data circuits for simultaneously detecting whether or not all of said data circuits store the write control data of said first predetermined logic level.]

[57. The device according to claim 56, wherein each of said data write end detection circuits is provided for each of said data circuits.]

[58. The device according to claim 57, wherein said data write end detection circuits are coupled to at least one common output line, and said data write end detection circuits output a programming completion signal on said common output line when each data circuit stores the write control data of said first predetermined logic level.]

[59. The device according to claim 58, wherein said applying, selective sensing and selective modifying are continued until said data write end detection circuits output said programming completion signal.]

[60. The device according to claim 51, wherein said applying, selective sensing and selective modifying are continued until each memory cell is sufficiently written.]

[61. The device according to claim 51, wherein said write control voltages are simultaneously applied to said respective of said memory cells.]

[62. The device according to claim 61, wherein said write control voltages defined by said write control data stored in said data circuits and applied to said respective of said memory cells differ according to said write control data stored in said data circuits.]

[63. The device according to claim 51, wherein said data circuits are arranged adjacent to said memory cell array.]

[64. The device according to claim 51, wherein each of said data circuits is connected to a respective one of said bit lines.]

[65. The device according to claim 51, wherein said data circuits include bit line voltage regulators for selectively changing voltages of said bit lines according to said write control data stored in said data circuits.]

[66. The device according to claim 65, wherein said voltages of said bit lines are selectively and simultaneously changed by said bit line voltage regulators.]

[67. A multi-level non-volatile semiconductor memory device comprising:

a semiconductor substrate;

a plurality of bit lines;

a plurality of word lines insulatively intersecting said bit lines;

a memory cell array comprising a plurality of memory cells coupled to said word lines and bit lines, each memory cell including a transistor with a charge storage portion and having written states of first, second, . . . , (n−1)th and nth (n≧3) predetermined storage levels;

a plurality of cell selection circuits coupled to said memory cell array for controlling selection of memory cells and application of write voltages to the selected memory cells;

a plurality of data circuits coupled to said memory cell array of storing write control data of first, second, . . . , (n−1)th, and nth predetermined logic levels which define write control voltages to be applied to respective of said memory cells selected by said cell selection circuits, for applying said write control voltages to said respective of said memory cells, for selectively sensing actual written states of only those of said respective memory cells corresponding to the data circuits in which the write control data of said second, third, . . . , (n−1)th and nth predetermined logic levels are stored, for modifying stored write control data from said ith (i=2, 3, . . . , n−1, n) predetermined logic level to said first predetermined logic level in the data circuits storing the write control data of said ith (respectively, i=2, 3, . . . , n−1, n) predetermined logic level and corresponding to the memory cells in which successful writing of said ith (respectively, i=2, 3, . . . , n−1, n) predetermined storage level has been sensed, for maintaining said stored write control data at said ith (i=2, 3, . . . , n−1, n) predetermined logic level in the data circuits storing the write control data of said ith (respectively, i=2, 3, . . . , n−1, n) predetermined logic level and corresponding to the memory cells in which it has been sensed that said ith (respectively, i=2, 3, . . . , n−1, n) predetermined storage level has not been successfully written, and for maintaining said stored write control data at said first predetermined logic level in the data circuits storing the write control data of said first predetermined logic level.]

[68. The device according to claim 67, wherein said write control data stored in said data circuits are initially set to initial write control data, and then said initial write control data stored in said data circuits are modified.]

[69. The device according to claim 68, wherein said initial write control data are loaded from at least one input line coupled to said data circuits.]

[70. The device according to claim 67, wherein said actual written states of said memory cells corresponding to the data circuits storing the write control data of said ith (i=2, 3, . . . , n−1, n) predetermined logic level are simultaneously sensed.]

[71. The device according to claim 67, wherein said actual written states of said memory cells corresponding to the data circuits storing the write control data of said second, third, . . . , (n−1)th and nth predetermined logic levels are simultaneously sensed.]

[72. The device according to claim 67, wherein said write control data of said ith (i=2, 3, . . . , n−1, n) predetermined logic level stored in the data circuits corresponding to the memory cells in which successful writing has been sensed are simultaneously modified to the write control data of said first predetermined logic level.]

[73. The device according to claim 67, wherein said write control data of said second, third, . . . , (n−1)th and nth predetermined logic levels stored in the data circuits corresponding to the memory cells in which successful writing has been sensed are simultaneously modified to the write control data of said first predetermined logic level.]

[74. The device according to claim 67, further comprising a plurality of data write end detection circuits coupled to said data circuits for simultaneously detecting whether or not all of said data circuits store the write control data of said first predetermined logic level.]

[75. The device according to claim 74, wherein each of said data write end detection circuits is provided for each of said data circuits.]

[76. The device according to claim 75, wherein said data write end detection circuits are coupled to at least one common output line, and said data write end detection circuits output a programming completion signal on said common output line when each data circuit stores the write control data of said first predetermined logic level.]

[77. The device according to claim 76, wherein said applying, selective sensing and modifying are continued until said data write end detection circuits output said programming completion signal.]

[78. The device according to claim 67, wherein said applying, selective sensing and modifying are continued until each memory cell is sufficiently written.]

[79. The device according to claim 67, wherein said write control voltages are simultaneously applied to said respective of said memory cells.]

[80. The device according to claim 79, wherein said write control voltages defined by said write control data stored in said data circuits and applied to said respective of said memory cells differ according to said write control data stored in said data circuits.]

[81. The device according to claim 67, wherein said data circuits are arranged adjacent to said memory cell array.]

[82. The device according to claim 67, wherein each of said data circuits is connected to a respective one of said bit lines.]

[83. The device according to claim 67, wherein said data circuits include bit line voltage regulators for selectively changing voltages of said bit lines according to said write control data stored in said data circuits.]

[84. The device according to claim 83, wherein said voltages of said bit lines are selectively and simultaneously changed by said bit line voltage regulators.]

[85. A multi-level non-volatile semiconductor memory device comprising:

a semiconductor substrate;

a plurality of bit lines;

a plurality of word lines insulatively intersecting said bit lines;

a memory cell array comprising a plurality of memory cells coupled to said word lines or bit lines, each memory cell including a transistor with a charge storage portion and having written states of first, second, . . . , (n−1)th and nth (n≧3) predetermined storage levels;

a plurality of cell selection circuits coupled to said memory cell array for controlling selection of memory cells and application of write voltages to the selected memory cells;

a plurality of data circuits coupled to said memory cell array of storing write control data of first, second, . . . , (n−1)th, and nth predetermined logic levels which define write control voltages to be applied to respective of said memory cells selected by said cell selection circuits, for applying said write control voltages to said respective of said memory cells, for sensing actual written states of only those of said respective memory cells corresponding to the data circuits in which the write control data of said second, third, . . . , (n−1)th and nth predetermined logic levels are stored, for modifying stored write control data from said ith (i=2, 3, . . . , n−1, n) predetermined logic level to said first predetermined logic level in the data circuits storing the write control data of said ith (respectively, i=2, 3, . . . , n−1, n) predetermined logic level and corresponding to the memory cells in which successful writing of said ith (respectively, i=2, 3, . . . , n−1, n) predetermined storage level has been sensed, for maintaining said storage write control data at said ith (i=2, 3, . . . , n−1, n) predetermined logic level in the data circuits storing the write control data of said ith (respectively, i=2, 3, . . . , n−1, n) predetermined logic level and corresponding to the memory cells in which it has been sensed that said ith (respectively, i=2, 3, . . . , n−1, n) predetermined storage level has not been successfully written, and for maintaining said stored write control data at said first predetermined logic level in the data circuits storing the write control data of said first predetermined logic level;

wherein results of said sensing of said actual written states by the data circuits storing the write control data of said ith (i=2, 3, . . . , n−1, n) predetermined logic level are determined on the basis of only whether or not the written state of the respective memory cell is said ith (respectively, i=2, 3, . . . , n−1, n) predetermined storage level.]

[86. The device according to claim 85, wherein said write control data stored in said data circuits are initially set to initial write control data, and then said initial write control data stored in said data circuits are modified.]

[87. The device according to claim 85, wherein said initial write control data are loaded from at least one input line coupled to said data circuits.]

[88. The device according to claim 85, wherein said actual written states of said memory cells corresponding to the data circuits storing the write control data of said ith (i=2, 3, . . . , n−1, n) predetermined logic level are simultaneously sensed.]

[89. The device according to claim 85, wherein said actual written states of said memory cells corresponding to the data circuits storing the write control data of said second, third, . . . , (n−1)th and nth predetermined logic levels are simultaneously sensed.]

[90. The device according to claim 85, wherein said write control data of said ith (i=2, 3, . . . , n−1, n) predetermined logic level stored in the data circuits corresponding to the memory cells in which successful writing has been sensed are simultaneously modified to the write control data of said first predetermined logic level.]

[91. The device according to claim 85, wherein said write control data of said second, third, . . . , (n−1)th and nth predetermined logic levels stored in the data circuits corresponding to the memory cells in which successful writing has been sensed are simultaneously modified to the write control data of said first predetermined logic level.]

[92. The device according to claim 85, further comprising a plurality of data write end detection circuits coupled to said data circuits for simultaneously detecting whether or not all of said data circuits store the write control data of said first predetermined logic level.]

[93. The device according to claim 92, wherein each of said data write end detection circuits is provided for each of said data circuits.]

[94. The device according to claim 93, wherein said data write end detection circuits are coupled to at least one common output line, and said data write end detection circuits output a programming completion signal on said common output line when each data circuit stores the write control data of said first predetermined logic level.]

[95. The device according to claim 94, wherein said applying, sensing and modifying are continued until said data write end detection circuits output said programming completion signal.]

[96. The device according to claim 85, wherein said applying, sensing and modifying are continued until each memory cell is sufficiently written.]

[97. The device according to claim 85, wherein said write control voltages are simultaneously applied to said respective of said memory cells.]

[98. The device according to claim 97, wherein said write control voltages defined by said write control data stored in said data circuits and applied to said respective of said memory cells differ according to said write control data stored in said data circuits.]

[99. The device according to claim 85, wherein said data circuits are arranged adjacent to said memory cell array.]

[100. The device according to claim 85, wherein each of said data circuits is connected to a respective one of said bit lines.]

[101. The device according to claim 85, wherein said data circuits include bit line voltage regulators for selectively changing voltages of said bit lines according to said write control data stored in said data circuits.]

[102. The device according to claim 101, wherein said voltages of said bit lines are selectively and simultaneously changed by said bit line voltage regulators.]

[103. The device according to claim 85, wherein each of said results is stored in the respective data circuit and used as latest write control data.]

[104. A multi-level non-volatile semiconductor memory device comprising:

a semiconductor substrate;

a plurality of bit lines;

a plurality of word lines insulatively intersecting said bit lines;

a memory cell array comprising a plurality of memory cells coupled to said word lines and bit lines, each memory cell including a transistor with a charge storage portion and having written states of first, second, . . . , (n−1)th and nth (n≧3) predetermined storage levels;

a plurality of cell selection circuits coupled to said memory cell array for controlling selection of memory cells and application of write voltages to the selected memory cells;

a plurality of data circuits coupled to said memory cell array of storing write control data of first, second, . . . , (n−1)th, and nth predetermined logic levels which define write control voltages to be applied to respective of said memory cells selected by said cell selection circuits, for applying said write control voltages to said respective of said memory cells, for sensing actual written states of only those of said respective memory cells corresponding to the data circuits in which the write control data of said second, third, . . . , (n−1)th and nth predetermined logic levels are stored, for modifying stored write control data from said ith (i=2, 3, . . . , n−1, n) predetermined logic level to said first predetermined logic level in the data circuits storing the write control data of said ith (respectively, i=2, 3, . . . , n−1, n) predetermined logic level and corresponding to the memory cells in which successful writing of said ith (respectively, i=2, 3, . . . , n−1, n) predetermined storage level has been sensed, for maintaining said stored write control data at said ith (i=2, 3, . . . , n−1, n) predetermined logic level in the data circuits storing the write control data of said ith (respectively, i=2, 3, . . . , n−1, n) predetermined logic level and corresponding to the memory cells in which it has been sensed that said ith (respectively, i=2, 3, . . . , n−1, n) predetermined storage level has not been successfully written, and for maintaining said stored write control data at said first predetermined logic level in the data circuits storing the write control data of said first predetermined logic level, wherein with respect to said sensing of said actual written states, the data circuits storing the write control data of said ith (i=2, 3, . . . , n−1, n) predetermined logic level sense only whether or not the written state of the respective memory cell is said ith (respectively, i=2, 3, n−1, n) predetermined storage level.]

[105. The device according to claim 104, wherein said write control data stored in said data circuits are initially set to initial write control data, and then said initial write control data stored in said data circuits are modified.]

[106. The device according to claim 105, wherein said initial write control data are loaded from at least one input line coupled to said data circuits.]

[107. The device according to claim 104, wherein each of said data circuits is connected to a respective one of said bit lines, and the data circuits storing the write control data of said ith (i=2, 3, . . . , n−1, n) predetermined logic level sense voltage levels of the respective bit lines by comparing with ith (respectively, i=2, 3 . . . , n−1, n) reference voltage.]

[108. The device according to claim 104, wherein said actual written states of said memory cells corresponding to the data circuits storing the write control data of said ith (i=2, 3, . . . , n−1, n) predetermined logic level are simultaneously sensed.]

[109. The device according to claim 104, wherein said actual written states of said memory cells corresponding to the data circuits storing the write control data of said second, third, . . . , (n−1)th and nth predetermined logic levels are simultaneously sensed.]

[110. The device according to claim 104, wherein said write control data of said ith (i=2, 3, . . . , n−1, n) predetermined logic level stored in the data circuits corresponding to the memory cells in which successful writing has been sensed are simultaneously modified to the write control data of said first predetermined logic level.]

[111. The device according to claim 104, wherein said write control data of said second, third, . . . , (n−1)th and nth predetermined logic levels stored in the data circuits corresponding to the memory cells in which successful writing has been sensed are simultaneously modified to the write control data of said first predetermined logic level.]

[112. The device according to claim 104, wherein said applying, sensing and modifying are continued until each memory cell is sufficiently written.]

[113. The device according to claim 104, wherein said write control voltages are simultaneously applied to said respective of said memory cells.]

[114. The device according to claim 113, wherein said write control voltages defined by said write control data stored in said data circuits and applied to said respective of said memory cells differ according to said write control data stored in said data circuits.]

[115. The device according to claim 104, wherein said data circuits are arranged adjacent to said memory cell array.]

[116. The device according to claim 104, wherein each of said data circuits is connected to a respective one of said bit lines.]

[117. The device according to claim 104, wherein said data circuits include bit line voltage regulators for selectively changing voltages of said bit lines according to said write control data stored in said data circuits.]

[118. The device according to claim 117, wherein said voltages of said bit lines are selectively and simultaneously changed by said bit line voltage regulators.]

[119. The device according to claim 104, wherein each of results of said sensing is stored in the respective data circuit and used as latest write control data.]

*120. A multi-level non-volatile semiconductor memory device comprising:*

*a plurality of memory cells, each being capable of having one of first, second and third storage-levels; and*

*a plurality of programming control circuits coupled to each of the memory cells,*

*wherein each of said programming control circuits is capable of storing in a data storage portion data of one of first, second, and third logic levels which define write voltages to be applied to a corresponding memory cell, for applying said write voltages to the corresponding memory cell according to the data stored in the data storage portion, for determining whether the corresponding memory cell has reached the second storage level in case that the data stored in the data storage portion represents the second logic level, for determining whether the corresponding memory cell has reached the third storage level in case that the data stored in the data storage portion represents the third logic level, for modifying the stored data from the second logic level to the first logic level if it has been determined that the corresponding memory cell has reached the second storage level, for modifying the stored data from the third logic level to the first logic level if it has been determined that the corresponding memory cell has reached the third storage level, and for maintaining the data at the first logic level if the data storage portion has stored the data at the first logic level, and*

*wherein the programming control circuits storing said data of said second logic level determine only whether the corresponding memory cell has reached the second storage level and the programming control circuits storing said data of said third logic level determine only whether the corresponding memory cell has reached the third storage level.*

*121. The device according to claim 120, wherein said programming control circuits storing the data of the first logic level apply a first write voltage which inhibits changes in the storage levels to the corresponding memory cells.*

*122. The device according to claim 121, wherein said programming control circuits storing the data of the second logic level apply a second write voltage which promotes changes to the second storage level in the corresponding memory cells, to the corresponding memory cells, and said programming control circuits storing the data of the third logic level apply a third write voltage which promotes changes to the third storage level in the corresponding memory cells, to the corresponding memory cells.*

*123. The device according to claim 122, wherein said second write voltage is different from said third write voltage.*

*124. The device according to claim 120, wherein each data storage portion includes two CMOS flip-flop circuits.*

*125. The device according to claim 120, further comprising data detectors for detecting whether all of said data storage portions have stored the data of the first logic level.*

*126. The device according to claim 120, wherein a couple of the memory cells stores three-bit data.*

* * * * *